(12) United States Patent
Iwamatsu

(10) Patent No.: US 8,558,312 B2
(45) Date of Patent: Oct. 15, 2013

(54) SEMICONDUCTOR INTEGRATED CIRCUIT DEVICE HAVING IMPURITIES INTRODUCED IN BACK GATE SEMICONDUCTOR REGIONS

(75) Inventor: Toshiaki Iwamatsu, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/311,294

(22) Filed: Dec. 5, 2011

(65) Prior Publication Data

US 2012/0146148 A1    Jun. 14, 2012

(30) Foreign Application Priority Data

Dec. 14, 2010   (JP) ................................. 2010-277993

(51) Int. Cl.
*H01L 27/12*    (2006.01)
*H01L 27/085*   (2006.01)

(52) U.S. Cl.
USPC ............ 257/350; 257/369; 257/372; 257/410

(58) Field of Classification Search
USPC .................. 257/350, 369, 372, 410
See application file for complete search history.

(56) References Cited

U.S. PATENT DOCUMENTS

| 7,221,006 B2 * | 5/2007 | Orlowski et al. ............. 257/192 |
| 7,804,134 B2 * | 9/2010 | Coronel et al. ............... 257/351 |
| 8,130,547 B2 * | 3/2012 | Widjaja et al. ........... 365/185.05 |
| 2009/0134468 A1 | 5/2009 | Tsuchiya et al. |
| 2012/0168863 A1 * | 7/2012 | Zhu et al. ........................ 257/347 |
| 2012/0299105 A1 * | 11/2012 | Cai et al. ........................ 257/348 |
| 2013/0001518 A1 * | 1/2013 | Lin et al. .......................... 257/29 |

FOREIGN PATENT DOCUMENTS

JP    2009-135140    6/2009

* cited by examiner

*Primary Examiner* — Ngan Ngo
(74) *Attorney, Agent, or Firm* — McDermott Will & Emery LLP

(57) ABSTRACT

A bulk & SOI hybrid CMIS device, in which an I/O bulk part and a core logic SOI part are mounted, needs a number of gate stacks to optimize threshold voltage control and causes a problem that the process and structure become complicated. The present invention adjusts the threshold voltage of MISFET at the corresponding part by introducing impurities into any of back gate semiconductor regions, in an SOI semiconductor CMISFET integrated circuit device having a high-k gate insulating film and a metal gate electrode.

8 Claims, 43 Drawing Sheets

SEMICONDUCTOR INTEGRATED CIRCUIT DEVICE HAVING IMPURITIES INTRODUCED IN BACK GATE SEMICONDUCTOR REGIONS

CROSS-REFERENCE TO RELATED APPLICATION

The disclosure of Japanese Patent Application No. 2010-277993 filed on Dec. 14, 2010 including the specification, drawings and abstract is incorporated herein by reference in its entirety.

BACKGROUND

The present invention relates to technology which becomes effective when applied to threshold voltage adjustment technology in a semiconductor integrated circuit device (or a semiconductor device).

Japanese Patent Laid-Open No. 2009-135140 (Patent Document 1) or the corresponding US Patent Publication No. 2009-134468 (Patent Document 2) discloses technology to set a gate electrode material to one kind having a work function corresponding to a midgap and to provide an impurity region to adjust a threshold voltage in a back gate region of MISFET (Metal Insulator Semiconductor Field Effect Transistor) of an SOI part in a CMOS (Complementary Metal Oxide Semiconductor) or CMIS (Complementary Metal Insulator Semiconductor) semiconductor integrated circuit with a hybrid structure having an SOI (Silicon On Insulator) region and a bulk region.

SUMMARY

A bulk & SOI hybrid CMIS device, which an I/O bulk part and a core logic SOI part are mounted on, needs to use a plurality of kinds of gate stacks to optimize threshold voltage control and has a problem that the process and structure become complicated.

Further, a single-type CMIS device, which has only an SOI part, has a problem that the gate stack structure of an N-channel MISFET and a P-channel MISFET becomes complicated.

The present invention has been made to solve these problems.

One of the purposes of the present invention is to provide a manufacturing process of a reliable semiconductor integrated circuit device.

The description of the present specification and the accompanying drawings clarify the other purposes and the new feature of the present invention.

The following explains briefly atypical invention among the inventions disclosed in the present application.

One invention of the present application adjusts the threshold voltage of MISFET at the corresponding part by introducing impurities into any of back gate semiconductor regions, in an SOI semiconductor CMISFET integrated circuit device having a high-k gate insulating film and a metal gate electrode.

The following explains briefly the effect acquired by the typical invention among the inventions disclosed in the present application.

An SOI semiconductor CMISFET integrated circuit device, which has a high-k gate insulating film and a metal gate electrode, can adjust the threshold voltage of MISFET at the corresponding part by introducing impurities into any of the back gate semiconductor regions. This can simplify the gate stack structure.

DETAILED DESCRIPTION

[Outline of Embodiments]

Figure 1:
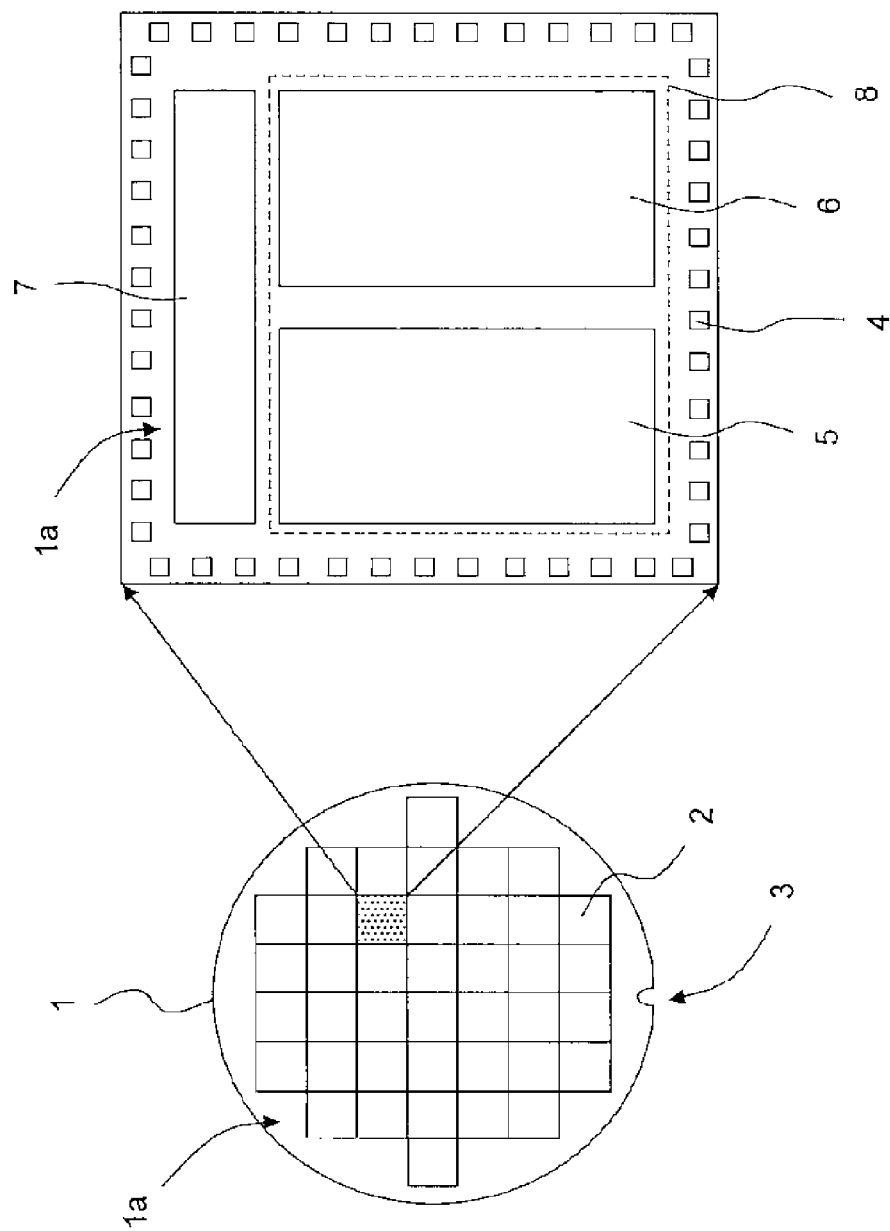
FIG. 1 is a top view of a wafer and its chip region showing an example of a layout of a device chip common to a semiconductor integrated circuit device in each embodiment of the present application.

First, typical embodiments of the present invention disclosed in the present application is outlined.

1. A semiconductor integrated circuit device includes (a) a semiconductor chip having a first main surface and a second main surface; (b) an SOI region provided on the first main surface of the semiconductor chip; (c) a first N-channel MISFET region and a first P-channel MISFET region, which are provided within the SOI region; (d) a first gate insulating film having a high-k insulating film and a first gate electrode film having a metal layer, which are provided within the first N-channel MISFET region on the side of the first main surface of the semiconductor chip; (e) a second gate insulating film having a high-k insulating film and a second gate electrode film having a metal layer, which are provided within the first P-channel MISFET region on the side of the first main surface of the semiconductor chip; (f) an N-type MISFET back gate impurity-doped semiconductor region, which is provided in the first N-channel MISFET region inside the semiconductor chip; and (g) a P-type MISFET back gate impurity-doped semiconductor region, which is provided in the first P-channel MISFET region inside the semiconductor chip. The N-type MISFET back gate impurity-doped semiconductor region or the P-type MISFET back gate impurity-doped semiconductor region has a potential other than a reference potential and a power source potential.

2. In the semiconductor integrated circuit device in item 1 described above, the N-type MISFET back gate impurity-doped semiconductor region or the P-type MISFET back gate impurity-doped semiconductor region has a potential between the reference potential and the power source potential.

3. The semiconductor integrated circuit device in item 1 or 2 described above further includes (h) a bulk region provided on the first main surface of the semiconductor chip; (i) a second N-channel MISFET region and a second P-channel MISFET region provided within the bulk region; (j) a third gate insulating film and a third gate electrode film having a metal layer, which are provided within the second N-channel MISFET region on the side of the first main surface of the semiconductor chip; and (k) a fourth gate insulating film and a fourth gate electrode film having a metal layer, which are provided within the second P-channel MISFET region on the side of the first main surface of the semiconductor chip.

4. In the semiconductor integrated circuit device in item 3 described above, the first gate insulating film, the second gate insulating film, and the third gate insulating film have a lanthanum-doped high-k insulating film, the fourth gate insulating film has an aluminum-doped high-k insulating film, and the first gate electrode film, the second gate electrode film, the third gate electrode film, and the fourth gate electrode film have the same stacked structure.

5. In the semiconductor integrated circuit device in item 3 described above, the first gate insulating film and the third gate insulating film have a lanthanum-doped high-k insulating film, the second gate insulating film and the fourth gate insulating film have a non-doped high-k insulating film, and the first gate electrode film, the second gate electrode film, the third gate electrode film, and the fourth gate electrode film have the same stacked structure.

6. In the semiconductor integrated circuit device in item 3 described above, the first gate insulating film and the second gate insulating film have a lanthanum-doped high-k insulating film, the third gate insulating film and the fourth gate insulating film have no high-k insulating film, and the first gate electrode film, the second gate electrode film, the third gate electrode film, and the fourth gate electrode film have the same stacked structure.

7. In the semiconductor integrated circuit device in item 3 described above, the first gate insulating film and the third gate insulating film have a lanthanum-doped high-k insulating film, the second gate insulating film and the fourth gate insulating film have an aluminum-doped high-k insulating film, and the first gate electrode film, the second gate electrode film, the third gate electrode film, and the fourth gate electrode film have the same stacked structure.

8. In the semiconductor integrated circuit device in item 7 described above, the first gate insulating film and the second gate insulating film have a non-doped high-k insulating film, the third gate insulating film has a lanthanum-doped high-k insulating film, the fourth gate insulating film has an aluminum-doped high-k insulating film, and the first gate electrode film, the second gate electrode film, the third gate electrode film, and the fourth gate electrode film have the same stacked structure.

9. A semiconductor integrated circuit device include (a) a semiconductor chip having a first main surface and a second main surface; (b) an SOI region provided on the first main surface of the semiconductor chip; (c) a first N-channel MISFET region having a first N-channel MISFET and a first P-channel MISFET region having a first P-channel MISFET, which are provided within the SOI region; (d) a first gate insulating film having a high-k insulating film and a first gate electrode film having a metal layer, which are provided within the first N-channel MISFET region on the side of the first main surface of the semiconductor chip; (e) a second gate insulating film having a high-k insulating film and a second gate electrode film having a metal layer, which are provided within the first P-channel MISFET region on the side of the first main surface of the semiconductor chip; (f) an N-type MISFET back gate impurity-doped semiconductor region, which is provided in the first N-channel MISFET region inside the semiconductor chip; and (g) a P-type MISFET back gate impurity-doped semiconductor region, which is provided in the first P-channel MISFET region inside the semiconductor chip. The N-type MISFET back gate impurity-doped semiconductor region or that of the P-type MISFET back gate impurity-doped semiconductor region is a region to adjust a threshold voltage across the first N-channel MISFET or the first P-channel MISFET.

10. The semiconductor integrated circuit device in item 9 described above further includes (h) a bulk region provided on the first main surface of the semiconductor chip; (i) a second N-channel MISFET region and a second P-channel MISFET region, which are provided within the bulk region; (j) a third gate insulating film and a third gate electrode film having a metal layer, which are provided within the second N-channel MISFET region on the side of the first main surface of the semiconductor chip; and (k) a fourth gate insulating film and a fourth gate electrode film having a metal layer, which are provided within the second P-channel MISFET region on the side of the first main surface of the semiconductor chip.

11. In the semiconductor integrated circuit device in item 10 described above, the first gate insulating film, the second gate insulating film, and the third gate insulating film have a lanthanum-doped high-k insulating film, the fourth gate insulating film has an aluminum-doped high-k insulating film, and the first gate electrode film, the second gate electrode film, the third gate electrode film, and the fourth gate electrode film have the same stacked structure.

12. In the semiconductor integrated circuit device in item 10 described above, the first gate insulating film and the third gate insulating film have a lanthanum-doped high-k insulating film, the second gate insulating film and the fourth gate insulating film have a non-doped high-k insulating film, and the first gate electrode film, the second gate electrode film, the third gate electrode film, and the fourth gate electrode film have the same stacked structure.

13. In the semiconductor integrated circuit device in item 10 described above, the first gate insulating film and the second gate insulating film have a lanthanum-doped high-k insulating film, the third gate insulating film and the fourth gate insulating film have no high-k insulating film, and the first gate electrode film, the second gate electrode film, the third gate electrode film, and the fourth gate electrode film have the same stacked structure.

14. In the semiconductor integrated circuit device in item 10 described above, the first gate insulating film and the third gate insulating film have a lanthanum-doped high-k insulating film, the second gate insulating film and the fourth gate insulating film have an aluminum-doped high-k insulating film, and the first gate electrode film, the second gate electrode film, the third gate electrode film, and the fourth gate electrode film have the same stacked structure.

15. In the semiconductor integrated circuit device in item 10 described above, the first gate insulating film and the second gate insulating film have a non-doped high-k insulating film, the third gate insulating film has a lanthanum-doped high-k insulating film, the fourth gate insulating film has an aluminum-doped high-k insulating film, and the first gate electrode film, the second gate electrode film, the third gate electrode film, and the fourth gate electrode film have the same stacked structure.

16. In any one of the semiconductor integrated circuit devices in items 9 to 15 described above, the threshold voltage is adjusted by changing the impurity concentration or the impurity conductivity in the N-type MISFET back gate impurity-doped semiconductor region or the P-type MISFET back gate impurity-doped semiconductor region.

17. In any one of the semiconductor integrated circuit devices in items 9 to 16 described above, the N-type MISFET back gate impurity-doped semiconductor region or the P-type MISFET back gate impurity-doped semiconductor region has a potential other than a reference potential and a power source potential.

18. In any one of the semiconductor integrated circuit devices in items 9 to 17 described above, the N-type MISFET back gate impurity-doped semiconductor region or the P-type MISFET back gate impurity-doped semiconductor region has a potential between the reference potential and the power source potential.

19. In any one of the semiconductor integrated circuit devices in items 1 to 18 described above, the semiconductor integrated circuit device adopts a gate first scheme.

20. In any one of the semiconductor integrated circuit devices in items 1 to 18 described above, the semiconductor integrated circuit device adopts a gate last scheme.

[Explanation of description form, basic terms, usage in the present application]

1. In the present application, the embodiments will be explained by dividing into plural sections for convenience, if necessary for convenience. Except as otherwise clearly specified particularly, they are not mutually independent individually. In each part of a single example, one has relationships such as details and modification of some or entire of another. In principle, no similar parts are repeated. Each element in the embodiments is unnecessary, except as otherwise clearly specified particularly, considered to be clearly restricted to a specific number theoretically and clearly shown from the context.

Further, when the present application refers to "semiconductor device" or "semiconductor integrated circuit device", it means a single body of various transistors (active elements) or a semiconductor chip (for example, a single-crystal silicon substrate) on which, mainly transistors, parts including resistors and capacitors are mounted. A typical transistor mentions MISFET (Metal Insulator Semiconductor Field Effect Transistor) represented by MOSFET (Metal Oxide Semiconductor Field Effect Transistor). A typical integrated circuit configuration mentions a CMIS (Complementary Metal Insulator Semiconductor) integrated circuit represented by a CMOS (Complementary Metal Oxide Semiconductor) integrated circuit combining an N-channel type MISFET and a P-channel type MISFET.

Usually, the present wafer process of the semiconductor integrated circuit device, LSI (Large Scale Integration), is roughly divided into the FEOL (Front End of Line) process, which starts with transfer of a silicon wafer as a raw material and ends with a premetal process (a process including formation of an interlayer insulating film and others between the lower end of the M1 wiring layer and the gate electrode structure, formation of contact holes, and embedment of tungsten plugs), and the BEOL (Back End of Line) process, which starts with the formation of the M1 wiring layer and ends with that of pad openings in the final passivation film over the aluminum pad electrode (the wafer-level packaging includes this process).

2. Similarly, in the description of the embodiment and others, mentioning a material, composition and others as "X including A" does not exclude one which has an element other than A as its main element, except as otherwise clearly specified particularly or clearly shown from the context. An example of mentioning a component is "X including A as its main element". For example, "silicon member" is not limited to pure silicon and includes a SiGe alloy, a poly-alloy having silicon as its main element, and a member having additives. Similarly, for example, "silicon oxide film" and "silicon oxide-based insulating film" include comparatively pure undoped silicon oxide, and further, a thermally-oxidized film such as FSG (Fluorosilicate Glass), TEOS-based silicon oxide, SiOC (Silicon Oxicarbide), Carbon-doped silicon oxide, OSG (Organosilicate glass), PSG (Phosphorus Silicate Glass) and BPSG (Borophosphosilicate Glass), coating silicon oxide, such as a CVD oxide film, SOG (Spin On Glass), and NSC (Nano-Clustering Silica), a silica-based low-k insulating film (a porous-based insulating film) in which holes are formed in the above members, a film including another silicon insulating film that has the above film as its main component.

Along with the silicon oxide-based insulating film, the silicon-based insulating film that is used in the semiconductor field includes a silicon nitride-based insulating film. The materials belonging to this group include SiN, SiCN, SiNH, and SiCNH. "Silicon nitride" refers to both SiN and SiNH except as otherwise clearly specified particularly. Similarly, "SiCN" refers to both SiCN and SiCNH except as otherwise clearly specified particularly.

SiC has properties similar to SiN. In many cases, SiON should be classified as a silicon oxide-based insulating film.

The silicon nitride film is frequently used as an etch stop film in the SAC (Self-Aligned Contact) technique and used as a stress-applying film in SMT (Stress Memorization Technique).

Similarly, "nickel silicide" usually refers to nickel monosilicide and includes comparatively pure nickel monosilicide and further alloys including nickel monosilicide as their main component and mixed crystal. The silicide is not limited to nickel silicide and may be cobalt silicide, titanium silicide, tungsten silicide, and other silicide, which have performed adequately. In addition to a Ni (nickel) film, a nickel alloy film, such as a Ni—Pt alloy film (alloy film of Ni and Pt), a Ni—V alloy film (an alloy film of Ni and V), Ni—Pd alloy film (an alloy film of Ni and Pd), a Ni—Yb alloy film (an alloy film of Ni and Yb), and a Ni—Er alloy film (an alloy film of Ni and Er), can be used as a metal film that is turned into silicide. The silicide including nickel as its main metal element is referred to as "nickel-based silicide".

3. Similarly, examples including figures, positions, and attributes are illustrated. These examples are not limited strictly except as otherwise clearly specified particularly and clearly shown from the context.

4. Further, when specific values and the number of elements are referred, except as otherwise clearly specified particularly, clearly not restricted to a specific value or number theoretically, and clearly shown not from the context, they may be larger or smaller than the specific value or number.

5. "Wafer" usually refers to a single-crystal silicon wafer on which a semiconductor integrated circuit device (a semiconductor device and an electronic device, too) is formed and includes an epitaxial wafer, an SOI substrate, and a compound wafer of an insulating substrate, such as an LCD glass substrate, and a semiconductor layer.

6. In the present application, when a potential is referred to as "potential V between A and B", V excludes the potentials at both the ends. When a potential is referred to as "potential V from A to B", V excludes the potentials at both the ends. The following examples explain specifically a case that V is fixed, but it may be variable as necessary. When V is variable, it must be "potential V between A and B" temporarily.

7. To classify the manufacturing method of the CMIS integrated circuit in the present application, the "gate last scheme" refers to a scheme in which the polysilicon dummy gate electrode is removed after the high-temperature heat treatment of source and drain and the "gate first scheme" refers to other schemes.

[Details of Embodiments]

Embodiments are described in more detail. Each drawing represents the same or similar part by using the same or similar symbol or reference numeral and repeats no explanation in principle.

When being complicated or showing clear distinction from cavities, an accompanied drawing may omit hatching and other effects even if the drawing is sectional. In relation to this, when explanation clarifies a hole, a drawing may omit the background contour of the hole even if the hole is planar and closed. Further, to show a part other than cavity explicitly, a drawing may show hatching even if the drawing is not sectional.

1. Explanation of an example of a layout of a device chip and others common to a semiconductor integrated circuit device in each embodiment of the present application (mainly FIG. 1): The following specifically explains an SOC chip as an example of a target device of the present application. This chip is a memory-dedicated chip. The following specifically explains a product of the 45-nm technology node generation as an example. This product applies to other generations.

The following specifically explains a chip having both a bulk region 7 and an SOI region 8. The chip may be a chip having only the SOT region 8.

FIG. 1 is a top view of a wafer and its chip region showing an example of a layout of a device chip common to a semiconductor integrated circuit device in each embodiment of the present application. Based on this, FIG. 1 explains an example of the layout of the device chip common to the semiconductor integrated circuit device in each embodiment of the present application.

With reference to FIG. 1, a number of chip regions 2 are formed on a device main surface 1a (first main surface) of a wafer 1 during the wafer process (A silicon single-crystal wafer with a diameter of 300 φ is explained. The diameter may be 450 φ or 200 φ). Further, the wafer 1 has a notch 3 to determine its orientation.

Next, details of the layout of each chip 2 (a chip region) are explained. A number of bonding pads 4 are provided on the periphery of the chip region 2 and the bulk region 7 (a bulk peripheral circuit region) and the SOI region 8 are provided in an internal region. The SOI region 8 includes an SOI memory region 5 and an SOI logic region 6. SRAM (Static Random Access Memory) is not limited to the SOI memory region 5, but may be DRAM (Dynamic Random Access Memory) or flash memory.

2. Explanation of a CMIS chip structure 1 (a potential structure common to a substrate and a back gate well) common to the semiconductor integrated circuit device in each embodiment of the present application (mainly FIG. 2 and FIG. 3): This section explains an example of a potential structure (including a diffusion structure), such as a power source structure, in the bulk region 7 and the SOI region 8 of the semiconductor chip explained in section 1. The bulk region 7 and the SOI region 8 (FIG. 1) are drawn in different diagrams because of the limitation on the size of the diagram, but they are formed over the same semiconductor chip. A chip with such a compound structure is called a hybrid SOI chip or hybrid SOI device. The present application explains mainly the hybrid SOI chip, but the device may be one having only the SOI region 8.

FIG. 2 to FIG. 5 and FIG. 29 specifically explains an inverter as an example of a CMIS circuit. The CMIS circuit includes but is not limited to the inverter.

Figure 2:
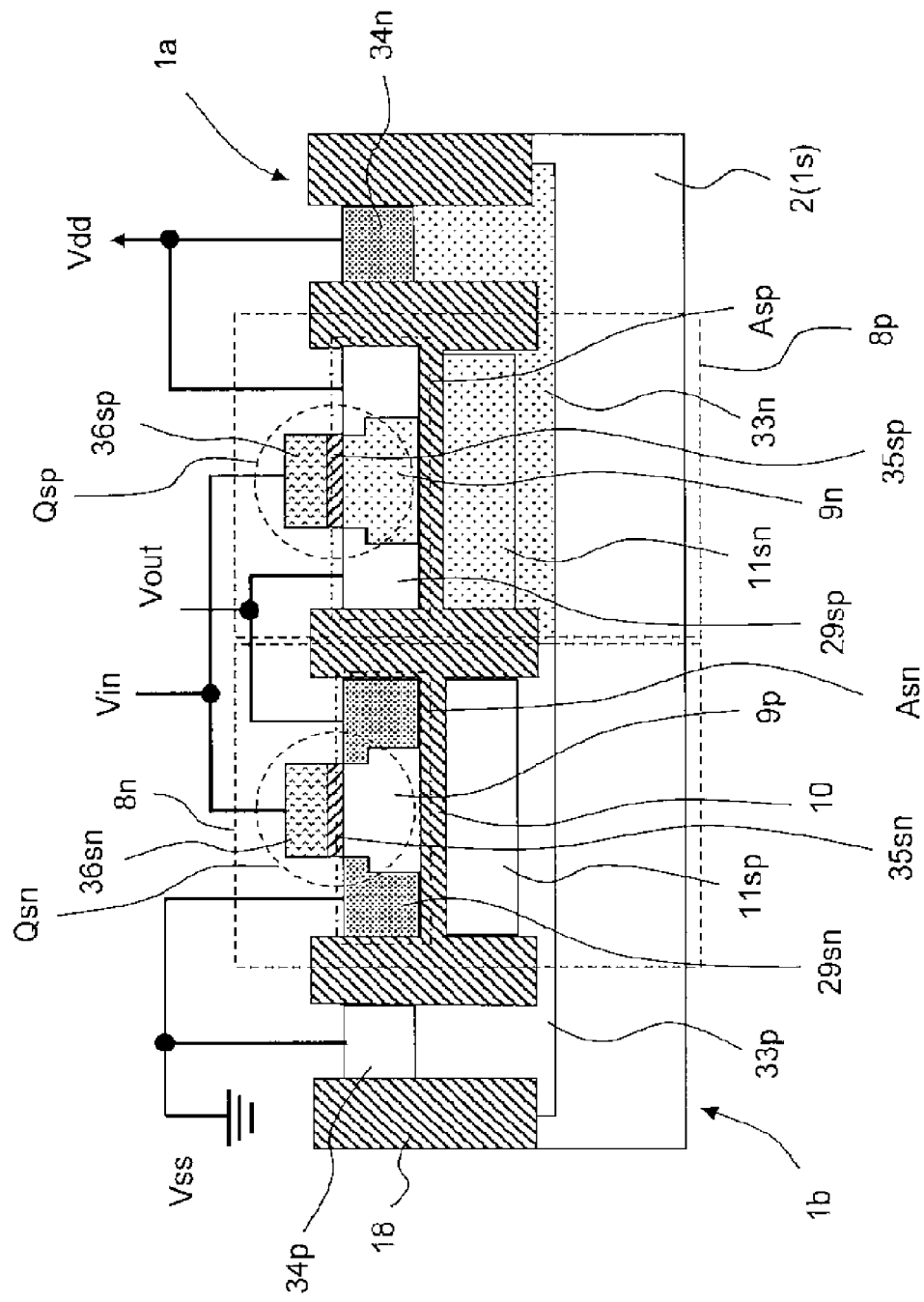
FIG. 2 is a schematic sectional view showing an example of a sectional structure of an SOI region in a CMIS chip structure 1 (a potential structure common to a substrate and aback gate well) of an SOI region common to a semiconductor integrated circuit device in each embodiment of the present application.
Figure 3:
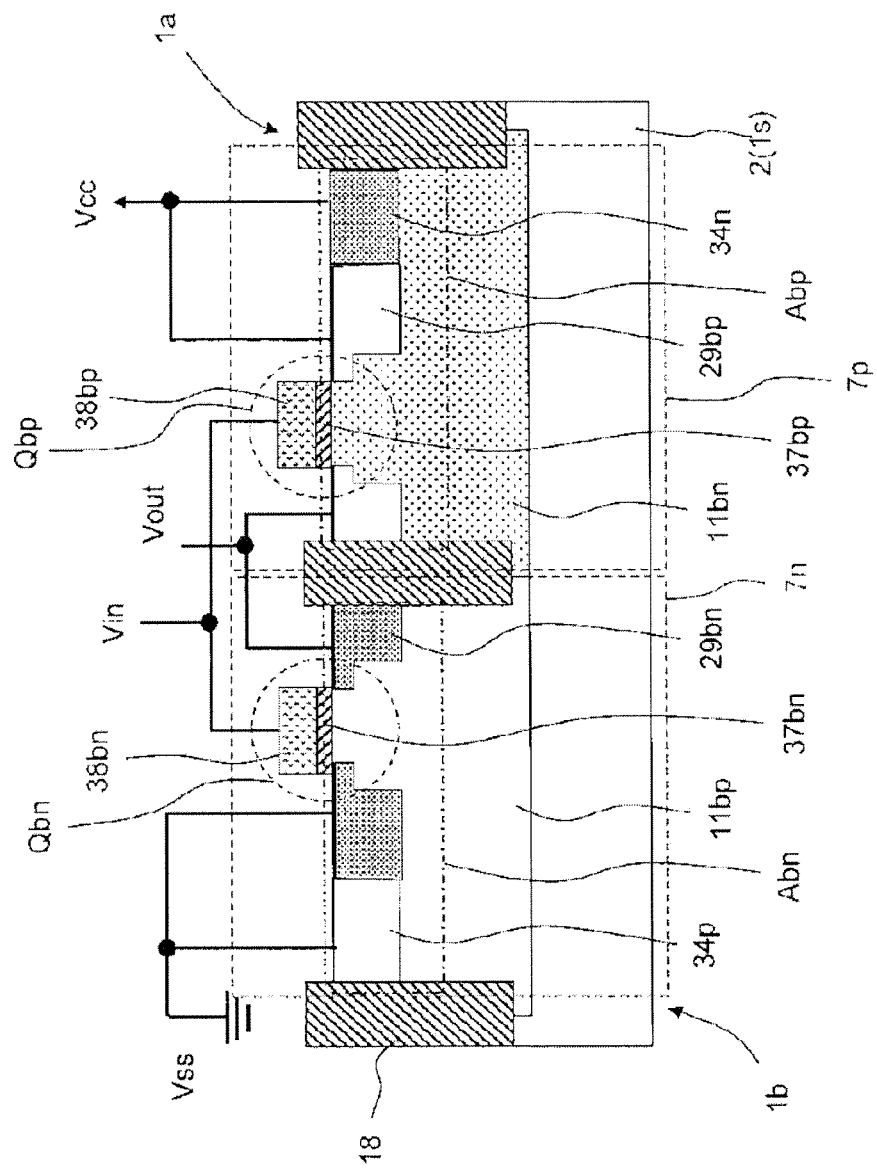
FIG. 3 is a schematic sectional view showing an example of a sectional structure of a bulk region in the CMIS chip structure 1 (a potential structure common to a substrate and a back gate well) common to a semiconductor integrated circuit device in each embodiment of the present application.

FIG. 2 is a schematic sectional view showing an example of a sectional structure of the SOI region in a CMIS chip structure 1 (a potential structure common to a substrate and a back gate well) of the SOI region common to the semiconductor integrated circuit device in each embodiment of the present application. FIG. 3 is a schematic sectional view showing an example of a sectional structure of the bulk region in the CMIS chip structure 1 (a potential structure common to a substrate and a back gate well) common to the semiconductor integrated circuit device in each embodiment of the present application. Based on these, the CMIS chip structure 1 (a potential structure common to a substrate and a back gate well) common to the semiconductor integrated circuit device in each embodiment of the present application is explained.

First, the SOI region 8 is explained. With reference to FIG. 2, the device chip 2 in each embodiment is formed over a P-type single-crystal silicon substrate is and the back surface lb of the chip 2 is the substrate 1s. An element isolation region 18, such as STI (Shallow Trench Isolation), divides the device main surface 1a (a first main surface) of the SOI region 8 into an N-channel MISFET region 8n (a first N-channel MISFET region), a P-channel MISFET region 8p (a first P-channel MISFET region), and other regions. An SOI-N-type MISFET (Qsn) active region Asn is provided in a surface region of the device main surface la of the N-type MISFET region 8n. An SOI-P-type MISFET (Qsp) active region Asp is provided in a surface region of the device main surface 1a of the P-type MISFET region 8p. An N-type SOI part source drain region 29sn (including a high-concentration region and an extension region) is provided in a P-type SOI layer 9p of the active region Asn. A P-type SOI part source drain region 29sp (including a high-concentration region and an extension region) is provided in an N-type SOI layer 9n of the active region Asp. A gate electrode 36sn (a first gate electrode film) is provided over the device main surface 1a of the active region Asn via a gate insulating film 35sn (a first gate insulating film). Agate electrode 36sp (a second gate electrode film) is provided over the device main surface la of the active region Asp via a gate insulating film 35sp (a second gate insulating film). An N-type MISFET back gate impurity-doped semiconductor region 11sp (a back gate or a back gate well, either of which is a threshold voltage adjustment region) is provided under the active region Asn (the P-type SOI layer 9p) via a BOX oxide film 10 (BOX insulating film), which is a back gate insulating film. A P-type MISFET back gate impurity-doped semiconductor region 11sn (a back gate or a back gate well, either of which is a threshold voltage adjustment region) is provided under the active region Asp (the N-type SOI layer 9n) via the BOX oxide film 10 (BOX insulating film), which is a back gate insulating film. The N-type MISFET impurity-doped semiconductor region 11sp couples a reference potential Vss via a P-type deep well region 33p and a P-type contact region 34p. The P-type MISFET back gate of the impurity-doped semiconductor region 11sn P-type MISFET couples a power source potential Vdd (for example, 3-volt power source) of the SOI region 8 via an N-type or P-type deep well region 33n and an N-type contact region 34n. Each drain of the SOI-N-type MISFET (Qsn) and the SOI-P-type MISFET (Qsp) couples an output part or an output terminal Vout. The gate electrode 36sn of the SOI-N-type MISFET (Qsn) and the gate electrode 36sp of the SOI-P-type MISFET (Qsp) couple an input part or an input terminal Vin. The source of the SOI-N-type MISFET (Qsn) couples the reference potential Vss. The source of the SOI-P-type MISFET (Qsp) couples the power source potential Vdd of the SOI region 8.

Next, the bulk region 7 is explained. With reference o FIG. 3, the element isolation region 18 as in the SOI region 8 divides the device main surface 1a of the bulk region 7, like that of the SOI region 8, into an N-channel MISFET region 7n (a second N-channel MISFET region), a P-channel MISFET region 7p (a second P-channel MISFET region), and other regions. A P-type well 11bp is provided within the device main surface 1a of the N-channel MISFET region 7n. An N-type well 11bn is provided in the device main surface 1a of the P-channel MISFET region 7p. An N-type source drain region 29bn (including a high-concentration region and an extension region) of a bulk N-type MISFET (Qbn) is provided in a surface region (an active region Abn) of the device main surface la of the P-type well 11bp. A P-type source drain region 29bp (including a high-concentration region and an extension region) of a bulk P-type MISFET (Qbp) is provided in a surface region (an active region Abp) of the device main surface la of the N-type well 11bn. The source of the bulk N-type MISFET (Qbn) couples the reference potential Vss along with the P-type contact region 34p and that of the drain couples the output part or the output terminal Vout. Further, the source of the bulk P-type MISFET (Qbp) is coupled to a power source potential Vcc (for example, 1-volt power source) of the bulk region 7 together with the N-type contact region 34n and the drain is coupled to the output part or the output terminal Vout. A gate electrode 38bn (a third gate electrode film) is provided over the surface of the active region Abn via a gate insulating film 37bn (a third gate insulating film). A gate electrode 38bp (a fourth gate electrode film) is provided over the surface of the active region Abp via a gate insulating film 37bp (a fourth gate insulating film). The gate electrodes 38bn and 38bp couple the input part or the input terminal Vin.

In such a power source supply structure, normally, the well potential and other potentials at the N channel (the P-type well 11bp or the substrate is in the bulk peripheral circuit region, and the N-type MISFET back gate impurity-doped semiconductor region 11sp) are at the reference potential Vss in both the bulk region 7 and the SOT region 8. The well potential at the P channel (the P-type well 11bp in the bulk peripheral circuit region, and the back gate impurity-doped semiconductor region 11sn of the P-type MISFET) is at the power source potential vcc in the bulk region 7 and at the power source potential Vdd in the SOT region 8. Controlling the threshold voltage of each MISFET depends on each gate stack (the bulk region 7 and the SOT region 8), the introduction of impurities into the channel region (the bulk region 7 and the SOT region 8), the amount of impurities introduced into the back gate (the P-type MISFET back gate impurity-doped semiconductor region 11sn and the N-type MISFET back gate impurity-doped semiconductor region 11sp), and the conductivity (the SOI region 8).

Figure 4:
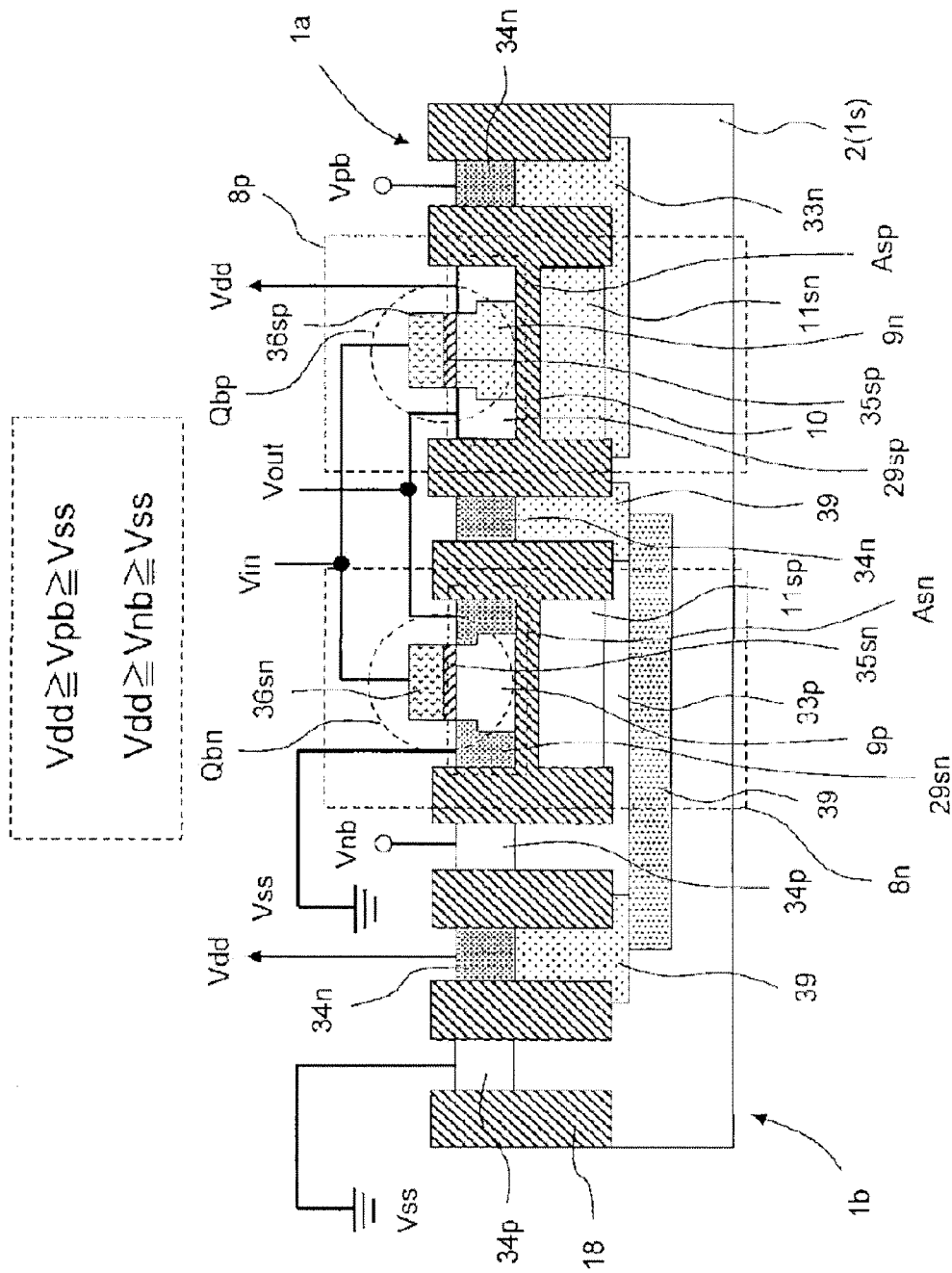
FIG. 4 is a schematic sectional view showing an example of a sectional structure of the SOI region in a CMIS chip structure 2 (a potential structure independent of a substrate and back gate wells at both channels when a P-type MISFET back gate impurity-doped semiconductor region is an N-type well) of the SOI region common to a semiconductor integrated circuit device in each embodiment of the present application.
Figure 5:
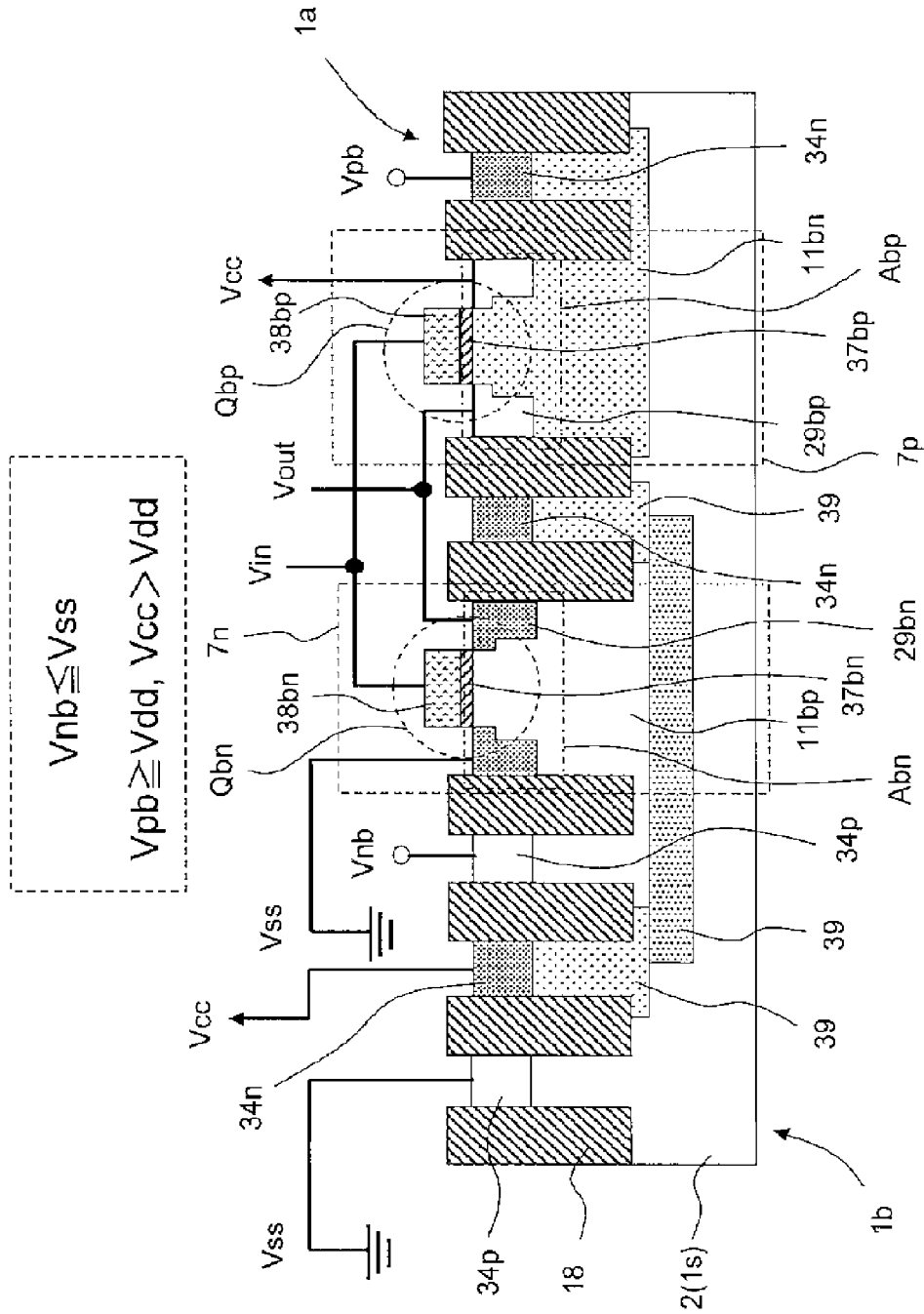
FIG. 5 is a schematic sectional view showing an example of a sectional structure of the bulk region in the CMIS chip structure 2 (a potential structure independent of a substrate and a back gate well at an N-channel) common to a semiconductor integrated circuit device in each embodiment of the present application.
Figure 29:
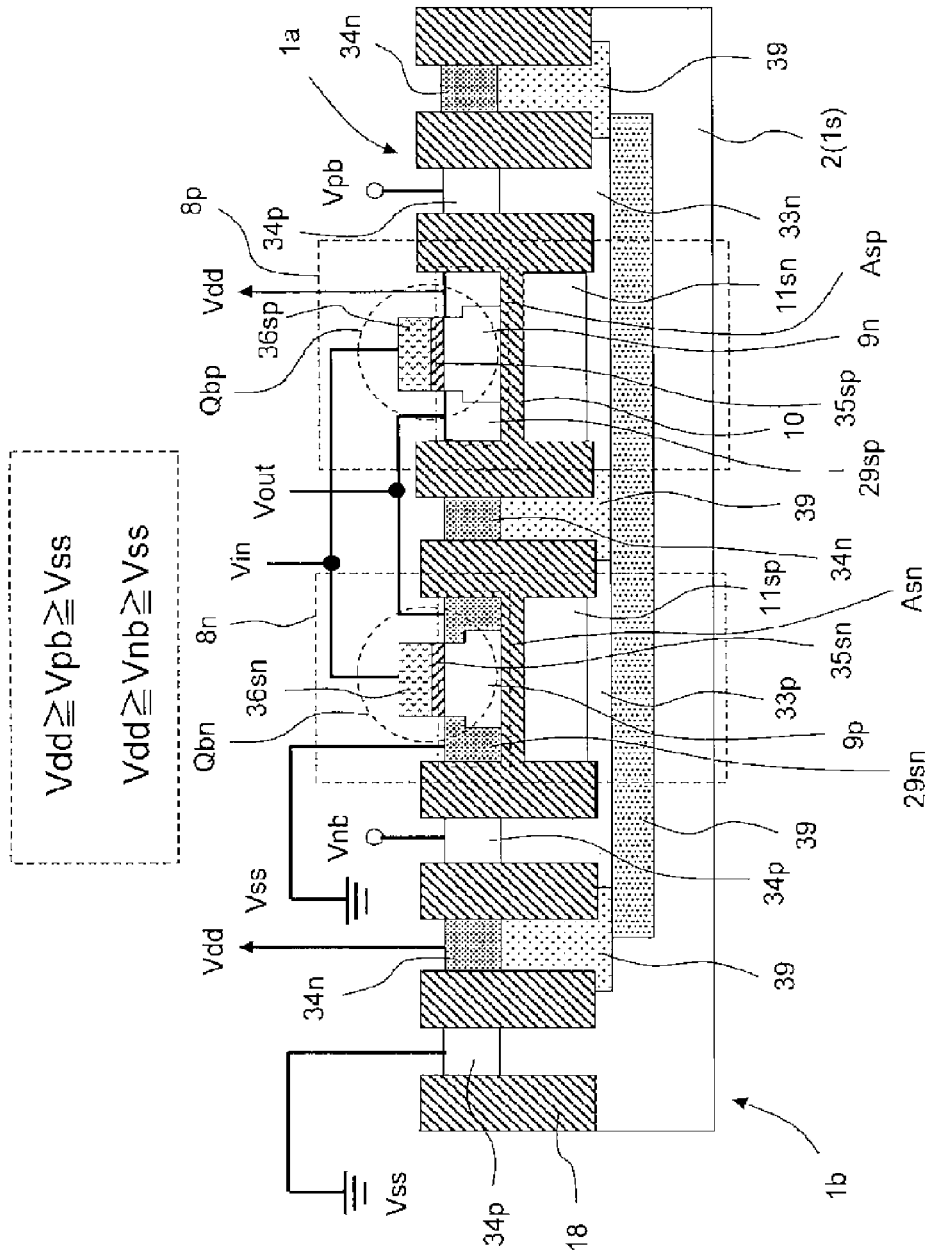
FIG. 29 is a modified example of FIG. 4 and a schematic sectional view (a potential structure independent of a substrate and aback gate well at both the channels when the P-type MISFET back gate impurity-doped semiconductor region is a P-type well) showing an example of the sectional structure of the SOI region when the back gate well of the P-channel MISFET region in the SOI region is a P-type well.

3. Explanation of a CMIS chip structure 2 (a potential structure independent of a substrate and a back gate well at an N-channel) common to the semiconductor integrated circuit device in each embodiment of the present application (mainly FIG. 4, FIG. 5, and FIG. 29): An example in this section is a modified example in section 2. FIG. 4 is a modified example of FIG. 2. FIG. 5 is a modified example of FIG. 3 (FIG. 4 and FIG. 3 can also be combined). FIG. 29 is a further modified example of FIG. 4 (the bulk part may be that in FIG. 5 or FIG. 3). In the following example, the basic configuration is the same as that in FIG. 2 and FIG. 3, and therefore, only different parts are explained.

FIG. 4 is a schematic sectional view showing an example of a sectional structure of the SOI region in a CMIS chip structure 2 (a potential structure independent of a substrate and aback gate well at both the channels when the P-type MISFET back gate impurity-doped semiconductor region is the N-type well) of the SOI region common to the semiconductor integrated circuit device in each embodiment of the present application. FIG. 5 is a schematic sectional view showing an example of a sectional structure of the bulk region in the CMIS chip structure 2 (a potential structure independent of a substrate and a back gate well at an N-channel) common to the semiconductor integrated circuit device in each embodiment of the present application. FIG. 29 is a modified example of FIG. 4 and a schematic sectional view (a potential structure independent of a substrate and a back gate well at both the channels when the P-type MISFET back gate impurity-doped semiconductor region is the P-type well) showing an example of the sectional structure of the SOI region when the back gate well of the P-channel MISFET region of the SOI region is set to the P type. Based on them, the CMIS chip structure 2 (the potential structure independent of the substrate and the back gate well at the N-channel) common to the semiconductor integrated circuit device in each embodiment of the present application is explained.

(1) Example shown in FIG. 4 and FIG. 5 (an N-type independent potential of a back well at a P-channel): Compared to FIG. 2, in FIG. 4, the N-type back well 11$sp$ (a back gate) of the N-channel MISFET region 8$n$ of the SOI region 8 is surrounded by a threefold N-type well region 39 hung by the power source potential Vdd (or an N-type deep well region 33$n$ and the threefold N-type well region 39 are separated). A potential from the reference potential Vss to the power source potential Vdd can be applied to the back gate 11$sp$ as an N-channel back gate vias Vnb. A potential from the reference potential Vss to the power source potential Vdd can be applied to the back gate 11$sn$ as a P-channel back gate vias Vpb.

In such a power source supply structure, unlike FIG. 2 and FIG. 3, in the SOI region 8, the well potential at the N-channel (the N-type MISFET back gate impurity-doped semiconductor region 11$sp$) can be used as the N-channel back gate bias Vnb between the reference potential Vss and the power source potential Vdd. The well potential at the P-channel (the P-type MISFET back gate impurity-doped semiconductor region 11$sn$) can be used as the P-channel back gate bias Vpb between the reference potential Vss and the power source potential Vdd independent of the N-channel back gate bias Vnb. Applying a forward bias to the back gate allows to reduce the absolute value of the threshold voltage. Consequently, controlling the threshold voltage of each MISFET depends on each gate stack (the bulk region 7 and the SOI region 8), the introduction of impurities into the channel region (the bulk region 7 and the SOI region 8), the amount of impurities introduced into the back gate (the P-type MISFET back gate impurity-doped semiconductor region 11$sn$ and the N-type MISFET back gate impurity-doped semiconductor region 11$sp$), the conductivity (the SOI region 8), the application of a forward bias to the back gate (the SOI region 8).

(2) Example in FIG. 29 (a P-type independent potential of a back well at a P-channel): FIG. 29 resembles FIG. 4. Both the P-type MISFET back gate impurity-doped semiconductor region 11$sn$ and the deep well region 33$n$ of the P-channel device region 8$p$ are P-type wells, surrounded by the threefold N-type well region 39 and moreover, separated from each other. Like (1), a potential from the reference potential Vss to the power source potential Vdd can be applied to the back gate 11$sp$ as the N-channel back gate vias Vnb. A potential from the reference potential Vss to the power source potential Vdd can be applied to the back gate 11$sn$ as the P-channel back gate vias Vpb.

In such a power source supply structure, like FIG. 4 and FIG. 5, in the SOI region 8, the well potential at the N-channel (the N-type MISFET back gate impurity-doped semiconductor region 11$sp$) can be used as the N-channel back gate bias Vnb between the reference potential Vss and the power source potential Vdd. The well potential at the P-channel (the P-type MISFET back gate impurity-doped semiconductor region 11$sn$) can be used as the P-channel back gate bias Vpb between the reference potential Vss and the power source potential Vdd independent of the N-channel back gate bias Vnb . Applying a forward bias to the back gate allows to reduce the absolute value of the threshold voltage. Consequently, controlling the threshold voltage of each MISFET depends on each gate stack (the bulk region 7 and the SOI region 8), the introduction of impurities into the channel region (the bulk region 7 and the SOI region 8), the amount of impurities introduced into the back gate (the P-type MISFET back gate impurity-doped semiconductor region 11$sn$ and the N-type MISFET back gate impurity-doped semiconductor region 11$sp$), the conductivity (the SOI region 8), the application of a forward bias to the back gate (the SOI region 8).

4. Explanation of a gate stack structure 1 (an SOI common gate) in a semiconductor integrated circuit device in a first embodiment of the present application (mainly FIG. 6): The structure in the semiconductor substrate in FIG. 6 to FIG. 28 is simpler than that in FIG. 2 to FIG. 5 and FIG. 29. This is because the structure in the semiconductor substrate can be various as shown in FIG. 2 to FIG. 5 and FIG. 29 .

Figure 6:
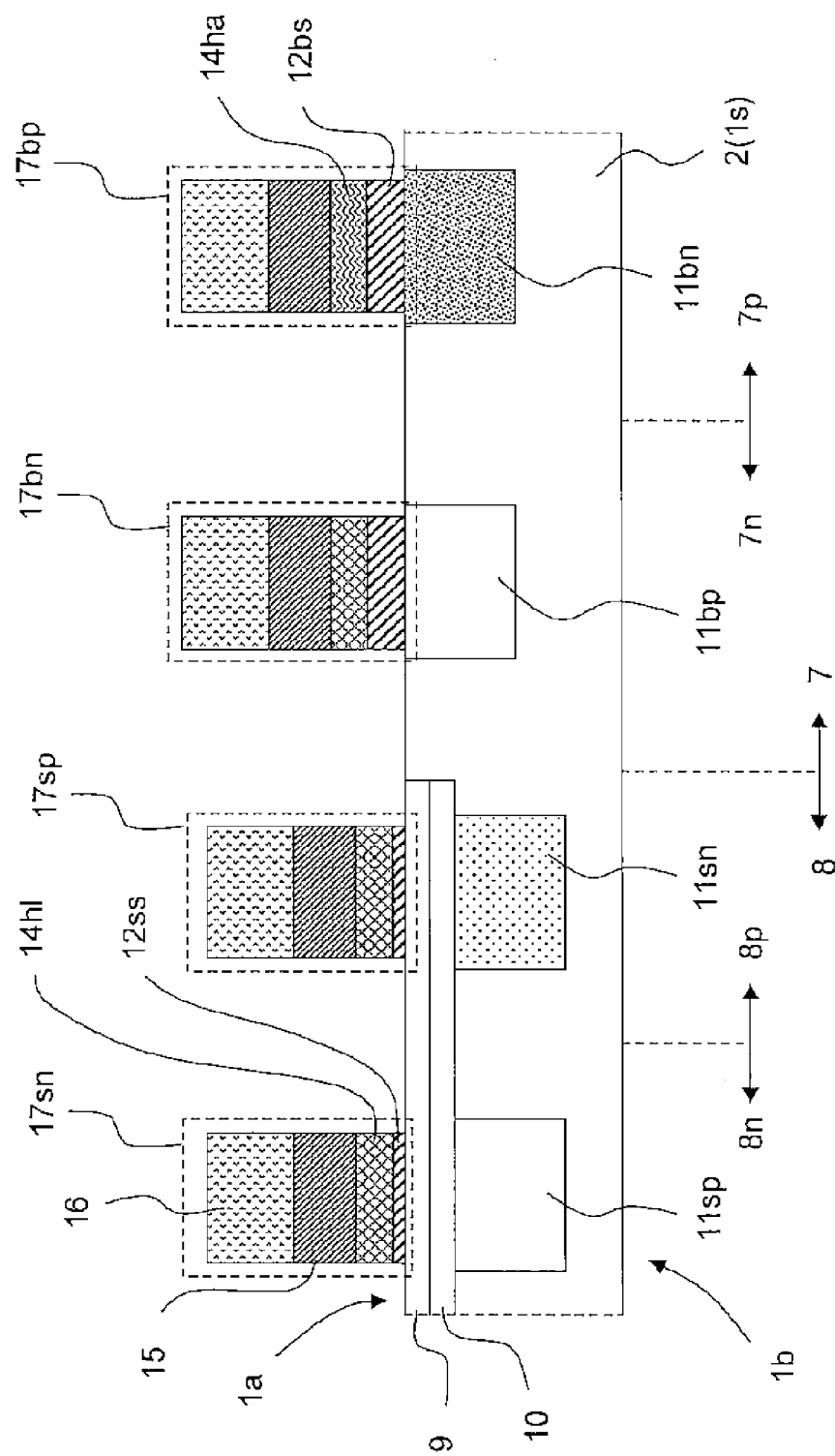
FIG. 6 is a schematic sectional view of a gate stack and a substrate showing a gate stack structure 1 (an SOI common gate) in a semiconductor integrated circuit device in a first embodiment of the present application.

FIG. 6 is a schematic sectional view of a gate stack and a substrate showing a gate stack structure 1 (an SOI common gate) in the semiconductor integrated circuit device in the first embodiment of the present application. Based on this, the gate stack structure 1 (the SOI common gate) in the semiconductor integrated circuit device in the first embodiment of the present application is explained.

As shown in FIG. 6, an N-channel MISFET gate stack 17$sn$ and a P-type MISFET gate stack 17$sp$ of the SOI region 8 include an SOI region liner gate insulating film 12$ss$, a lanthanum-doped hafnium oxide-based high-k gate insulating film. 14$h$1 (a high-k gate insulating film 14), a gate titanium nitride film 15, and a gate polysilicon film 16 from the bottom. A bulk N-channel MISFET gate stack 17$bn$ has the same configuration as the above stacks 17$sn$ and 17$sp$ except the thickness of a bulk region liner gate insulating film 12$bs$ (the above stack 17$bn$ has the same stacked layer structure as the stacks 17$sn$ and 17$sp$). A bulk P-channel MISFET gate stack 17$bp$ is almost the same as the bulk N-channel MISFET gate stack 17$bn$, but the high-k gate insulating film 14 is replaced with an aluminum-doped hafnium oxide-based high-k gate insulating film 14$ha$.

Doping lanthanum causes the absolute value of the threshold voltage of the P-channel MISFET of the SOI region 8 to increase. The absolute value can be decreased to an appropriate value by adjusting the amount of the impurities introduced into the back gate (the P-type MISFET back gate impurity-doped semiconductor region 11$sn$) (the absolute value of the threshold voltage decreases due to an increased dose of P-type impurities or a decreased dose of N-type impurities), applying a forward bias, adjusting the amount of the impurities introduced into the channel region, and combining these methods.

The ranges of an effective work function of each target gate stack (gate electrode) are as follows: The bulk N-channel MISFET gate stack 17$bn$ is about 4.2 to 4.6 eV, the bulk P-channel MISFET gate stack 17$bp$ is about 4.7 to 5.0 eV, the N-channel MISFET gate stack 17$sn$ of the SOI region is about 4.2 to 4.6 eV, and the P-channel MISFET gate stack 17$sp$ of the SOI region is about 4.7 to 5.0 eV.

The combination of the gate stack structures has the following merits. (1) The common gate stack structure in the SOI region 8 can avoid repetition of complicated processing and reduce damage to the lower layer in the gate stack structure (This merit is also effective in the chip including only the SOI region). (2) The whole bulk region 7 and the whole SOI region 8 can configure MISFET in two kinds of gate stack structures except the thicknesses of the silicon oxide-based liner gate insulating films 12bs and 12ss, and then, can considerably simplify the process.

Instead of arranging the threshold voltage adjustment film (all the gate stacks except the P-channel MISFET gate stack 17sp of the bulk region 7 are doped with lanthanum) as shown, an aluminum-based threshold voltage adjustment film (a work function modulation film including aluminum) can be applied to the high-k gate insulating films of the N-channel MISFET gate stack 17sn of the SOI region and of the P-channel MISFET gate stack 17sp of the SOI region. This easily controls the threshold voltage of the P-channel MISFET (Qsp).

5. Explanation of the essential parts of the manufacturing process in the semiconductor integrated circuit device in the first embodiment of the present application (mainly FIG. 7 to FIG. 24): To avoid complexity, the following example omits the deep well, the three-fold well, and others in FIG. 2, FIG. 4, and FIG. 29 and their explanation. The SOI device to be explained is an FD-SOI (Fully Depleted SOI) device.

Figure 7:
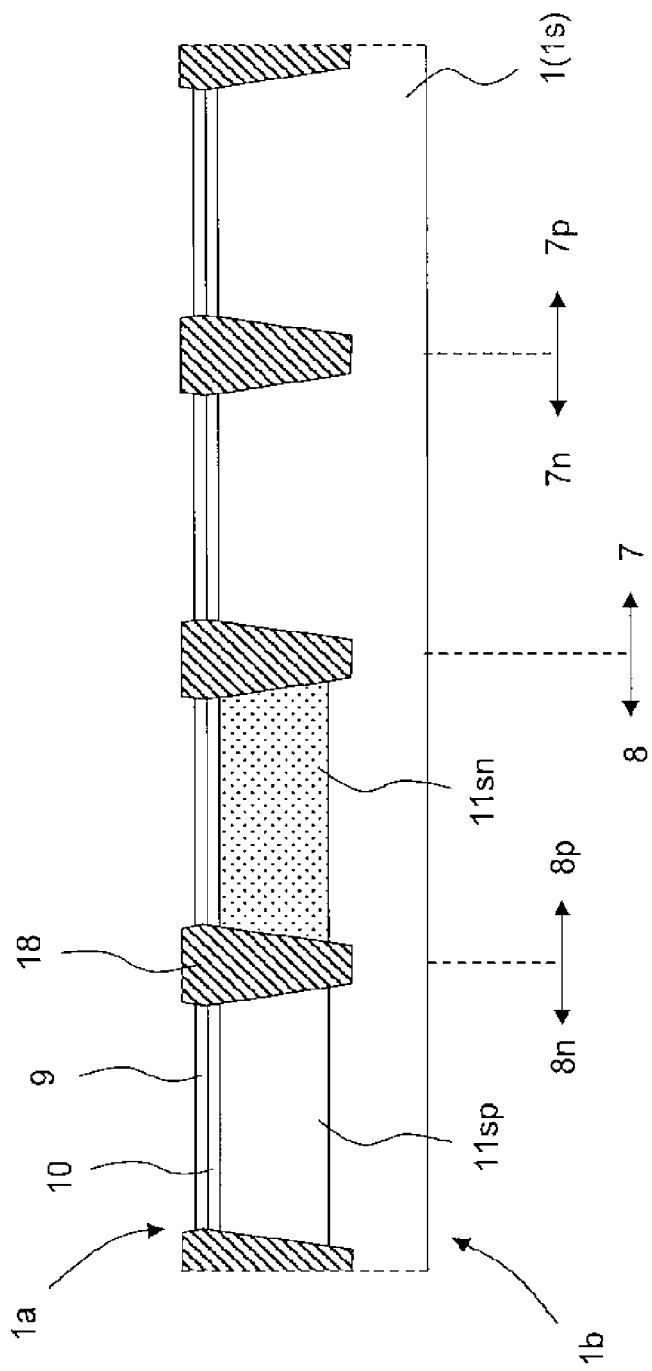
FIG. 7 is a partial sectional view of the wafer (an introduction process of the back gate well in the SOI region), which explains parts including the essential parts of the manufacturing process of the semiconductor integrated circuit device in the first embodiment of the present application.
Figure 8:
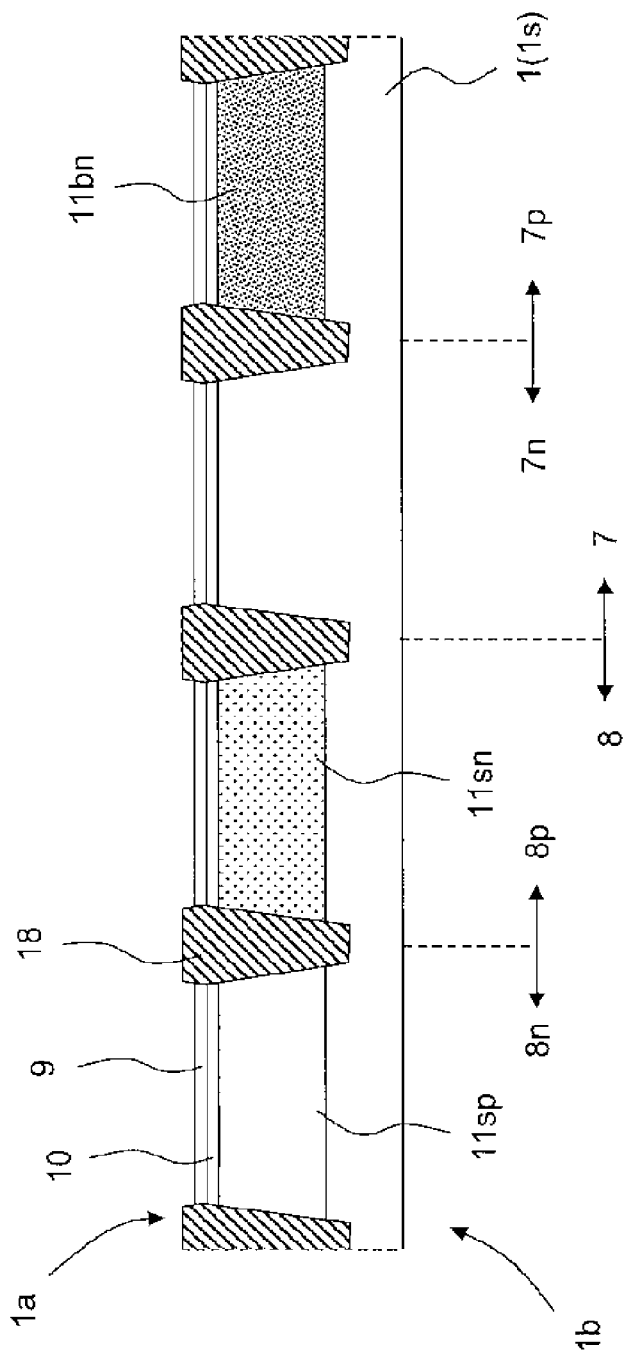
FIG. 8 is a partial sectional view of the wafer (an introduction process of an N-well in the bulk region), which explains parts including the essential parts of the manufacturing process of the semiconductor integrated circuit device in the first embodiment of the present application.
Figure 9:
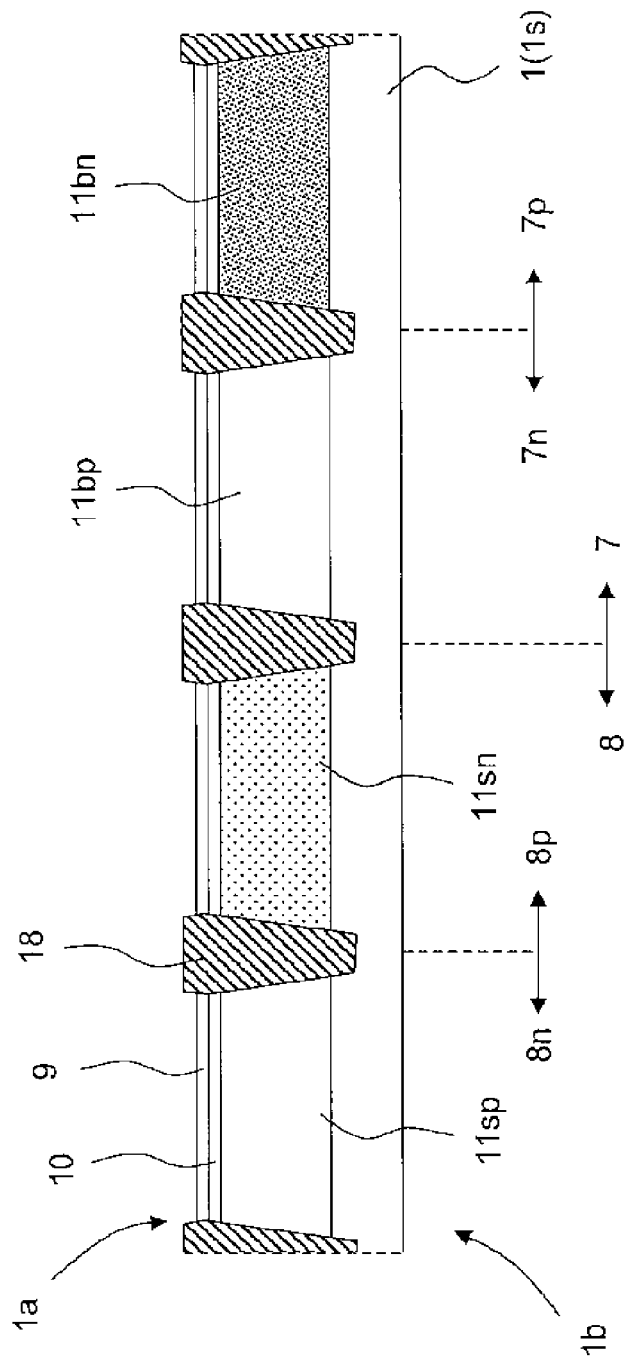
FIG. 9 is a partial sectional view of the wafer (an introduction process of a P-well in the bulk region), which explains parts including the essential parts of the manufacturing process of the semiconductor integrated circuit device in the first embodiment of the present application.
Figure 10:
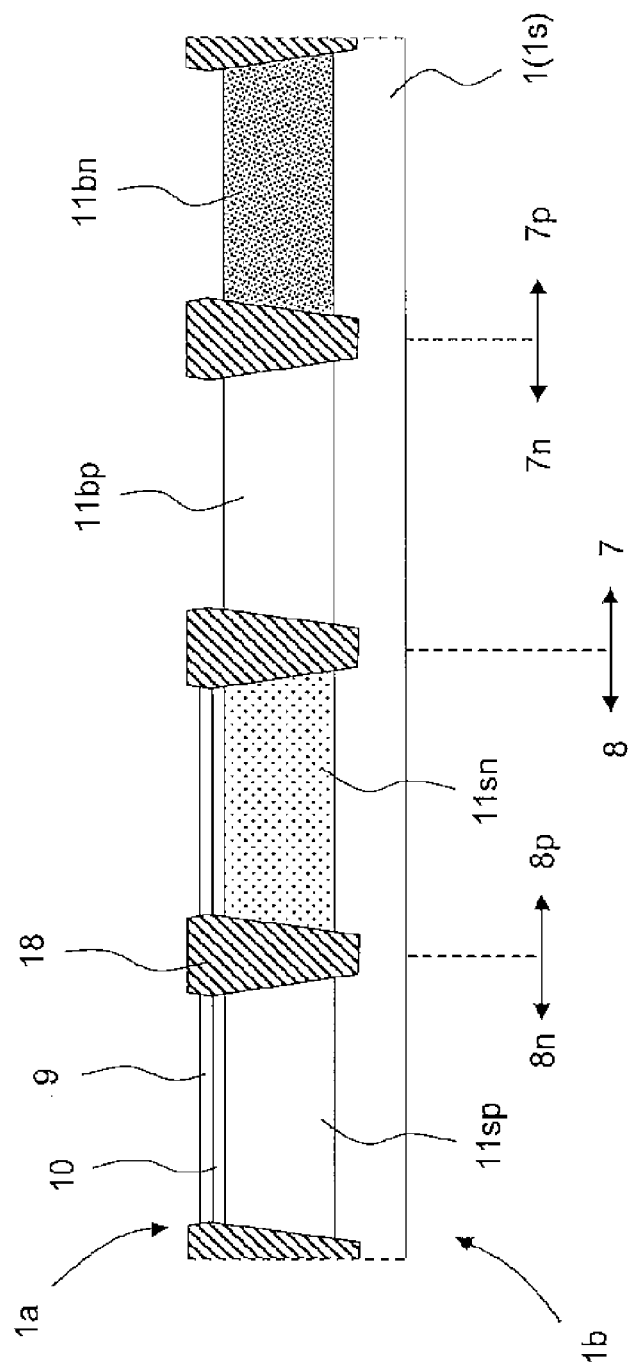
FIG. 10 is a partial sectional view of the wafer (a removal process of an SOI layer and a BOX oxide film in the bulk region), which explains parts including the essential parts of the manufacturing process of the semiconductor integrated circuit device in the first embodiment of the present application.
Figure 11:
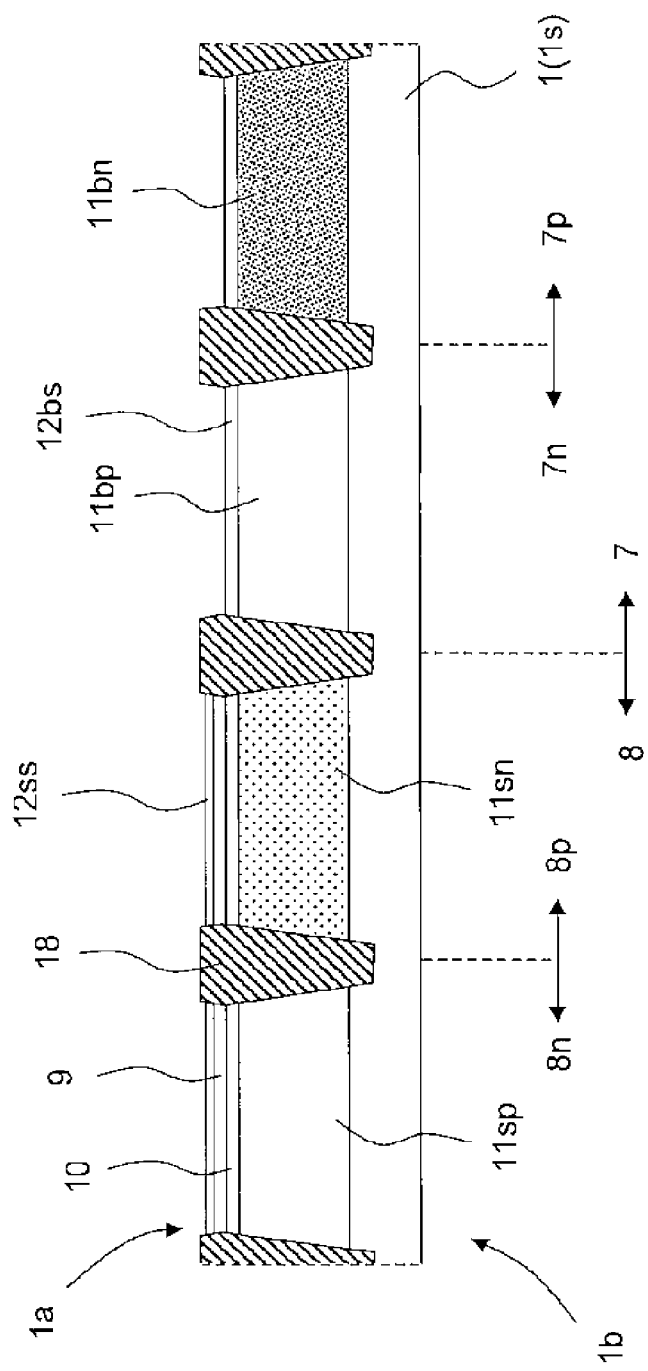
FIG. 11 is a partial sectional view of the wafer (an oxidation process of a gate liner), which explains parts including the essential parts of the manufacturing process of the semiconductor integrated circuit device in the first embodiment of the present application.
Figure 12:
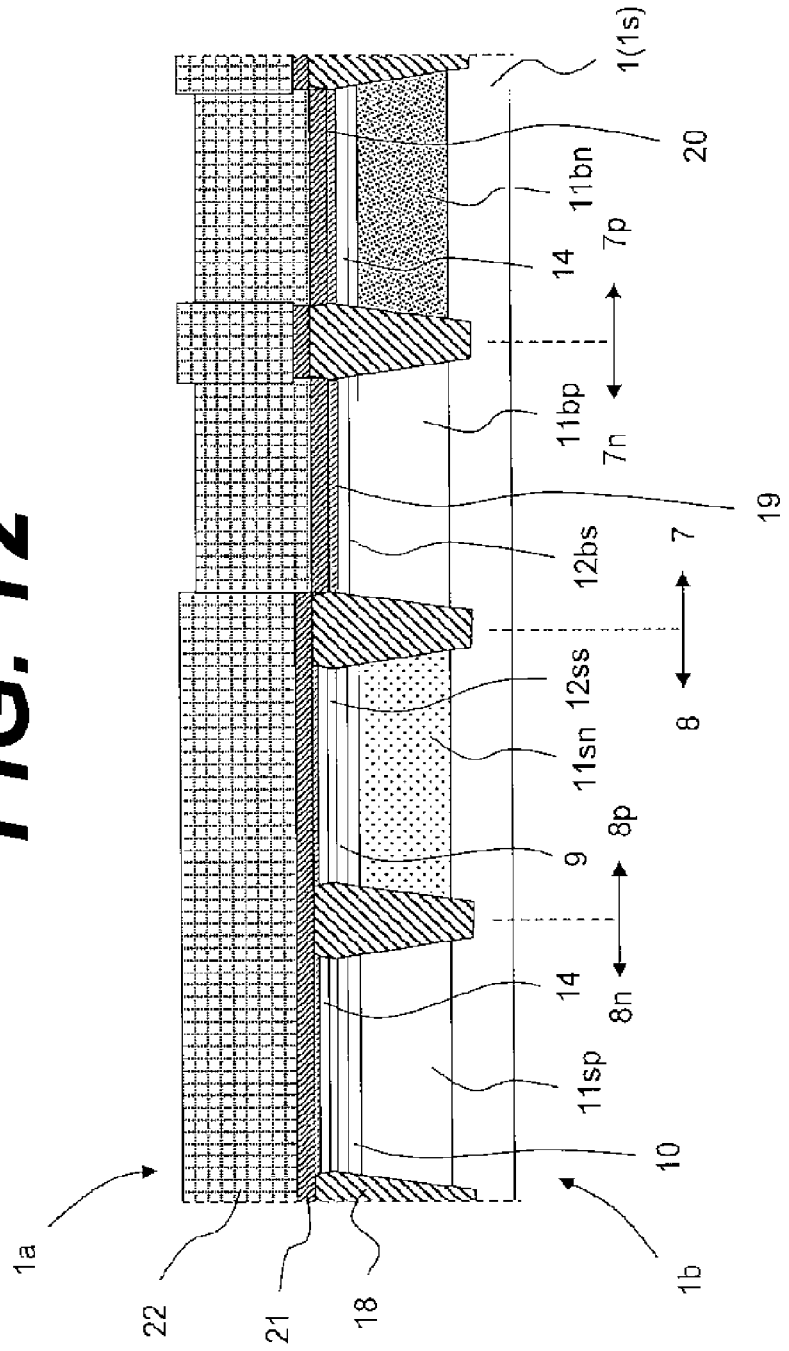
FIG. 12 is a partial sectional view of the wafer (a formation process of a lanthanum film), which explains parts including the essential parts of the manufacturing process of the semiconductor integrated circuit device in the first embodiment of the present application.
Figure 13:
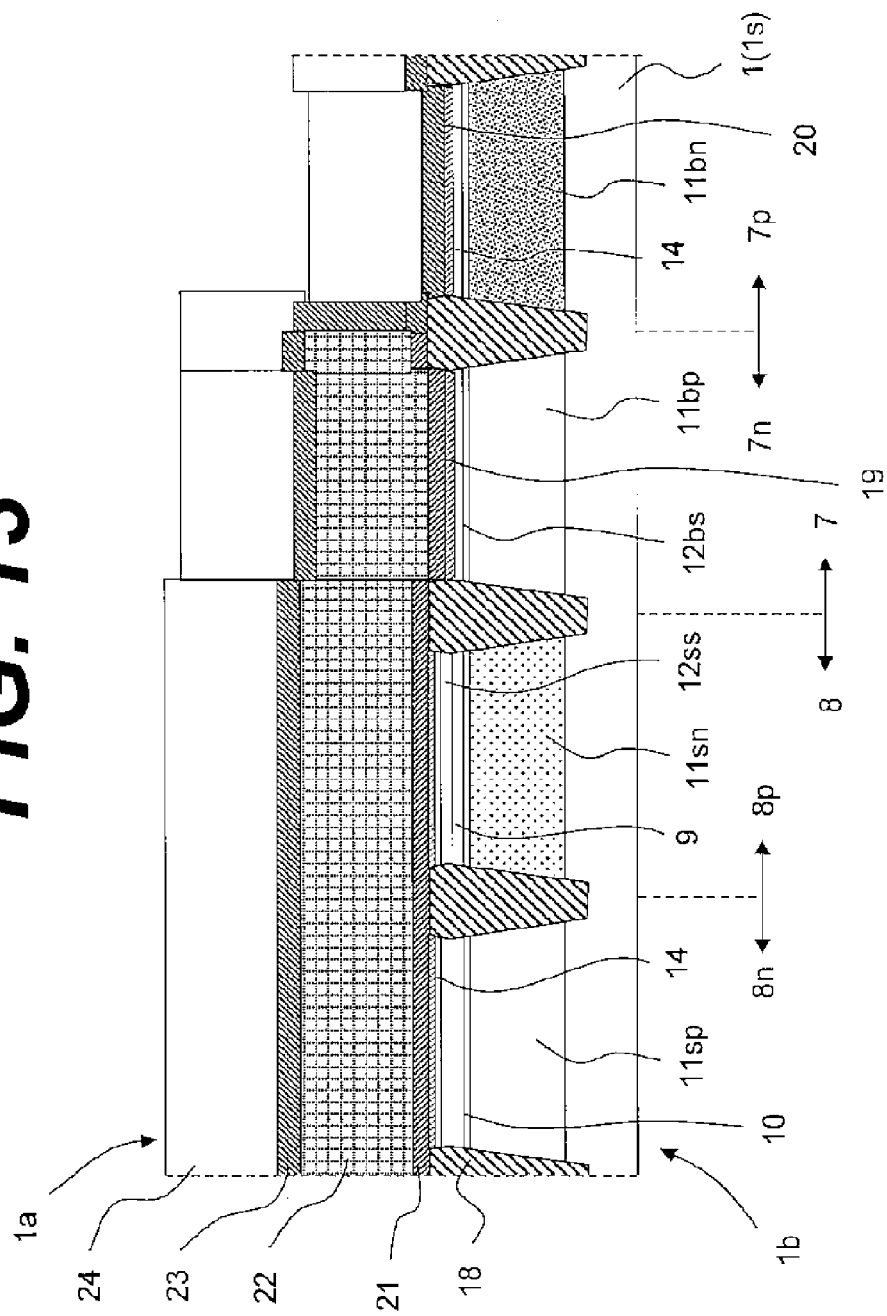
FIG. 13 is a partial sectional view of the wafer (a formation process of an aluminum film), which explains parts including the essential parts of the manufacturing process of the semiconductor integrated circuit device in the first embodiment of the present application.
Figure 14:
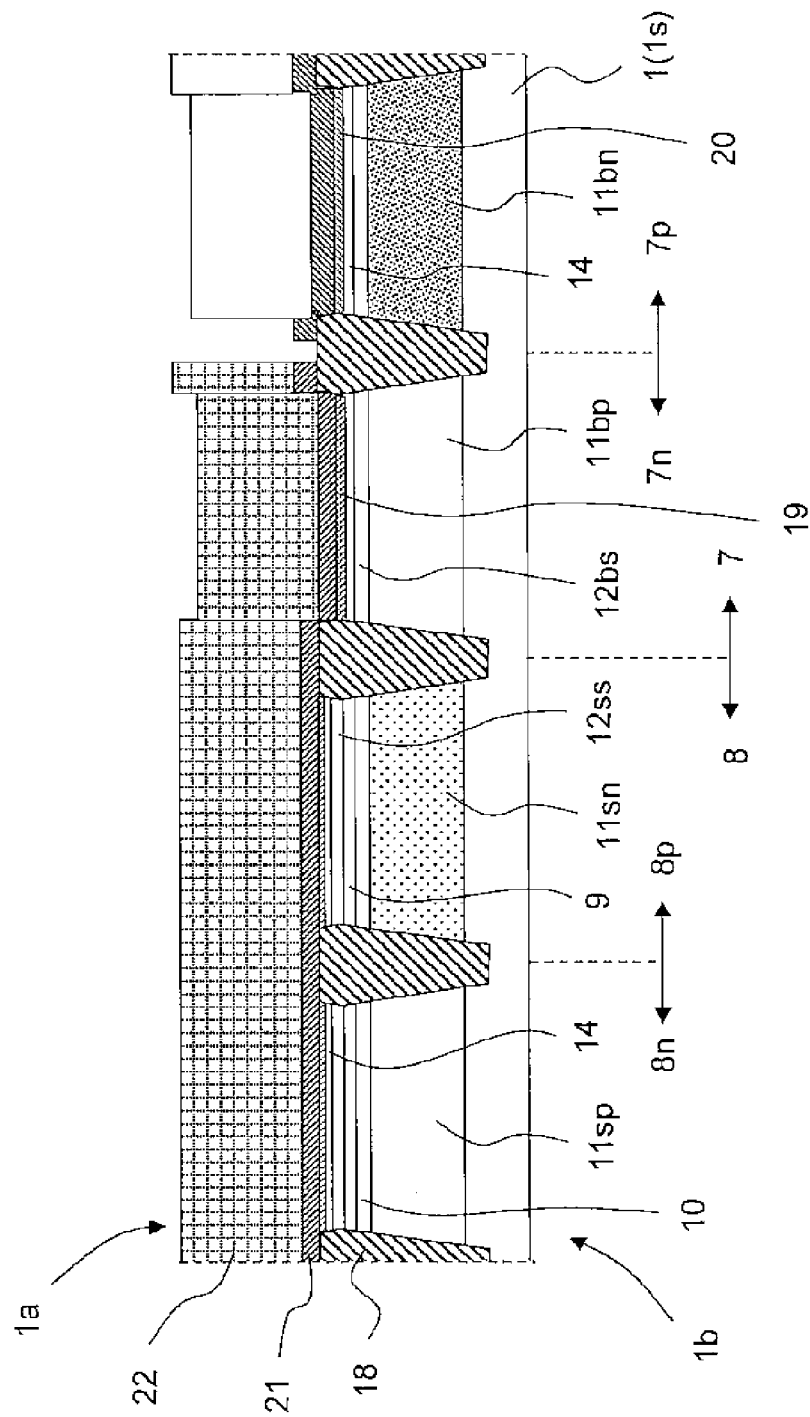
FIG. 14 is a partial sectional view of the wafer (a removal process of an upper titanium nitride film), which explains parts including the essential parts of the manufacturing process of the semiconductor integrated circuit device in the first embodiment of the present application.
Figure 15:
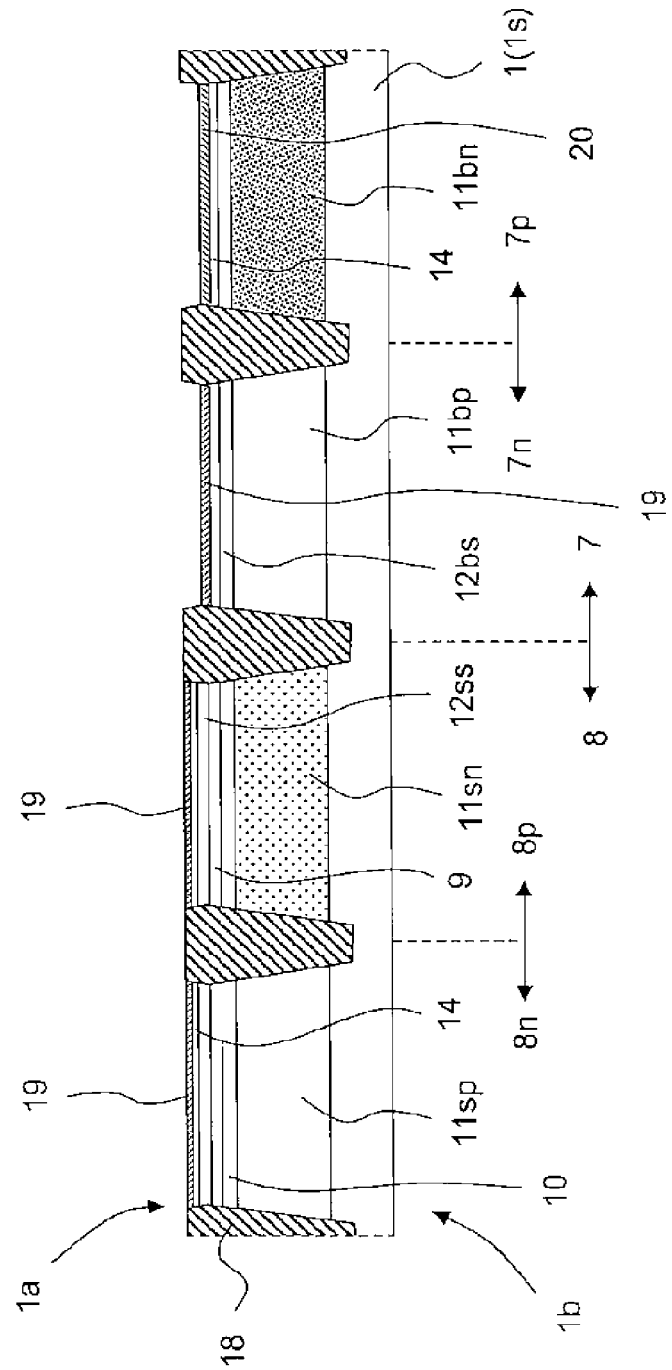
FIG. 15 is a partial sectional view of the wafer (a removal process of a lower titanium nitride film), which explains parts including the essential parts of the manufacturing process of the semiconductor integrated circuit device in the first embodiment of the present application.
Figure 16:
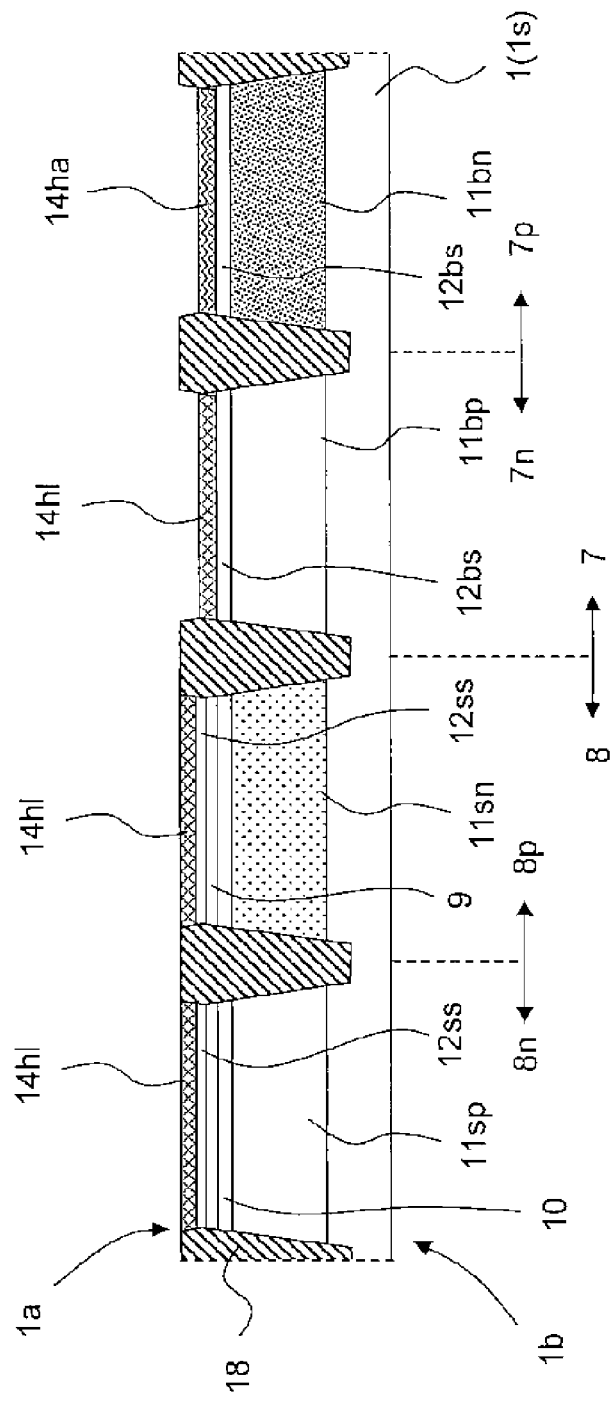
FIG. 16 is a partial sectional view of the wafer (a removal process of the remaining lanthanum film and the aluminum film), which explains parts including the essential parts of the manufacturing process of the semiconductor integrated circuit device in the first embodiment of the present application.
Figure 17:
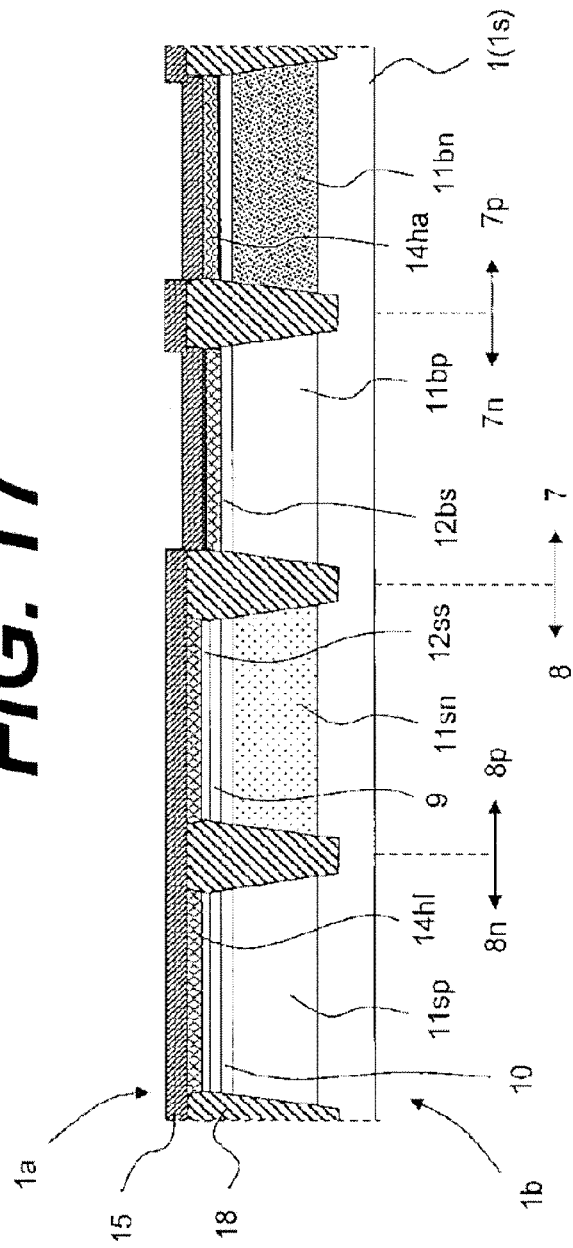
FIG. 17 is a partial sectional view of the wafer (a formation process of an electrode titanium nitride film), which explains parts including the essential parts of the manufacturing process of the semiconductor integrated circuit device in the first embodiment of the present application.
Figure 18:
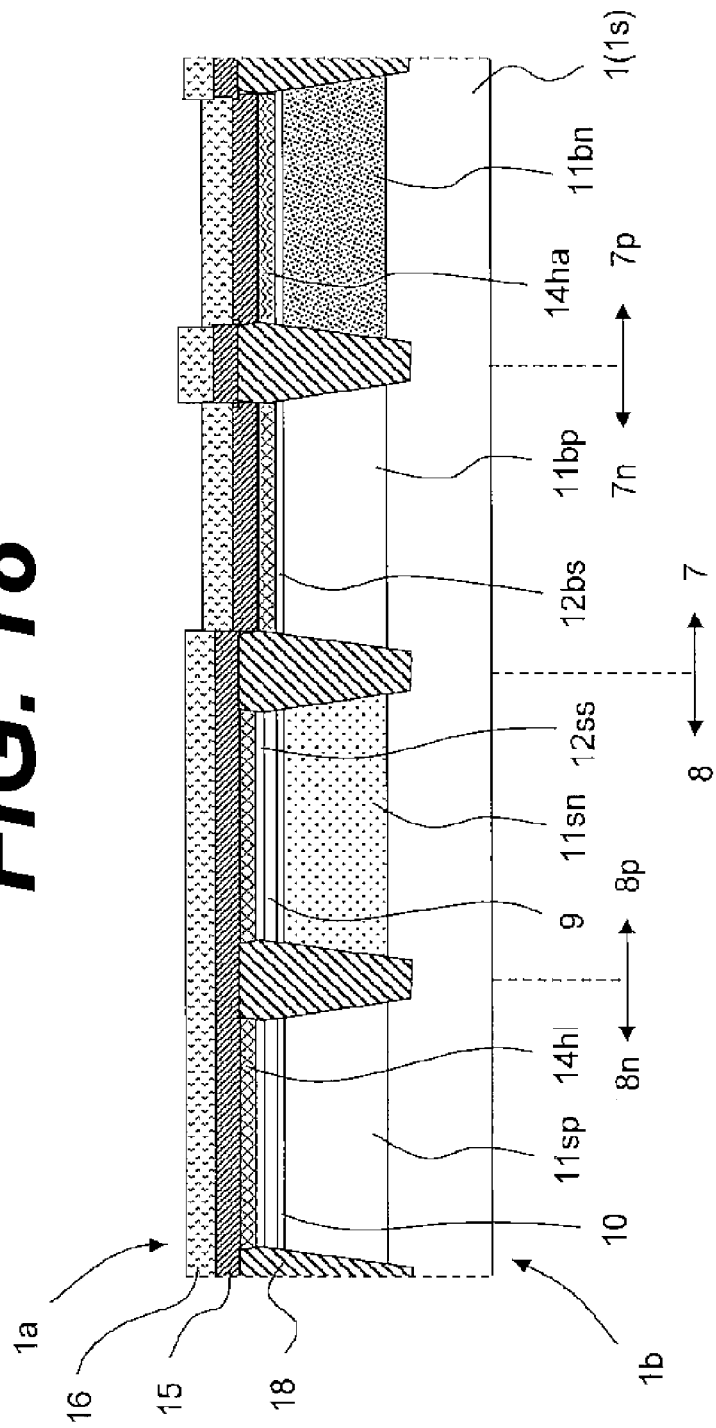
FIG. 18 is a partial sectional view of the wafer (a formation process of an electrode polysilicon film), which explains parts including the essential parts of the manufacturing process of the semiconductor integrated circuit device in the first embodiment of the present application.
Figure 19:
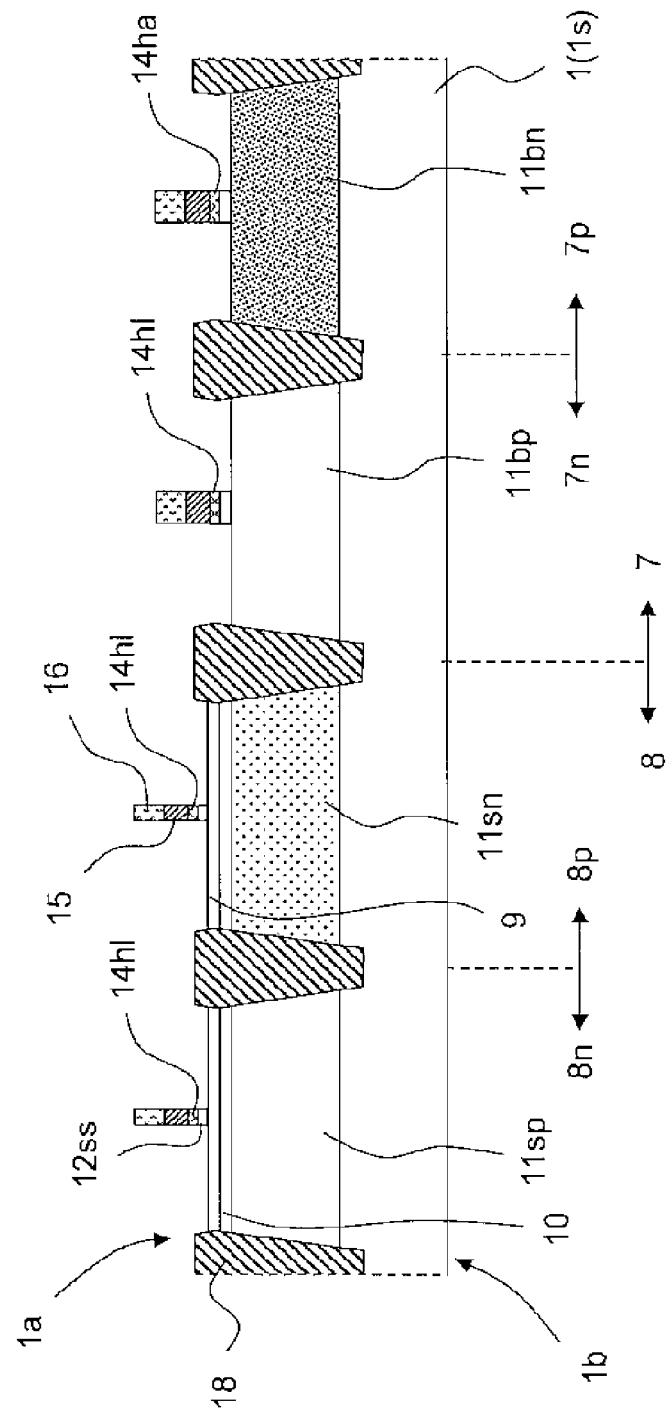
FIG. 19 is a partial sectional view of the wafer (a processing process of a gate electrode), which explains parts including the essential parts of the manufacturing process of the semiconductor integrated circuit device in the first embodiment of the present application.
Figure 20:
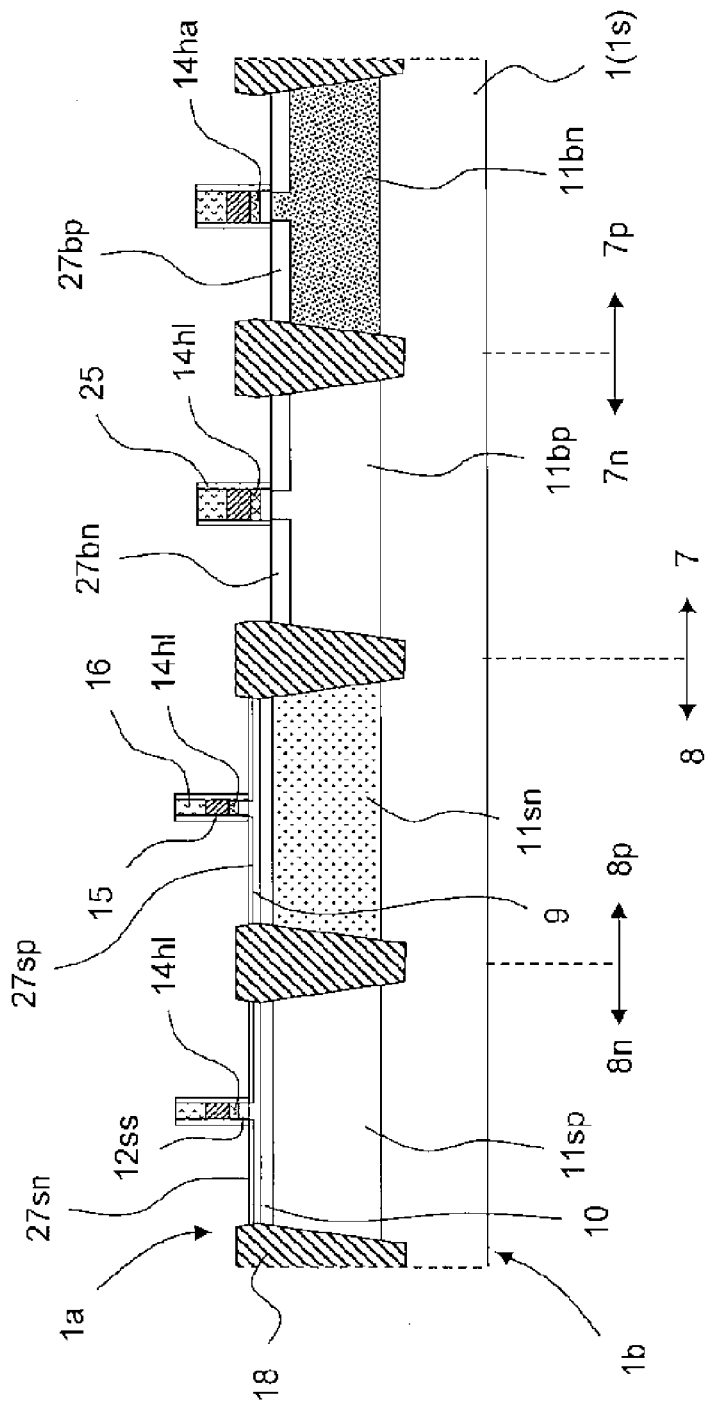
FIG. 20 is a partial sectional view of the wafer (a formation process of an offset spacer), which explains parts including the essential parts of the manufacturing process of the semiconductor integrated circuit device in the first embodiment of the present application.
Figure 21:
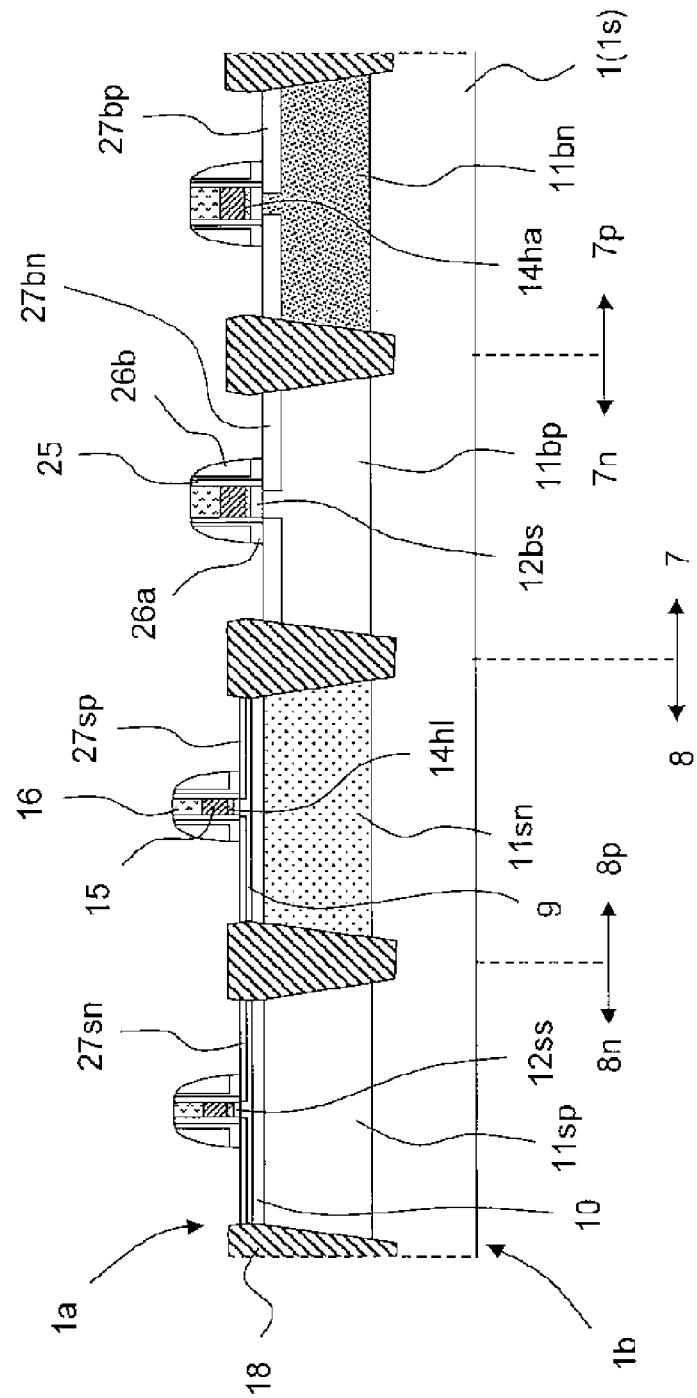
FIG. 21 is a partial sectional view of the wafer (a formation process of a sidewall spacer), which explains parts including the essential parts of the manufacturing process of the semiconductor integrated circuit device in the first embodiment of the present application.
Figure 22:
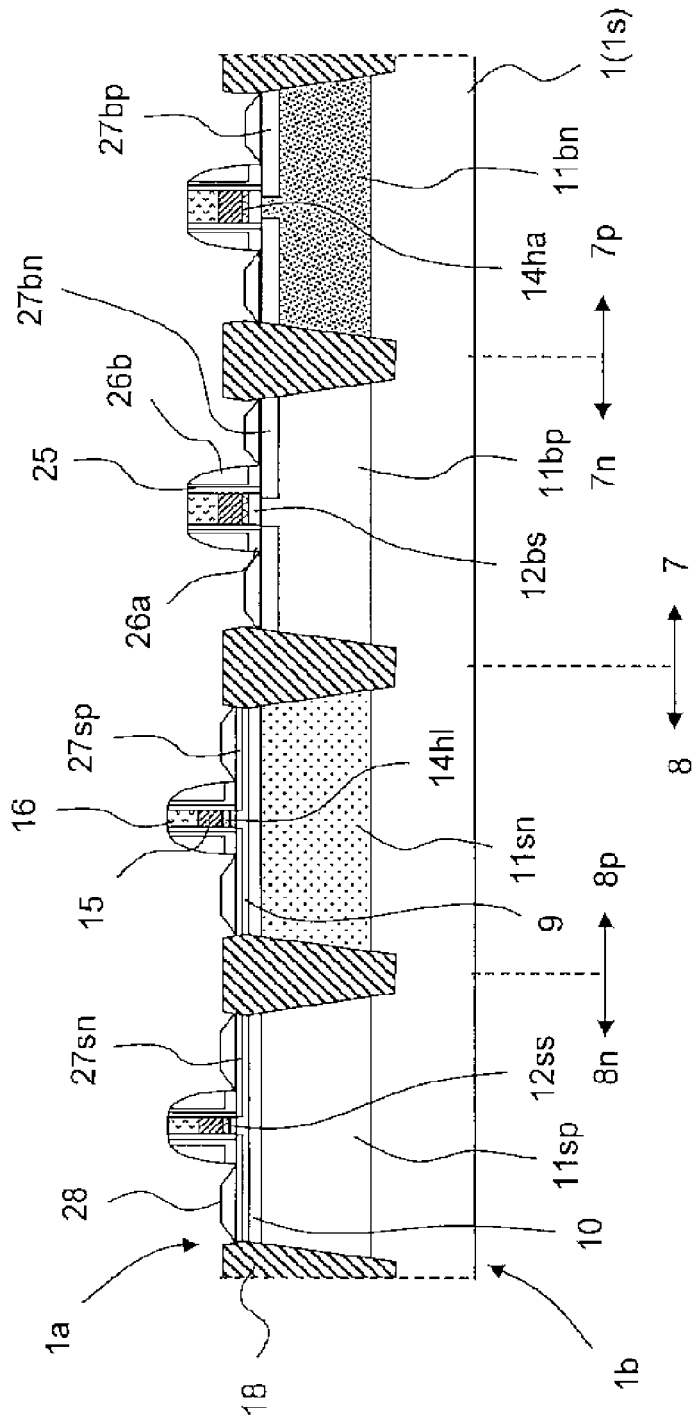
FIG. 22 is a partial sectional view of the wafer (a formation process of an elevated SD), which explains parts including the essential parts of the manufacturing process of the semiconductor integrated circuit device in the first embodiment of the present application.
Figure 23:
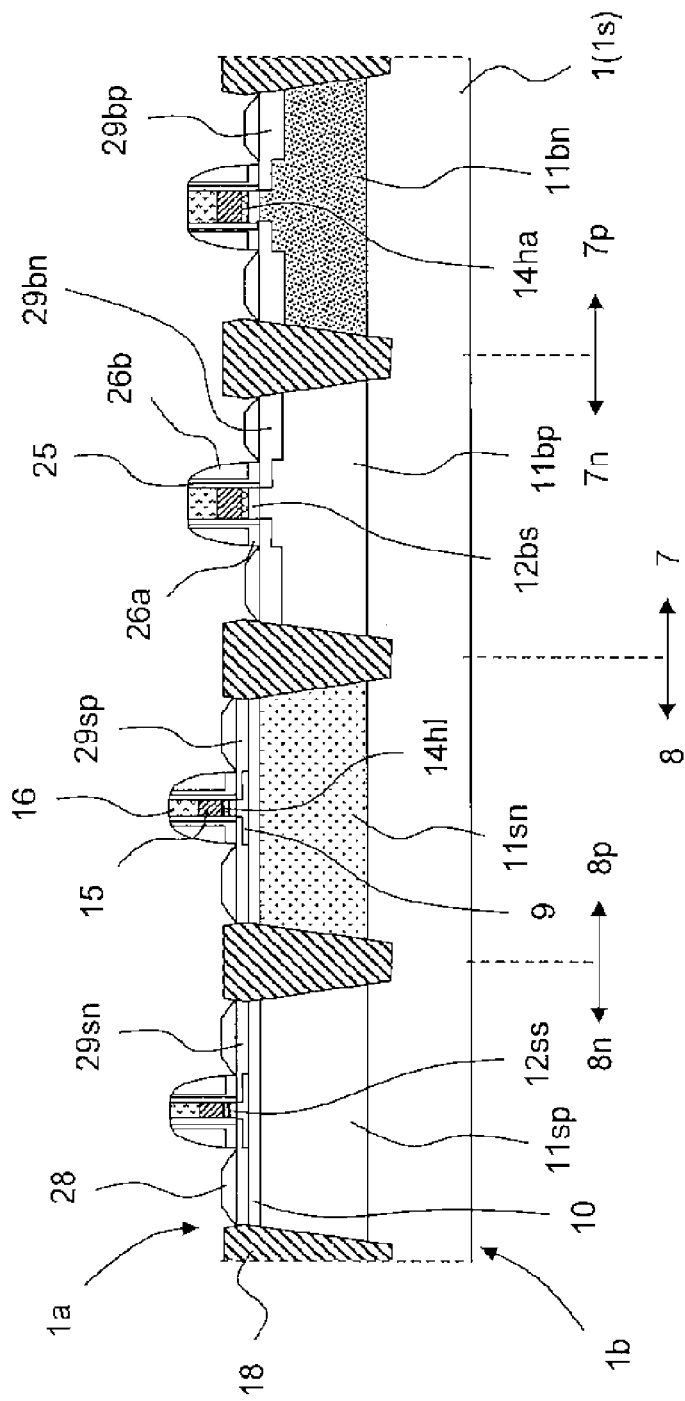
FIG. 23 is a partial sectional view of the wafer (a high-concentration SD), which explains parts including the essential parts of the manufacturing process of the semiconductor integrated circuit device in the first embodiment of the present application.
Figure 24:
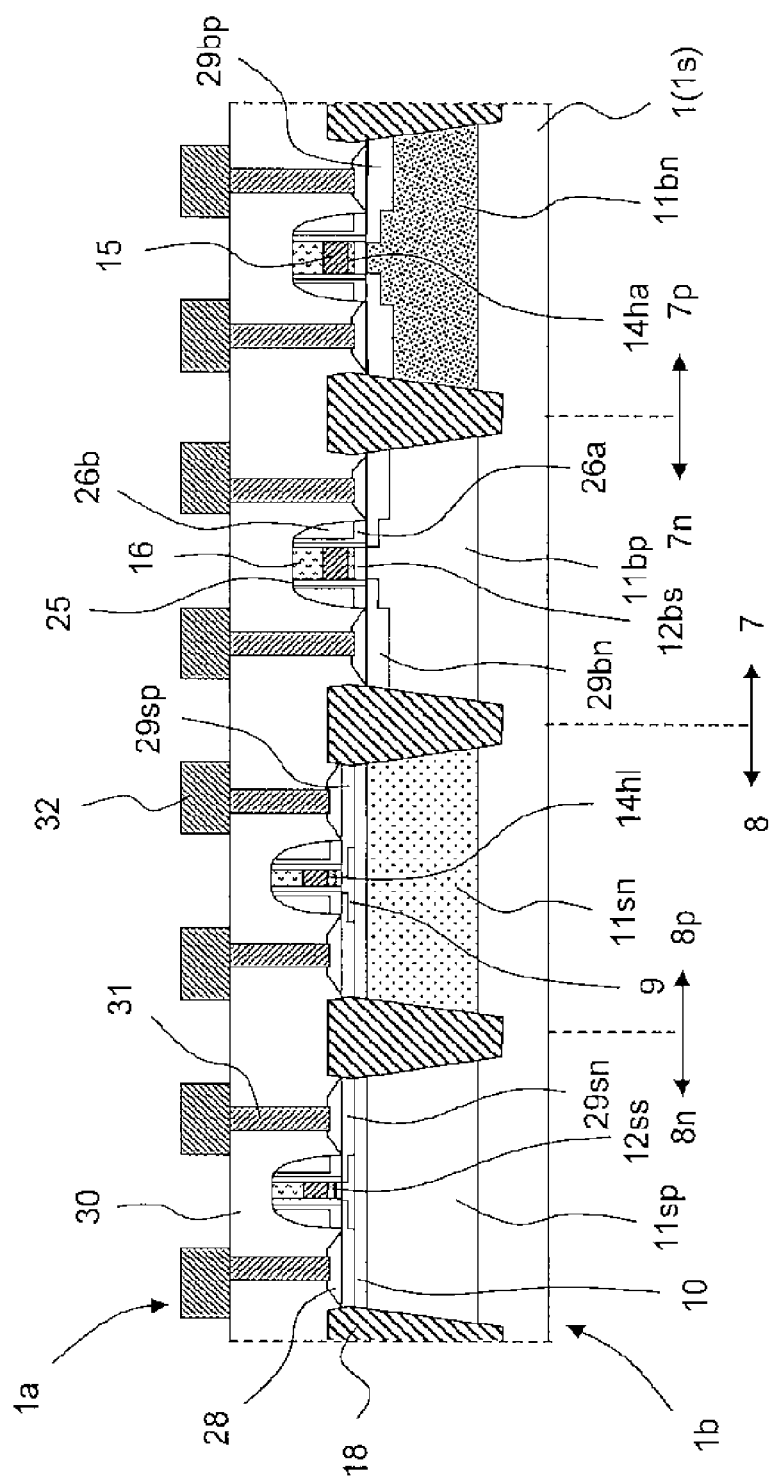
FIG. 24 is a partial sectional view of the wafer (a formation process of a premetal insulating film and other matter), which explains parts including the essential parts of the manufacturing process of the semiconductor integrated circuit device in the first embodiment of the present application.

FIG. 7 is a partial sectional view of the wafer (an introduction process of the back gate well in the SOI region), which explains parts including the essential parts of the manufacturing process of the semiconductor integrated circuit device in the first embodiment of the present application. FIG. 8 is a partial sectional view of the wafer (an introduction process of an N-well in the bulk region), which explains parts including the essential parts of the manufacturing process of the semiconductor integrated circuit device in the first embodiment of the present application. FIG. 9 is a partial sectional view of the wafer (an introduction process of a P-well in the bulk region), which explains parts including the essential parts of the manufacturing process of the semiconductor integrated circuit device in the first embodiment of the present application. FIG. 10 is a partial sectional view of the wafer (a removal process of an SOI layer and a BOX oxide film in the bulk region), which explains parts including the essential parts of the manufacturing process of the semiconductor integrated circuit device in the first embodiment of the present application. FIG. 11 is a partial sectional view of the wafer (an oxidation process of a gate liner), which explains parts including the essential parts of the manufacturing process of the semiconductor integrated circuit device in the first embodiment of the present application. FIG. 12 is a partial sectional view of the wafer (a formation process of a lanthanum film), which explains parts including the essential parts of the manufacturing process of the semiconductor integrated circuit device in the first embodiment of the present application. FIG. 13 is a partial sectional view of the wafer (a formation process of an aluminum film), which explains parts including the essential parts of the manufacturing process of the semiconductor integrated circuit device in the first embodiment of the present application. FIG. 14 is a partial sectional view of the wafer (a removal process of an upper titanium nitride film), which explains parts including the essential parts of the manufacturing process of the semiconductor integrated circuit device in the first embodiment of the present application. FIG. 15 is a partial sectional view of the wafer (a removal process of a lower titanium nitride film), which explains parts including the essential parts of the manufacturing process of the semiconductor integrated circuit device in the first embodiment of the present application. FIG. 16 is a partial sectional view of the wafer (a removal process of the remaining lanthanum film and the aluminum film), which explains parts including the essential parts of the manufacturing process of the semiconductor integrated circuit device in the first embodiment of the present application. FIG. 17 is a partial sectional view of the wafer (a formation process of an electrode titanium nitride film), which explains parts including the essential parts of the manufacturing process of the semiconductor integrated circuit device in the first embodiment of the present application. FIG. 18 is a partial sectional view of the wafer (a formation process of an electrode polysilicon film), which explains parts including the essential parts of the manufacturing process of the semiconductor integrated circuit device in the first embodiment of the present application. FIG. 19 is a partial sectional view of the wafer (a processing process of a gate electrode), which explains parts including the essential parts of the manufacturing process of the semiconductor integrated circuit device in the first embodiment of the present application. FIG. 20 is a partial sectional view of the wafer (a formation process of an offset spacer), which explains parts including the essential parts of the manufacturing process of the semiconductor integrated circuit device in the first embodiment of the present application. FIG. 21 is a partial sectional view of the wafer (a formation process of a sidewall spacer), which explains parts including the essential parts of the manufacturing process of the semiconductor integrated circuit device in the first embodiment of the present application. FIG. 22 is a partial sectional view of the wafer (a formation process of an elevated SD), which explains parts including the essential parts of the manufacturing process of the semiconductor integrated circuit device in the first embodiment of the present application. FIG. 23 is a partial sectional view of the wafer (an introduction process of a high-concentration SD), which explains parts including the essential parts of the manufacturing process of the semiconductor integrated circuit device in the first embodiment of the present application. FIG. 24 is a partial sectional view of the wafer (a formation process of a premetal insulating film and other matter), which explains parts including the essential parts of the manufacturing process of the semiconductor integrated circuit device in the first embodiment of the present application. Based on these figures, the essential parts of the manufacturing process in the semiconductor integrated circuit device in the first embodiment of the present application are explained.

First, the P-type SOI wafer 1 in which the thicknesses of the SOI layer 9 and the BOX oxide film 10 are about 10 nm (About several nanometers to 20 nanometers are appropriate) is prepared. This wafer means the P-type single-crystal silicon wafer (the P-type substrate part is) in which the SOI layer 9 and the BOX oxide film 10 are formed on the nearly whole surface on the device surface 1a (the main surface on the opposite of the back surface 1b) is prepared (see FIG. 7). The diameter of the wafer 1 is 300 φ as an example, but it may also be set to 450 φ, 200 φ, or others as necessary. The resistivity of the P-type substrate part is and the SOI layer 9 may be set to 1 to 10 Ωcm as an example. The plane orientation of the wafer 1 may be set to (100), but may be set to other values.

Next, with reference to FIG. 7, the element isolation region 18, such as STI (Shallow Trench Isolation), is formed on the device surface 1a of the wafer 1. The device surface 1 is divided into the N-channel MISFET region 7n of the bulk peripheral circuit region 7 (bulk region), and the P-channel MISFET region 7p of that, the N-channel MISFET region 8n of the SOI region 8, and the P-channel MISFET region 8p of that.

Subsequently, injecting ion from the side of the device surface 1a of the wafer 1 forms the N-type well (or the P-type well) 11sn (the back gate N-type well) and the P-type well 11sp (the back gate P-type well) of the SOI region 8 sequentially. The conditions of the ion injection depends on the peripheral conditions. For example, in the P-type well, the ion is boron, the injection energy is from about 10 keV to 100 keV, and the dose is from about $1 \times 10^{13}/cm^2$ to $4 \times 10^{13}/cm^2$. In the N-type well, the ion is phosphorus, the injection energy is from about 10 keV to 100 keV, and the dose is from about $1 \times 10^{13}/cm^2$ to $4 \times 10^{13}/cm^2$.

Next, with reference to FIG. 8, injecting ion from the device surface 1a of the wafer 1 forms the N-type well 11bn of the bulk peripheral circuit region 7. An example of conditions of ion injection is as follows: the ion is phosphorus, the injection energy is from about 10 keV to 100 keV, and the dose is from about $1 \times 10^{13}/cm^2$ to $4 \times 10^{13}/cm^2$.

Next, with reference to FIG. 9, injecting ion from the device surface 1a of the wafer 1 forms the P-type well 11bp of the bulk peripheral circuit region 7. An example of conditions of ion injection is as follows: the ion is boron, the injection energy is from about 10 keV to 100 keV, and the dose is from about $1 \times 10^{13}/cm^2$ to $4 \times 10^{13}/cm^2$. When injecting ion into each channel region is necessary to adjust the threshold voltage, this injection method is appropriate. Other injection methods are also possible.

Next, with reference to FIG. 10, dry etching (For example, halogen-based etching gas is used) removes the SOI layer 9 of the bulk region 7.

Subsequently, wet etching (For example, hydrofluoric acid-based etching liquid is used) removes the BOX oxide film 10 of the bulk region 7.

Next, with reference to FIG. 11, thermal oxidation (for example, from about 900 to 1,000 degrees centigrade) forms the bulk region liner gate insulating film 12bs (for example, a silicon oxide film with a thickness of 10 to 20 nm) over the device surface 1a of the bulk region 7 and forms the SOI region liner gate insulating film 12ss (for example, a silicon oxide film with a thickness of from 1 to 3 nm) over the device surface 1a of the SOI region 8.

Next, with reference to FIG. 12, the hafnium oxide-based insulating film 14 (with a thickness of about 1 to 2 nm, for example), such as a hafnium oxide film, is formed over the nearly entire device surface 1a of the wafer 1 as a high-k gate insulating film. An example of the hafnium oxide-based insulating film 14 is a hafnium silicon oxynitride film (HfSiON film). Forming a high-k gate insulating film can use the ALD (Atomic Layer Deposition) method and other methods. An HfON film and an HfO film are also the hafnium oxide-based insulating film 14. In this stage, the HfSiON film, the HfON film, the HfO film are non-doped hafnium oxide-based high-k gate insulating films.

Subsequently, as a threshold voltage adjustment cap film, a lanthanum film 19 (a lanthanum-containing work function modification film) with a thickness of 1 nm thick is formed over the nearly entire hafnium oxide-based insulating film 14 (Instead of the lanthanum film 19, a lanthanum oxide film may be formed). Subsequently, a titanium nitride film 21 (with a thickness of about 10 to 50 nm, for example) is formed over the nearly entire lanthanum film 19 as a metal cap film. Further, a silicon nitride film 22 (with a thickness of about 100 to 300 nm, for example) is formed over the nearly entire titanium nitride film 21 as an antioxidant film.

Next, with reference to FIG. 13, the silicon nitride film 22, the titanium nitride film 21, and the lanthanum film 19 are removed from the device surface 1a of the wafer 1 of the P-channel MISFET region 7p of the bulk peripheral circuit region 7. Wet etching removes the silicon nitride film 22, the titanium nitride film 21, and the lanthanum film 19. Appropriate chemical liquid for this processing includes a hot phosphoric acid (a silicon nitride film), APM (Ammonia Hydroxide/Hydrogen Peroxide Mixture) etching liquid (except for the silicon nitride film), SPM (Sulfuric Acid Hydrogen Peroxide Mixture) etching liquid (except for the silicon nitride film), or HPM (Hydrochloric Acid Hydrogen Peroxide Mixture) etching liquid (except for the silicon nitride film).

Next, an aluminum film 20 (an aluminum-containing work function modification film) with a thickness of about 1 nm is formed over the nearly entire device surface 1a of the wafer 1 as a threshold voltage adjustment cap film (For convenience in the figure, the aluminum film 20 in the region other than the P-channel MISFET region 7p is not shown). Instead of the aluminum film 20, an aluminum oxide film may be formed. Subsequently, a titanium nitride film 23 (with a thickness of about 10 to 50 nm, for example) is formed over the nearly entire aluminum film 20 as a metal cap film. Further, a silicon nitride film 24 (with a thickness of about 100 to 300 nm, for example) is formed over the nearly entire titanium nitride film 23 as an antioxidant film.

Next, with reference to FIG. 14, the titanium nitride film 23 and the silicon nitride film 24 are removed from the entire surface of the SOI region 8 and the N-channel MISFET region 7n of the bulk region 7. Wet etching removes the titanium nitride film 23 and the silicon nitride film 24. Appropriate chemical liquid for this processing includes a hot phosphoric acid (a silicon nitride film), APM (Ammonia Hydroxide/Hydrogen Peroxide Mixture) etching liquid (except for the silicon nitride film), SPM (Sulfuric Acid Hydrogen Peroxide Mixture) etching liquid (except for the silicon nitride film), or HPM (Hydrochloric Acid Hydrogen Peroxide Mixture) etching liquid (except for the silicon nitride film).

In this state, heat treatment (at 780 to 850 degrees centigrade, for example) in an inert atmosphere (in nitrogen gas, for example) proceeds the mutual diffusion between the high-k insulating film and the work function modulation film.

Next, with reference to FIG. 15, the titanium nitride films 21 and 23 and the silicon nitride films 22 and 24 are removed from the device surface 1a of the wafer 1. Wet etching removes the titanium nitride films 21 and 23 and the silicon nitride films 22 and 24. Appropriate chemical liquid for this processing include a hot phosphoric acid (a silicon nitride film), APM (Ammonia Hydroxide/Hydrogen Peroxide Mixture) etching liquid (except for the silicon nitride film), SPM (Sulfuric Acid Hydrogen Peroxide Mixture) etching liquid (except for the silicon nitride film), or HPM (Hydrochloric Acid Hydrogen Peroxide Mixture) etching liquid (except for the silicon nitride film).

Next, with reference to FIG. 16 (See FIG. 15), the remaining lanthanum film 19 and the aluminum film 20 are removed. The hafnium oxide-based insulating film 14 has already become the lanthanum-doped hafnium oxide-based high-k gate insulating film 14h1 and the aluminum-doped hafnium oxide-based high-k gate insulating film 14ha.

Next, with reference to FIG. 17, the titanium nitride film 15 (with a thickness of about 5 to 20 nm, for example) is formed over the nearly entire device surface 1a of the wafer 1 as a metal gate electrode film.

Next, with reference to FIG. 18, the polysilicon film 16 is formed (amorphous silicon film may also be formed) over the nearly entire titanium nitride film 15 as a polysilicon gate electrode film (with a thickness of about 100 to 200 nm, for example). As necessary, ion injection dopes the polysilicon film 16 (For example, the N-channel undergoes high N-type doping and the P-channel undergoes high P-type doping).

Next, with reference to FIG. 19, the usual normal lithography and anisotropic dry etching perform patterning of the gate stack structure. Appropriate gas of anisotropic dry etching includes $SF_6/CF_4$ (polysilicon), $HBr/Cl_2$ (titanium nitride), and $BCl_3/Cl_2$ (high-k insulating film).

Next, with reference to FIG. 20, CVD forms a silicon nitride film (with a thickness of about 3 to 6 nm, for example) over the nearly entire device surface 1a of the wafer 1. Then, etch back by anisotropic dry etching forms an offset spacer 25.

Subsequently, ion injection forms an N-type SOI part source drain extension region 27sn, a P-type SOI part source drain extension region 27sp, an N-type bulk part source drain extension region 27bn, and a P-type bulk part source drain extension region 27bp in order. An example of ion injection conditions for the N-type SOI part source drain extension region 27sn and the N-type bulk part source drain extension region 27bn is as follows: the ion is arsenic, the injection energy is about 2 keV, and the dose is from about $2\times10^{14}/cm^2$ to $8\times10^{14}/cm^2$. An example of ion injection conditions for the P-type SOI part source drain extension region 27sp and the P-type bulk part source drain extension region 27bp is as follows: the ion is boron, the injection energy is about 0.5 keV, and the dose is from about $2\times10^{14}/cm^2$ to $8\times10^{14}/cm^2$.

Next, with reference to FIG. 21, CVD forms a silicon oxide sidewall spacer film (with a thickness of about 5 to 10 nm, for example) and a silicon nitride sidewall spacer film (with a thickness of about 10 to 30 nm, for example) sequentially. Etch back by anisotropic dry etching (using fluorocarbon etching gas, for example) forms a silicon oxide sidewall spacer 26a and a silicon nitride sidewall spacer 26b.

Next, with reference to FIG. 22, a selective epitaxy silicon layer 28 (an elevated SD layer) is formed (with a thickness of about 20 to 60 nm, for example) over the surface of each source drain region.

Next, with reference to FIG. 23, introducing each high-concentration region source drain region by ion injection forms the N-type SOI part source drain region 29sn, the P-type SOI part source drain region 29sp, the N-type bulk part source drain region 29bn, the P-type bulk part source drain region 29bp, and other regions, and other regions. An example of ion injection conditions for the high-concentration region source drain regions of the N-type SOT part source drain region 29sn and the N-type bulk part source drain region 29bn is as follows: the ion is arsenic, the injection energy is about 20 keV, and the dose is about $4\times10^{15}/cm^2$. An example of ion injection conditions for the high-concentration region source drain regions of the P-type SOT part source drain region 29sp and the P-type bulk part source drain region 29bp is as follows: the ion is boron, the injection energy is about 2 keV, and the dose is about $4\times10^{15}/cm^2$.

Further, a nickel-based silicide film is formed on each elevated SD layer and the gate polysilicon film 16 as necessary.

Next, with reference to FIG. 24, plasma CVD forms a premetal insulating film 30 including a comparatively thin silicon nitride film and a comparatively thick silicon oxide-based insulating film on the nearly entire surface over the device surface 1a of the wafer 1. Subsequently, anisotropic dry etching forms a contact hole and embeds a tungsten plug 31 in the hole. Further, a first wiring layer 32 is formed over the premetal insulating film 30. The wiring may be embedded or not embedded. Wiring is formed in, for example, three layers to ten and something layers as necessary.

When the wiring process is completed, dicing splits up the wafer into the chips 2.

6. Explanation of a gate stack structure 2 (P-channel non-doped gate) in a semiconductor integrated circuit device in a second embodiment of the present application (mainly FIG. 25): The gate stack structure to be explained in this section is a modified example of that in FIG. 6. The manufacturing method is nearly the same as that explained in section 5. Its explanation is not repeated (this also applies to the following other examples).

Figure 25:
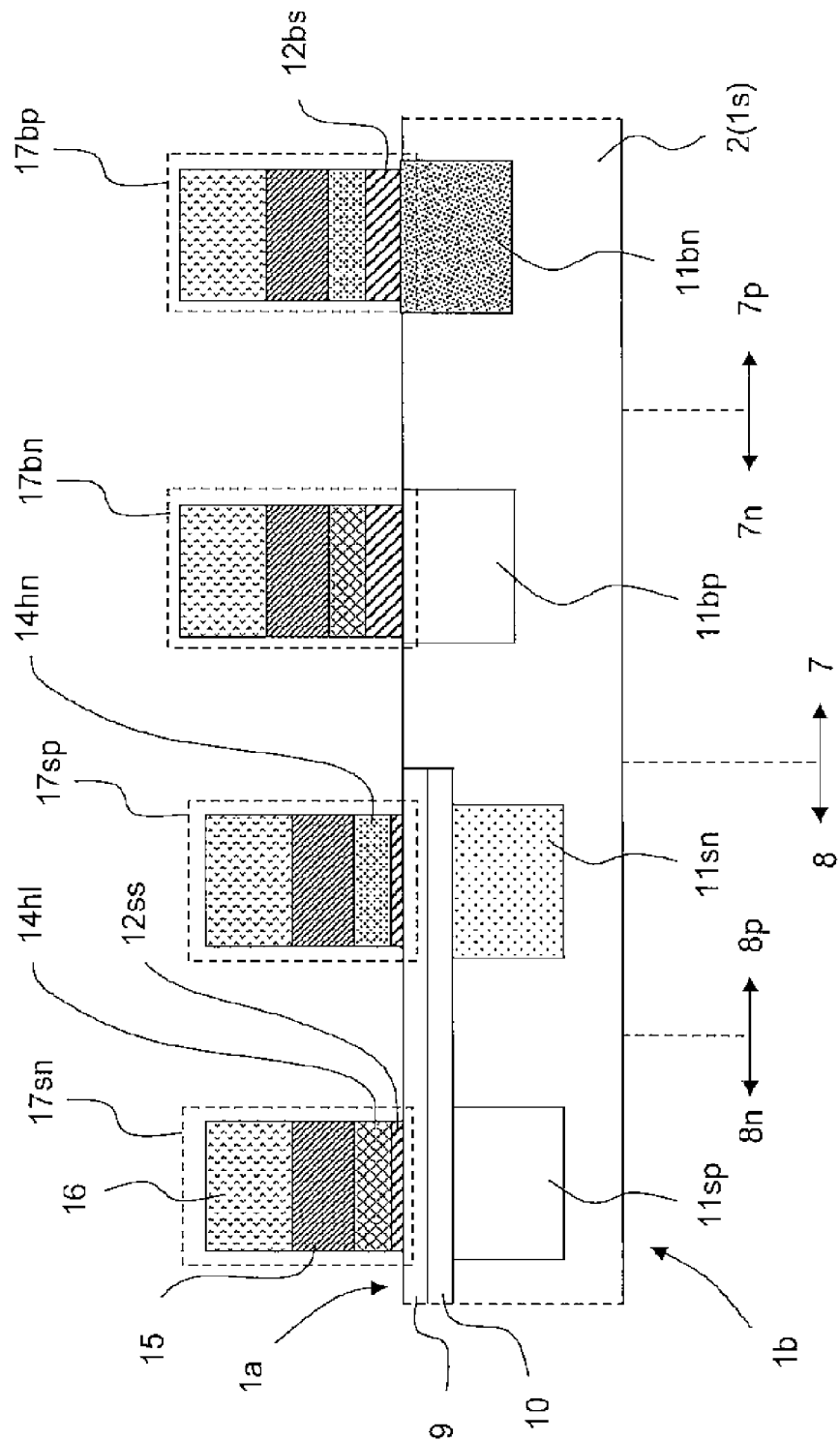
FIG. 25 is a schematic sectional view of a gate stack and the substrate showing a gate stack structure 2 (a non-doped gate at a P-channel) in a semiconductor integrated circuit device in a second embodiment of the present application.

FIG. 25 is a schematic sectional view of a gate stack and a substrate showing a gate stack structure 2 (P-channel non-doped gate) in a semiconductor integrated circuit device in a second embodiment of the present application. Based on this, the gate stack structure 2 (P-channel non-doped gate) in the semiconductor integrated circuit device in the second embodiment of the present application is explained.

With reference to FIG. 25, unlike FIG. 6, the high-k gate insulating film of the bulk P-channel MISFET gate stack 17 by and the P-channel MISFET gate stack 17sp of the SOI region (the high-k gate insulating film of the P-channel MISFET gate stack) has turned into a non-doped hafnium oxide-based high-k gate insulating film 14 hn.

Here, the absolute value of the threshold voltage of the P-channel MISFET of the SOI region 8 increases due to heat treatment because it is non-doped. The absolute value can be appropriately reduced by adjusting the amount of impurities introduced into the back gate (the P-type MISFET back gate impurity-doped semiconductor region 11sn) (the absolute value of the threshold voltage is reduced by increasing the dose of the P-type impurities or decreasing the dose of the N-type impurities), applying a forward bias, adjusting the amount of impurities introduced into the channel region, or combining these methods.

The range of the effective work function of each target gate stack (gate electrode) is as follows: the bulk N-channel MISFET gate stack 17bn is about 4.2 to 4.6 eV, the bulk P-channel MISFET gate stack 17bp is about 4.5 to 4.8 eV, the N-channel MISFET gate stack 17sn of the SOI region is about 4.2 to 4.6 eV, and the P-channel MISFET gate stack 17sp of the SOI region is about 4.5 to 4.8 eV.

The combination of the gate stack structures has the following merit. (1) In the bulk region 7 and the SOI region 8 (this merit is effective also in a chip including only the SOI region), the number of kinds of threshold adjustment film to the gate stack structure is one. This can avoid repetition of complicated processing. Also, this can reduce damage to the lower layer part in the gate stack structure for the same reason.

Instead of arranging the threshold voltage adjustment film (all the N-channel MISFET gate stacks are doped with lanthanum and others are non-doped) as shown here, all the high-k gate insulating films of the N-channel MISFET gate stacks may be non-doped and all the high-k gate insulating films of the P-channel MISFET gate stacks with aluminum may be doped. The threshold voltage of both the P-channel MISFETs is easily controlled.

7. Explanation of a gate stack structure 3 (bulk non-high-k gate) in a semiconductor integrated circuit device in a third embodiment of the present application (mainly FIG. 26): The gate stack structure to be explained in this section is a modified example of that in FIG. 6.

Figure 26:
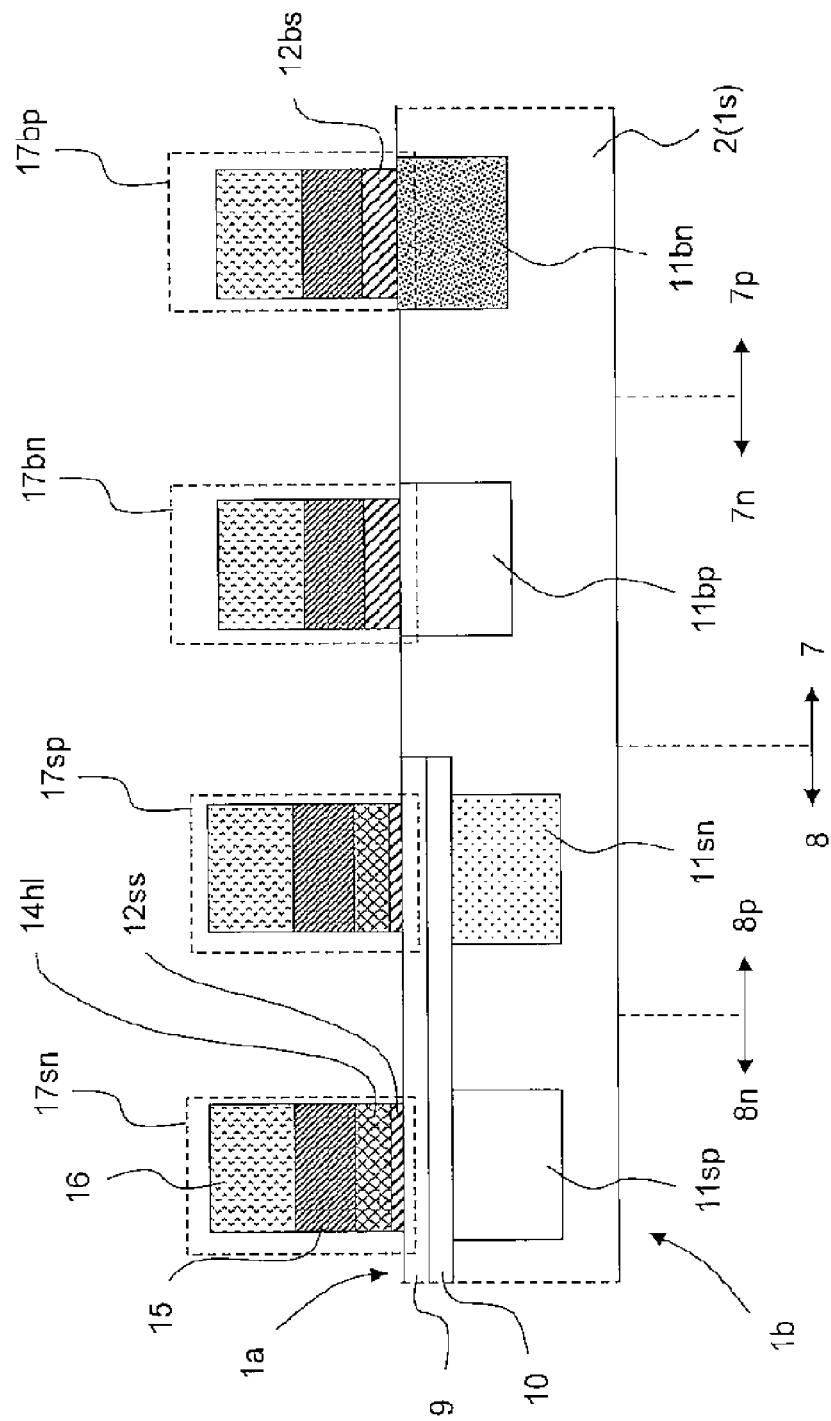
FIG. 26 is a schematic sectional view of a gate stack and a substrate showing a gate stack structure 3 (a non-high-k gate in the bulk region) in a semiconductor integrated circuit device in a third embodiment of the present application.

FIG. 26 is a schematic sectional view of a gate stack and a substrate showing a gate stack structure 3 (bulk non-high-k gate) in a semiconductor integrated circuit device in a third embodiment of the present application. Based on this, the gate stack structure 3 (bulk non-high-k gate) in the semiconductor integrated circuit device in the third embodiment of the present application is explained.

With reference to FIG. 26, unlike FIG. 6, the high-k gate insulating film of the bulk N-channel MISFET gate stack 17 bn and the bulk P-channel MISFET gate stack 17bp (the high-k gate insulating film of the bulk MISFET gate stack) is not provided.

The absolute value of the threshold voltage of the P-channel MISFET of the SOI region 8 increases due to the influence of doping by lanthanum. This absolute value can be appropriately reduced by adjusting the amount of impurities introduced into the back gate (the P-type MISFET back gate impurity-doped semiconductor region 11sn) (the absolute value of the threshold voltage is reduced by increasing the dose of the P-type impurities or decreasing the dose of the N-type impurities), applying a forward bias, adjusting the amount of impurities introduced into the channel region, or combining these methods.

The absolute value of the threshold voltage of each channel MISFET of the bulk region 7 does not increase abnormally due to heat treatment because of the nonexistence of the high-k gate insulating film. The absolute value can be controlled by the normal method, such as adjustment of the amount of impurities introduced into the channel region.

The range of the effective work function of each target gate stack (gate electrode) is as follows: the bulk N-channel MISFET gate stack 17bn is about 4.35 to 4.85 eV, the bulk P-channel MISFET gate stack 17bp is about 4.35 to 4.85 eV, the N-channel MISFET gate stack 17sn of the SOI region is about 4.2 to 4.6 eV, and the P-channel MISFET gate stack 17sp of the SOI region is about 4.5 to 4.8 eV.

The combination of the gate stack structures has the following merits. (1) In the bulk region 7 and the SOI region 8 (this merit is effective also in a chip including only the SOI region), the number of kinds of threshold adjustment film to the gate stack structure is one. This can avoid repetition of complicated processing. Also, This can reduce damage to the lower layer part in the gate stack structure for the same reason (improvement in reliability). (2) In the bulk region 7, there is no high-k gate insulation film. This can improve the channel mobility of MISFET of the bulk region 7.

Instead of arranging the threshold voltage adjustment film (all the MISFET gate stacks of the SOI region are doped with lanthanum and others are set as non-high-k insulating films) as shown here, all the high-k gate insulating films of the MISFET gate stacks of the SOI region may be doped and all the MISFET gate stacks of the bulk region may be set as the non-high-k gate insulating films. The threshold voltage of the P-channel MISFET of the SOI region can be easily controlled.

8. Explanation of a gate stack structure 4 (different kind doped gate) in a semiconductor integrated circuit device in a fourth embodiment of the present application (mainly FIG. 27): The gate stack structure to be explained in this section is a modified example of that in FIG. 25 (or FIG. 6).

Figure 27:
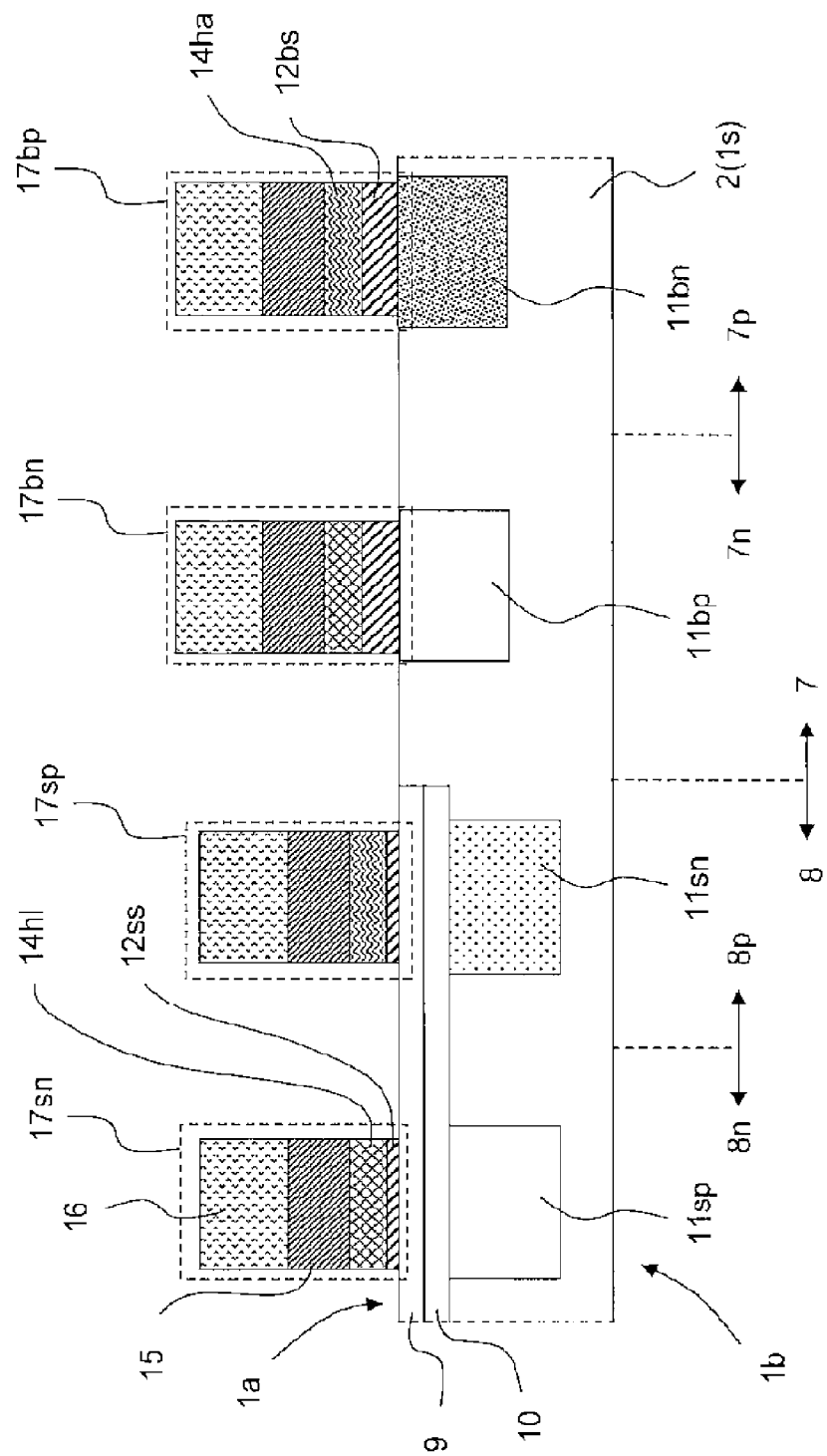
FIG. 27 is a schematic sectional view of a gate stack and a substrate showing a gate stack structure 4 (a heterogeneous doped gate) in a semiconductor integrated circuit device in a fourth embodiment of the present application.

FIG. 27 is a schematic sectional view of a gate stack and a substrate showing a gate stack structure 4 (heterogeneous doped gate) in a semiconductor integrated circuit device in a fourth embodiment of the present application. Based on this, the gate stack structure 4 (different kind doped gate) in the semiconductor integrated circuit device in the fourth embodiment of the present application is explained.

With reference to FIG. 27, unlike FIG. 25, the high-k gate insulating film of the bulk P-channel MISFET gate stack 17 by and the P-channel MISFET gate stack 17sp of the SOI region (the high-k gate insulating film of the P-channel MISFET gate stack) is doped with aluminum.

The range of the effective work function of each target gate stack (gate electrode) is as follows. the bulk N-channel MISFET gate stack 17bn is about 4.2 to 4.6 eV, the bulk P-channel MISFET gate stack 17bp is about 4.5 to 4.8 eV, the N-channel MISFET gate stack 17sn of the SOI region is about 4.2 to 4.6 eV, and the P-channel MISFET gate stack 17sp of the SOI region is about 4.5 to 4.8 eV.

The combination of the gate stack structures has the following merits. (1) In the bulk region 7 and the SOI region 8, impurities for doping to adjust the threshold differ between the N-channel MISFET and the P-channel MISFET. This allows to easily control the threshold voltage. (2) Further, the threshold voltage can be controlled by selecting the amount of doping to the back well and the conductivity type. This allows to easily control the threshold voltage further (this merit is effective also in a chip including only the SOI region).

9. Explanation of a gate stack structure 5 (SOI non-doped gate) in a semiconductor integrated circuit device in a fifth embodiment of the present application (mainly FIG. 28): The gate stack structure to be explained in this section is a modified example of that in FIG. 6.

Figure 28:
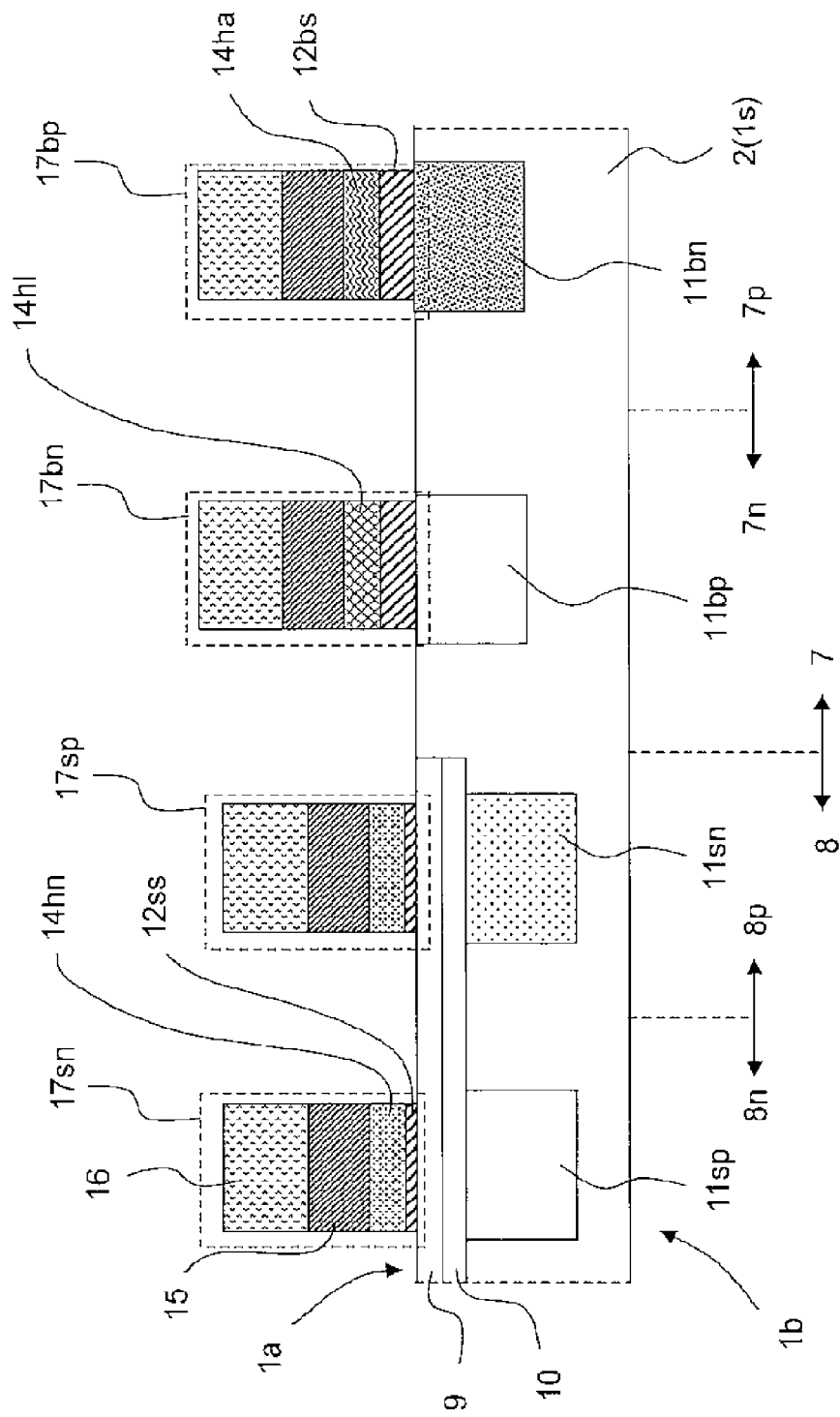
FIG. 28 is a schematic sectional view of a gate stack and a substrate showing agate stack structure 5 (a non-doped gate in the SOI region) in a semiconductor integrated circuit device in a fifth embodiment of the present application.

FIG. 28 is a schematic sectional view of a gate stack and a substrate showing a gate stack structure 5 (SOI non-doped gate) in a semiconductor integrated circuit device in a fifth embodiment of the present application. Based on this, the gate stack structure 5 (SOI non-doped gate) in the semiconductor integrated circuit device in the fifth embodiment of the present application is explained.

With reference to FIG. 28, unlike FIG. 6, the high-k gate insulating film of the N-channel MISFET gate stack 17 sn of the SOI region and the P-channel MISFET gate stack 17sp of the SOI region (the high-k gate insulating film of the SOI-type MISFET gate stack) has turned into the non-doped hafnium oxide-based high-k gate insulating film 14 hn.

The absolute value of the threshold voltage of each MISFET of the SOI region 8 increases due to heat treatment because it is non-doped. The absolute value can be appropriately reduced by adjusting the amount of impurities introduced into the back gate (the N-type MISFET back gate impurity-doped semiconductor region and the P-type MISFET back gate impurity-doped semiconductor region 11sn) (the absolute value of the threshold voltage is reduced by increasing the dose of the P-type impurities or decreasing the dose of the N-type impurities), applying a forward bias, adjusting the amount of impurities introduced into the channel region, or combining these methods.

The range of the effective work function of each target gate stack (gate electrode) is as follows: the bulk N-channel MISFET gate stack 17bn is about 4.2 to 4.6 eV, the bulk P-channel MISFET gate stack 17bp is about 4.6 to 4.9 eV, the N-channel MISFET gate stack 17sn of the SOI region is about 4.35 to 4.85 eV, and the P-channel MISFET gate stack 17sp of the SOI region is about 4.35 to 4.85 eV.

The combination of the gate stack structures has the following merits. (1) In the SOI region 8 (this merit is effective also in a chip including only the SOI region), no threshold adjustment film to the gate stack structure exists. This can avoid repetition of complicated processing. Also, this can reduce damage to the lower layer part in the gate stack structure for the same reason (improvement in reliability). (2) Further, the threshold voltage can be controlled by selecting the amount of doping to the back well and the conductivity type. This allows comparatively easily control the threshold voltage for the same reason (this merit is effective also in a chip including only the SOI region).

10. Explanation of essential parts and a device structure etc. of a modified example (gate last scheme) of a manufacturing process for a semiconductor integrated circuit device in an embodiment of the present application (mainly FIG. 30 to FIG. 43): The manufacturing process explained in section 5 adopts the gate first scheme, but the same devices (those explained in sections 1 to 9 etc.) can be manufactured also by the gate last scheme. In the present section, an example of a process adopting the gate last scheme adapted to the invention of the present application and an example of a device adapted to the gate last scheme are explained.

Figure 42:
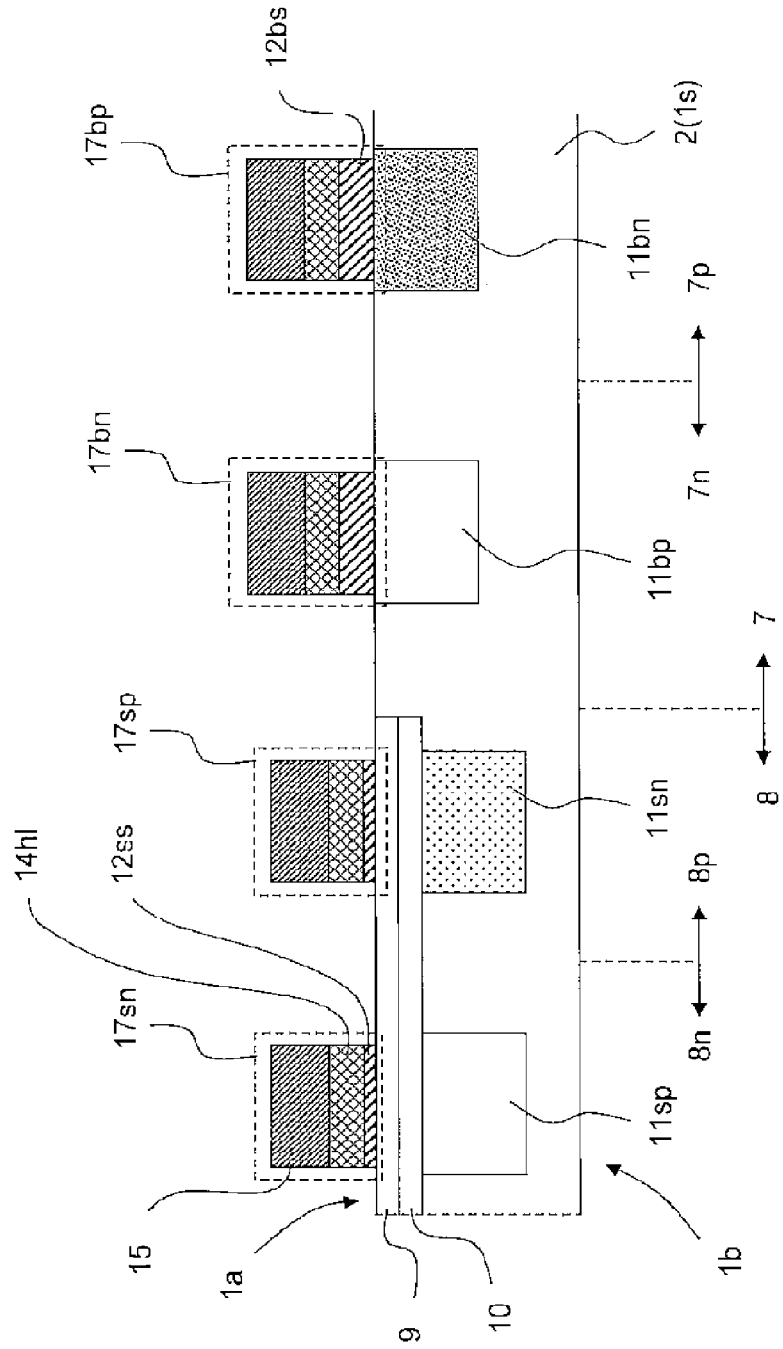
FIG. 42 is a schematic sectional view of a gate stack and a substrate showing the modified example 1 (the insulating film of the common lanthanum-doped gate) of the gate stack structure adapted to a gate last scheme, which is a modified example of the manufacturing process of the semiconductor integrated circuit device in an embodiment of the present application.

(1) Explanation of a modified example 1 (generally common lanthanum-doped gate insulating film) of a gate stack structure adapted to the gate last scheme, which is a modified example of the manufacturing process for the semiconductor integrated circuit device in the embodiment of the present application (mainly FIG. 42) FIG. 42 is a schematic sectional view of a gate stack and a substrate showing a modified example 1 (common lanthanum-doped gate insulating film) of the gate stack structure adapted to the gate last scheme, which is a modified example of the manufacturing process for the semiconductor integrated circuit device in the embodiment of the present application. Based on this, the modified example 1 (common lanthanum-doped gate insulating film) of the gate stack structure adapted to the gate last scheme, which is a modified example of the manufacturing process for the semiconductor integrated circuit device in the embodiment of the present application is explained.

FIG. 42 is basically the same as FIG. 6, but differs in that the bulk P-channel MISFET gate stack 17bp is also doped with lanthanum.

The absolute value of the threshold voltage of the P-channel MISFET of the SOI region 8 and the bulk region 7 increases due to the influence of doping of lanthanum. The absolute value can be appropriately reduced by adjusting the amount of impurities introduced into the back gate (the P-type MISFET back gate impurity-doped semiconductor region 11sn) (the absolute value of the threshold voltage is reduced by increasing the dose of the P-type impurities or decreasing the dose of the N-type impurities), applying a forward bias, adjusting the amount of impurities introduced into the channel region, or combining these methods.

The range of the effective work function of each target gate stack (gate electrode) is as follows: the bulk N-channel MISFET gate stack 17bn is about 4.2 to 4.6 eV, the bulk P-channel MISFET gate stack 17bp is about 4.7 to 5.0 eV, the N-channel MISFET gate stack 17sn of the SOI region is about 4.2 to 4.6 eV, and the P-channel MISFET gate stack 17sp of the SOI region is about 4.7 to 5.0 eV.

The combination of the gate stack structures has the following merits. (1) The gate stack structure in the SOI region 8 and the bulk region 7 is common. This can avoid repetition of complicated processing. Also, this can reduce damage to the lower layer part in the gate stack structure for the same reason (this merit is effective also in a chip including only the SOI region). (2) In the bulk region 7 and the SOI region 8, MISFET can be configured by one kind of gate stack structure in all the regions except for the thickness of the silicon oxide-based liner gate insulating films 12bs and 12ss. This can considerably simplify the process. (3) Compared to the gate first scheme, the burden of thermal processing at high temperature is small. This improves the reliability of the gate insulating film.

Instead of arranging the threshold voltage adjustment film (all the gate stacks are doped with lanthanum) as shown here, the aluminum-based threshold voltage adjustment film (aluminum-containing work function modulation film) can be applied to all the gate stacks. This easily controls the threshold voltage of the P-channel MISFET (Qsp) and the bulk P-channel MISFET (Qbp).

(2) Explanation of the essential parts of the manufacturing process adapted to the modified example 1 (generally common lanthanum-doped gate insulating film) of the gate stack structure (mainly FIG. 30 to FIG. 40): In this subsection, the process to form the threshold voltage adjustment film after removing the dummy gate polysilicon is specifically explained (Vth adjustment after dummy gate removal scheme). This can also be applied to the high-k first metal gate last scheme, in which the gate insulating film is completed when the dummy gate is formed, and the classical replacement gate scheme, in which the high-k gate insulating film is formed after the dummy gate polysilicon is removed.

Figure 30:
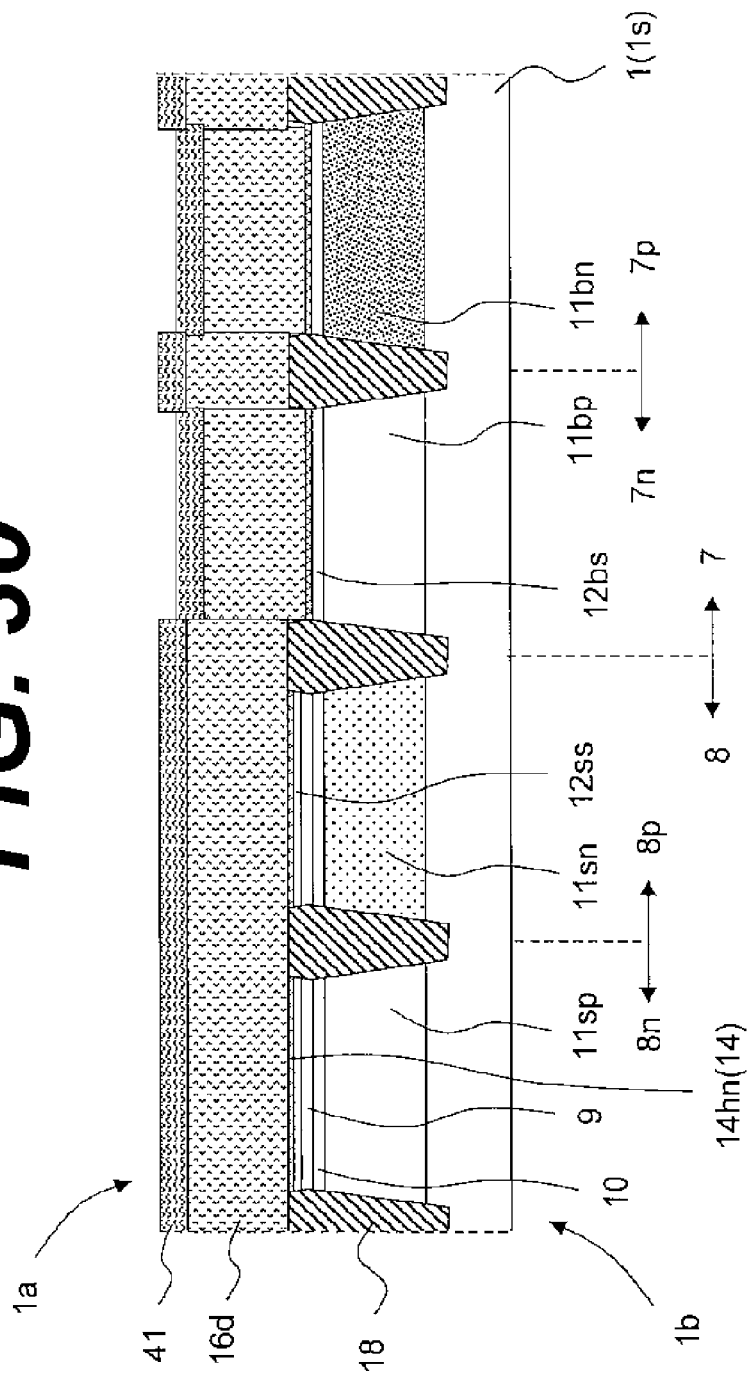
FIG. 30 is a partial sectional view of the wafer (a deposition process of dummy material), which explains parts including the essential parts of a manufacturing process adapted to a modified example 1 (an insulating film of a common lanthanum-doped gate) of a gate stack structure.
Figure 31:
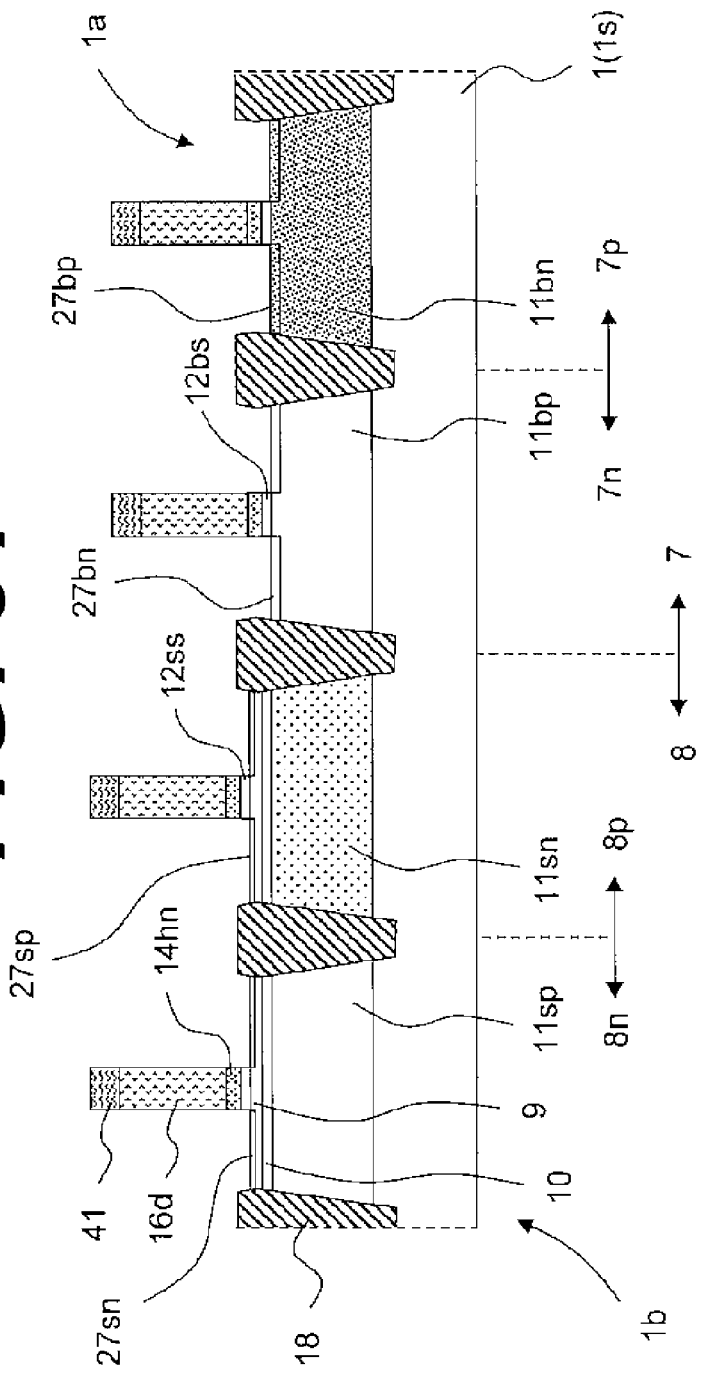
FIG. 31 is a partial sectional view of the wafer (an introduction process of dummy gate patterning and an extension region), which explains parts including the essential parts of the manufacturing process adapted to the modified example 1 (the insulating film of the common lanthanum-doped gate) of the gate stack structure.
Figure 32:
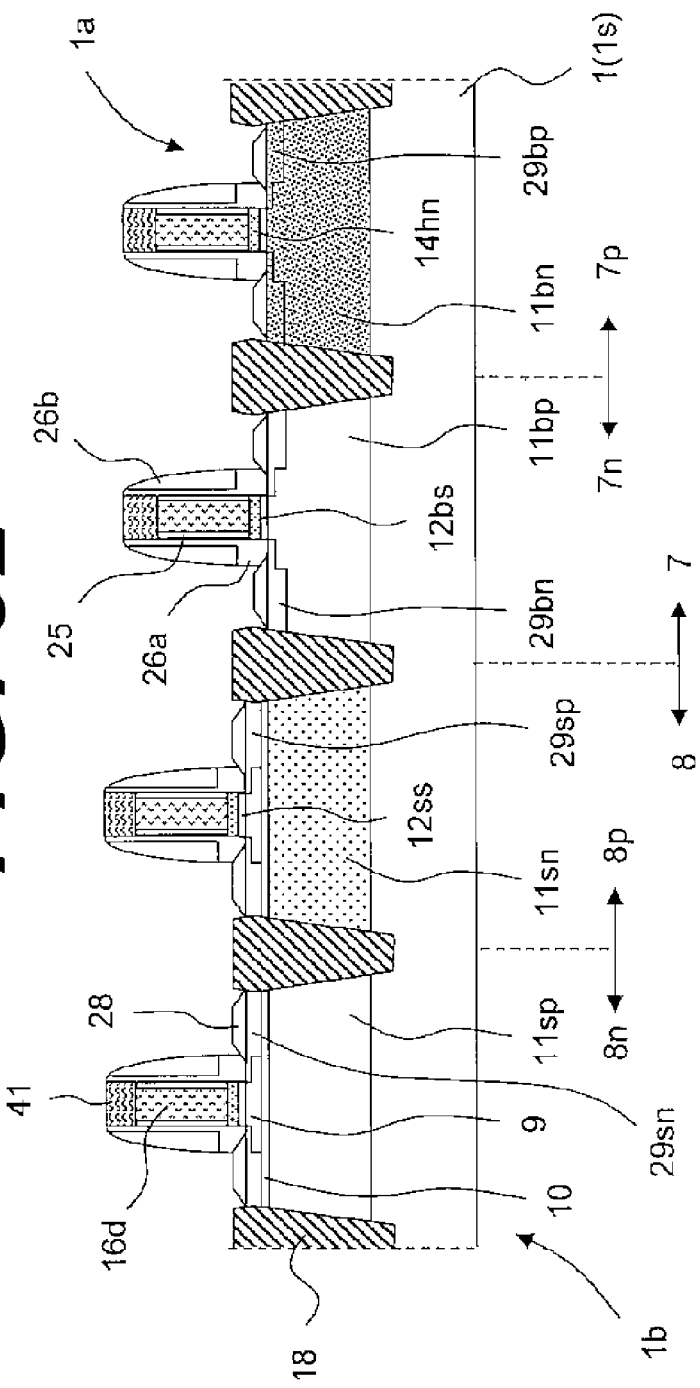
FIG. 32 is a partial sectional view of the wafer (formation processes of sidewalls and elevated source drain and an introduction process of source drain impurity), which explains parts including the essential parts of the manufacturing process adapted to the modified example 1 (the insulating film of the common lanthanum-doped gate) of the gate stack structure.
Figure 33:
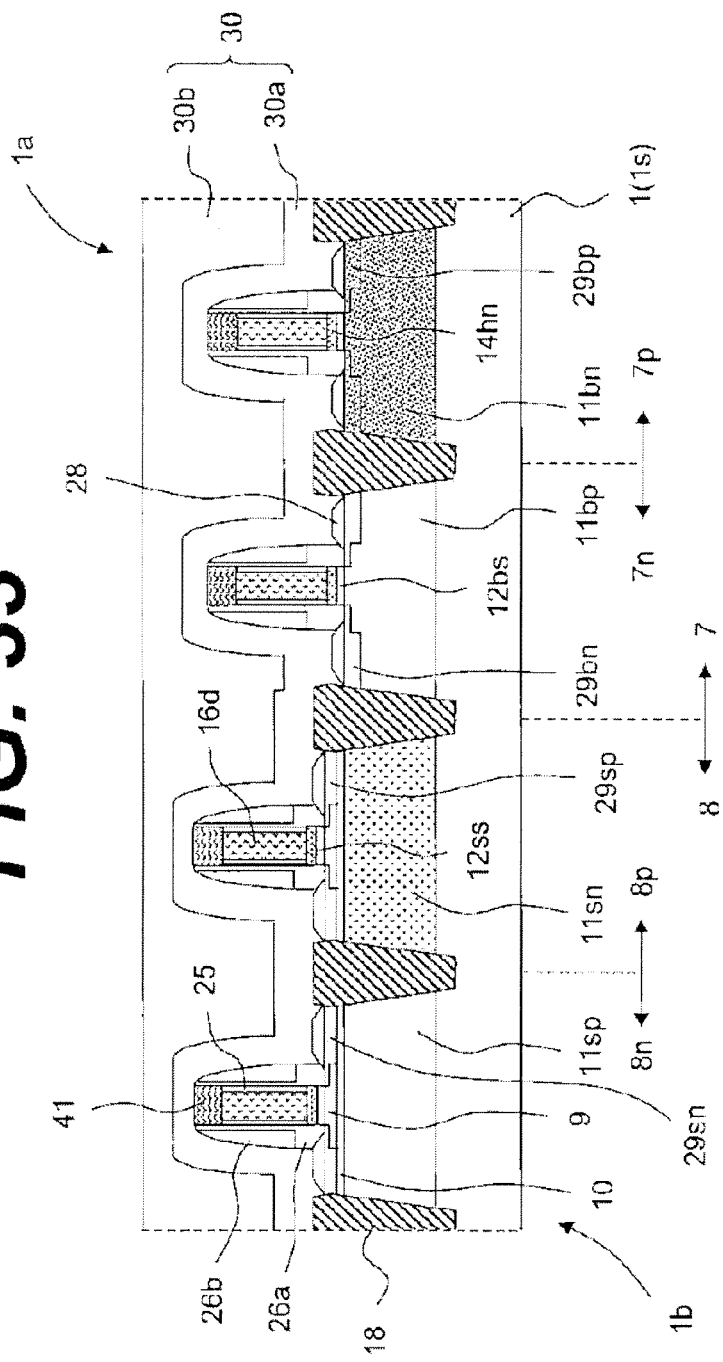
FIG. 33 is a partial sectional view of the wafer (a deposition process of the premetal insulating film and other matter), which explains parts including the essential parts of the manufacturing process adapted to the modified example 1 (the insulating film of the common lanthanum-doped gate) of the gate stack structure.
Figure 34:
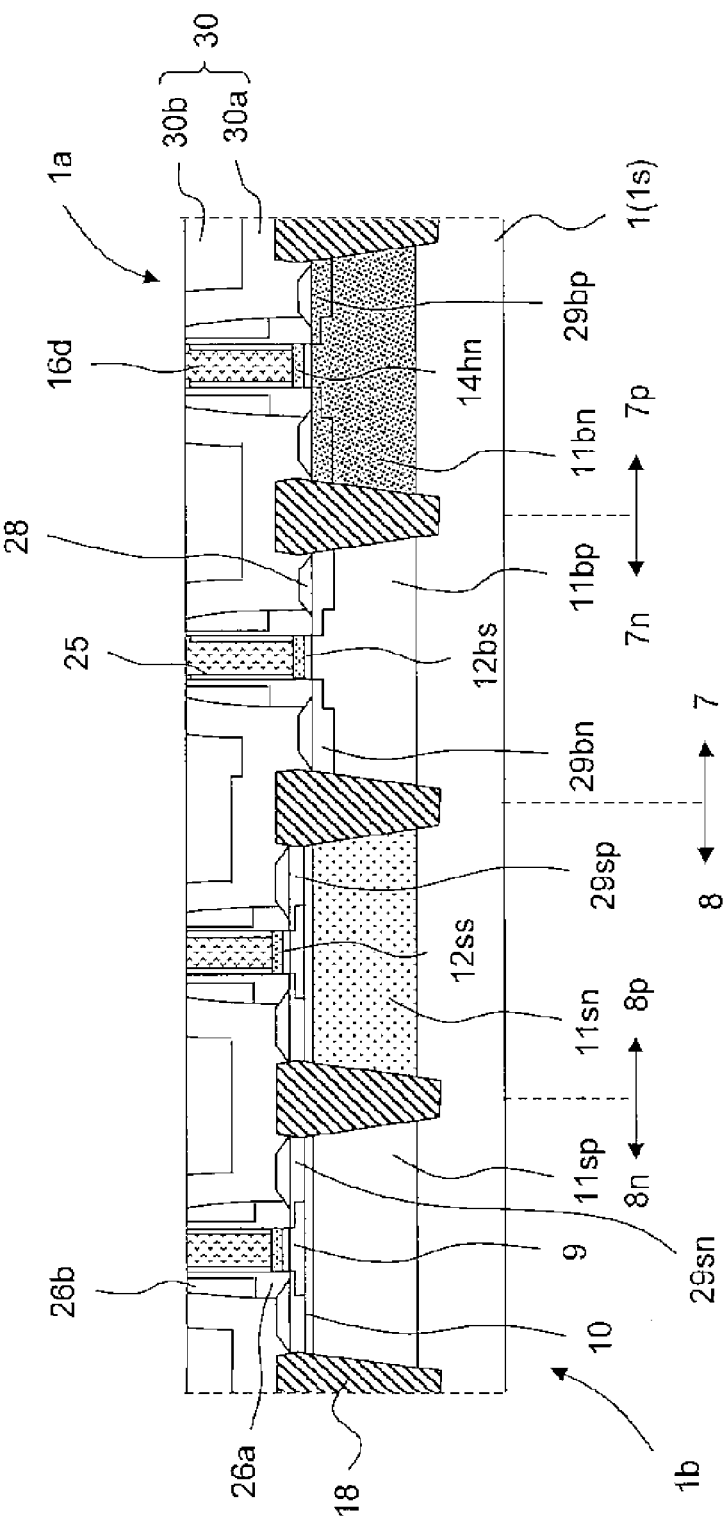
FIG. 34 is a partial sectional view of the wafer (a CMP process), which explains parts including essential parts of the manufacturing process adapted to the modified example 1 (the insulating film of the common lanthanum-doped gate) of the gate stack structure.
Figure 35:
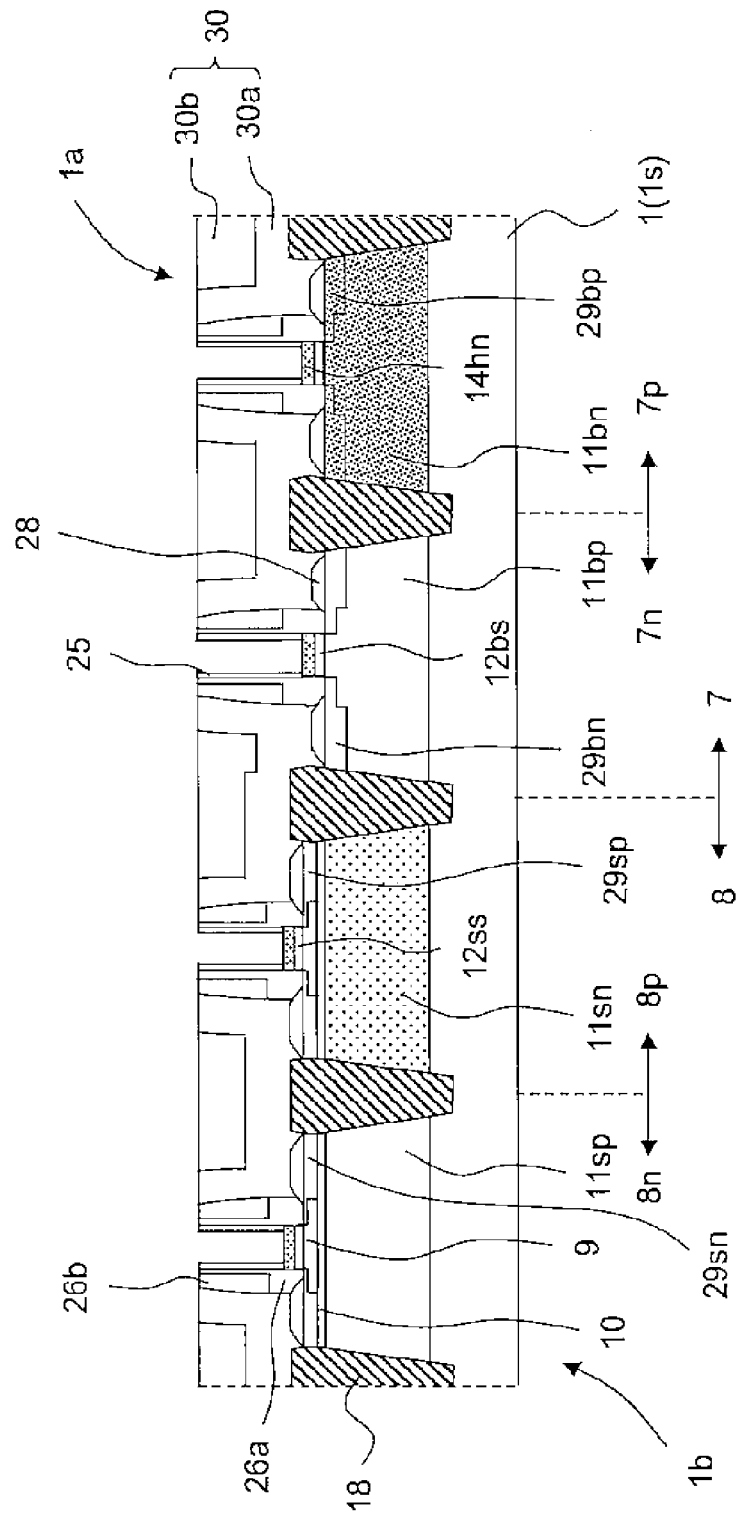
FIG. 35 is a partial sectional view of the wafer (a removal process of dummy polysilicon), which explains parts including the essential parts of the manufacturing process adapted to the modified example 1 (the insulating film of the common lanthanum-doped gate) of the gate stack structure.
Figure 36:
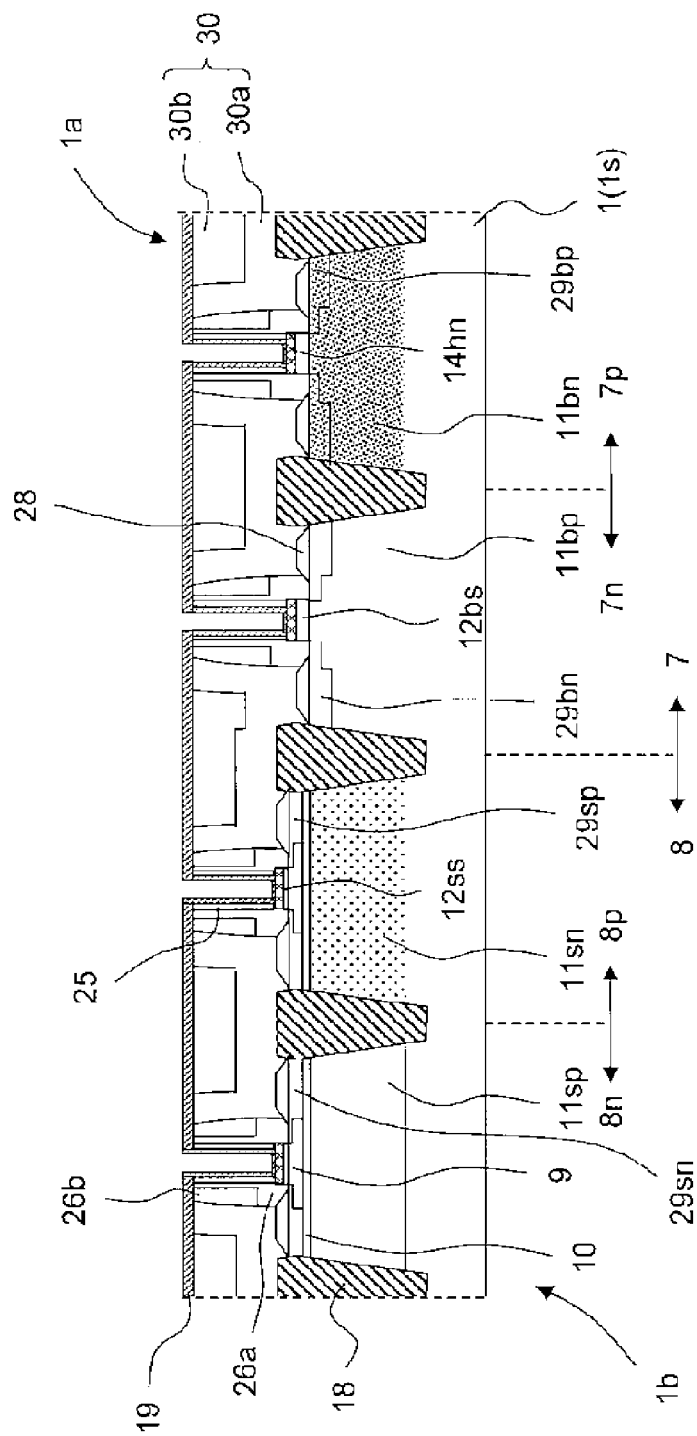
FIG. 36 is a partial sectional view of the wafer (a deposition process of the lanthanum film), which explains parts including the essential parts of the manufacturing process adapted to the modified example 1 (the insulating film of the common lanthanum-doped gate) of the gate stack structure.
Figure 37:
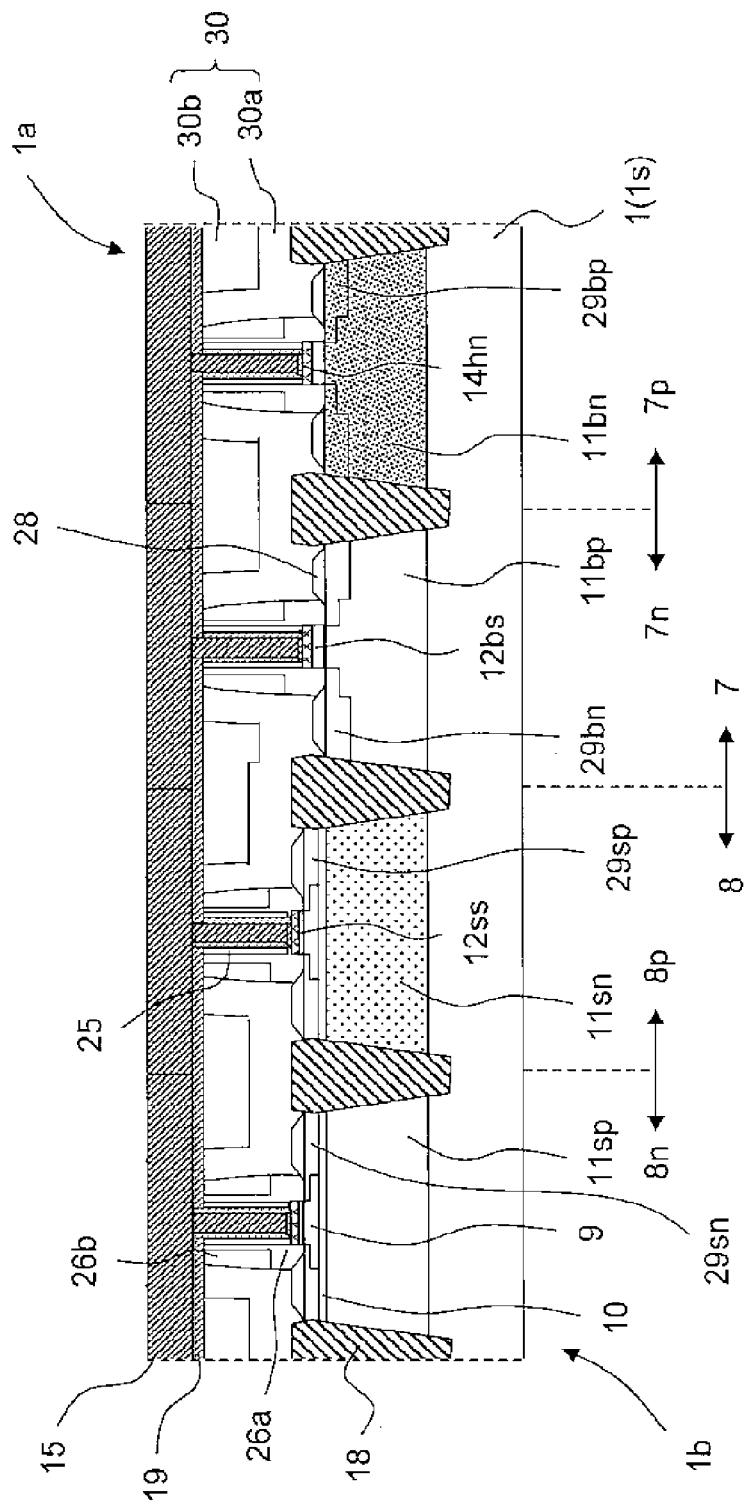
FIG. 37 is a partial sectional view of the wafer (an embedment process of a metal gate film), which explains parts including essential parts of the manufacturing process adapted to the modified example 1 (the insulating film of the common lanthanum-doped gate) of the gate stack structure.
Figure 38:
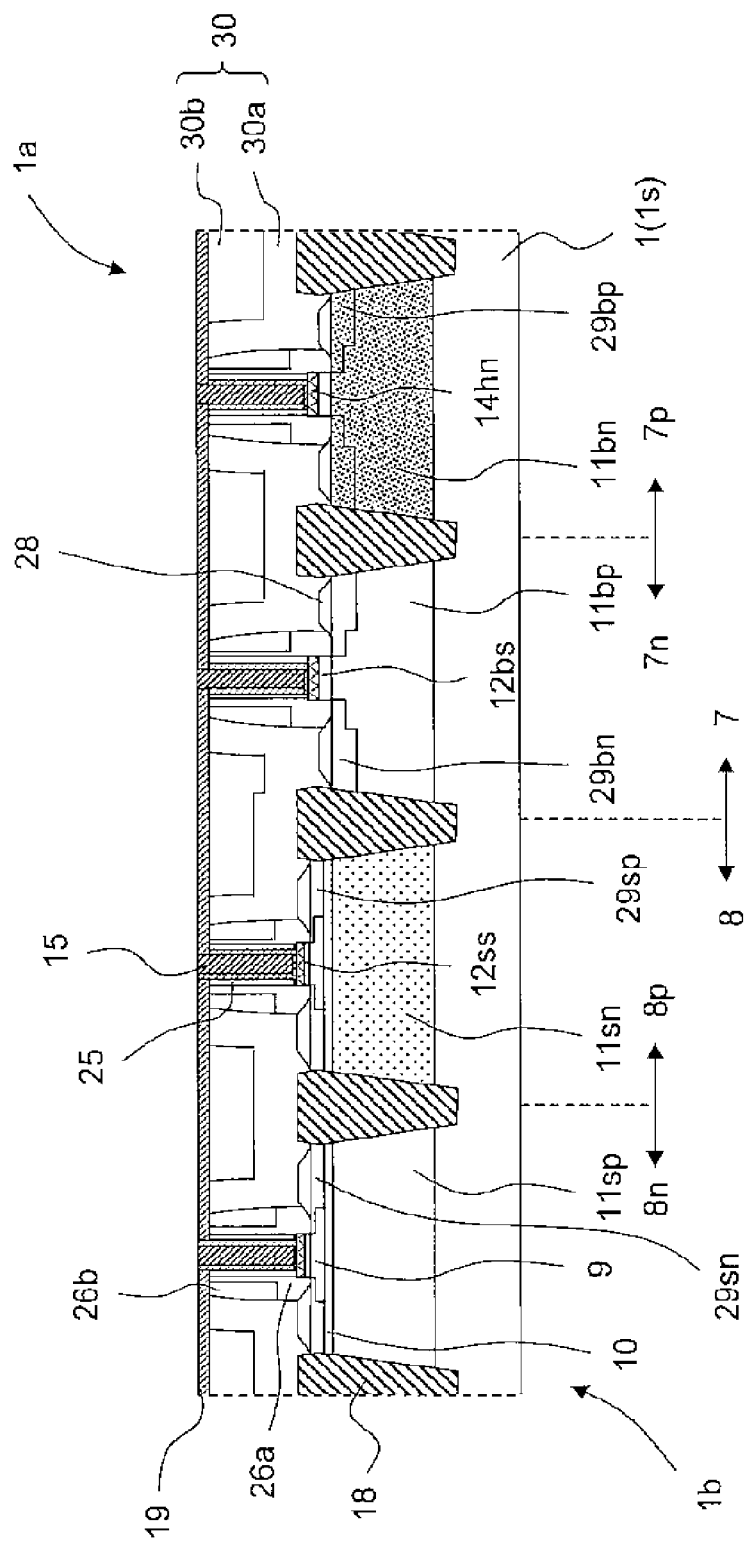
FIG. 38 is a partial sectional view of the wafer (an etchback process of the metal gate film), which explains parts including the essential parts of the manufacturing process adapted to the modified example 1 (the insulating film of the common lanthanum-doped gate) of the gate stack structure.
Figure 39:
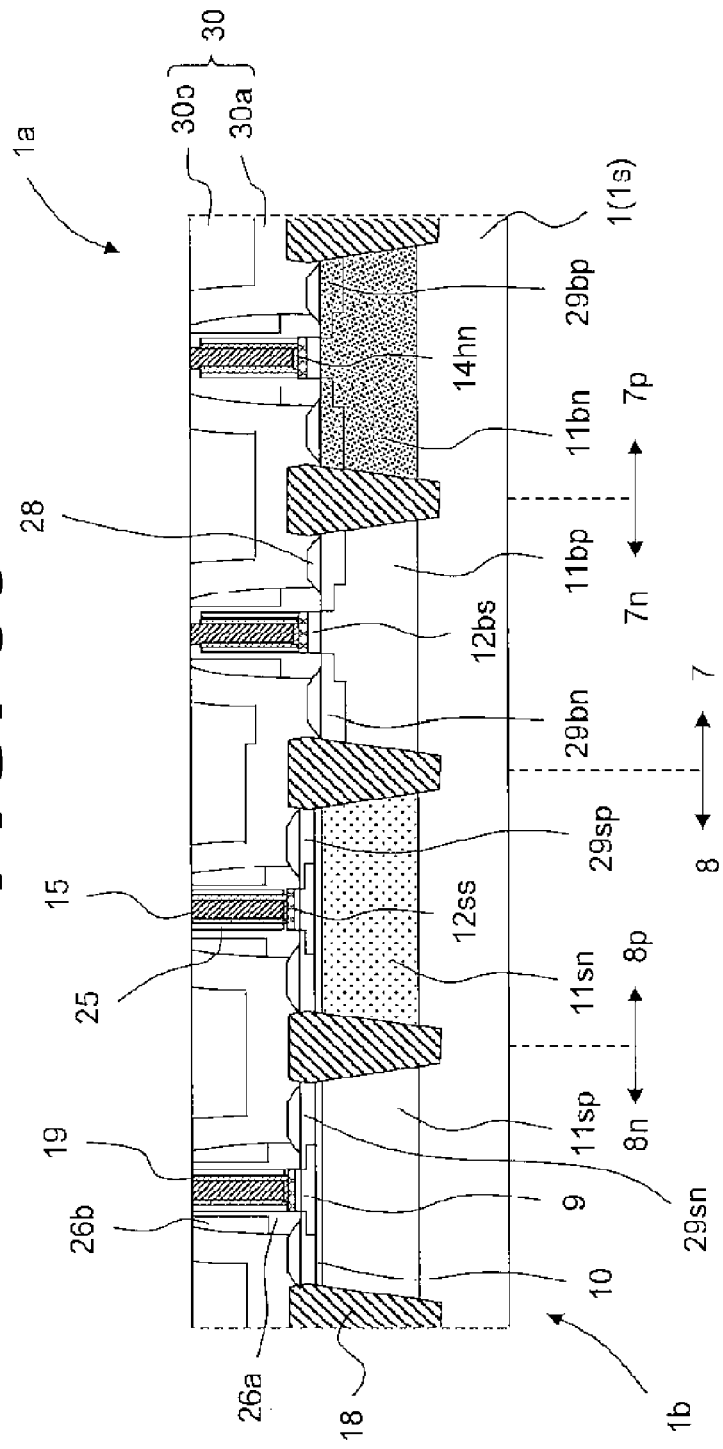
FIG. 39 is a partial sectional view of the wafer (an etchback process of the lanthanum film), which explains parts including essential parts of the manufacturing process adapted to the modified example 1 (the insulating film of the common lanthanum-doped gate) of the gate stack structure.
Figure 40:
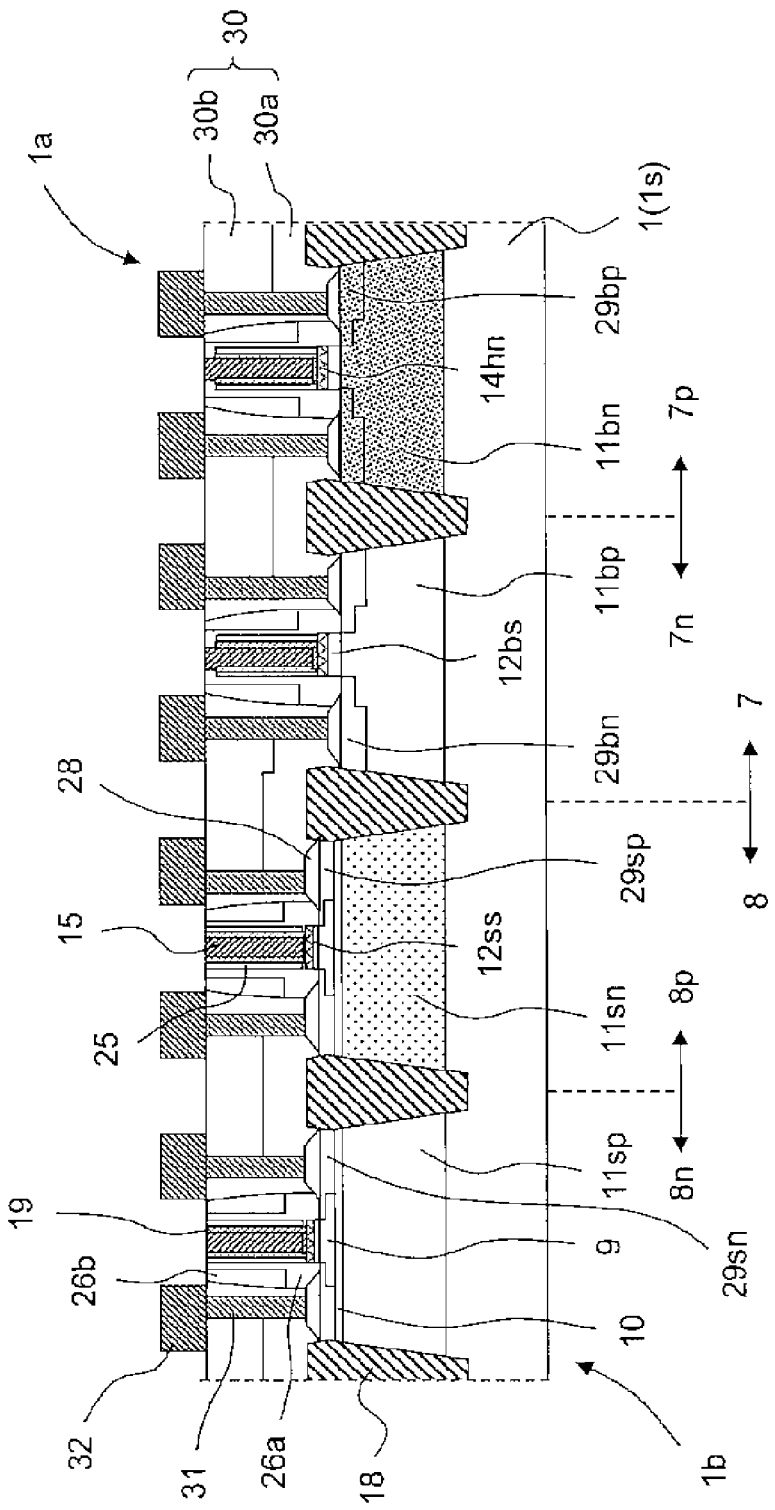
FIG. 40 is a partial sectional view of the wafer (a formation process of wiring), which explains parts including the essential parts of the manufacturing process adapted to the modified example 1 (the insulating film of the common lanthanum-doped gate) of the gate stack structure.

FIG. 30 is a partial sectional view of the wafer (a deposition process of dummy gate material), which explains parts including essential parts of a manufacturing process adapted to the modified example 1 (common lanthanum-doped gate insulating film) of the gate stack structure. FIG. 31 is a partial sectional view of the wafer (a patterning process of a dummy gate and an introduction process of an extension region), which explains parts including essential parts of the manufacturing process adapted to the modified example 1 (common lanthanum-doped gate insulating film) of the gate stack structure. FIG. 32 is a partial sectional view of the wafer (a formation process of a sidewall and an elevated source drain and an introduction process of source drain impurity), which explains parts including essential parts of the manufacturing process adapted to the modified example 1 (common lanthanum-doped gate insulating film) of the gate stack structure. FIG. 33 is a partial sectional view of the wafer (a deposition process of a premetal insulating film), which explains parts including essential parts of the manufacturing process adapted to the modified example 1 (common lanthanum-doped gate insulating film) of the gate stack structure. FIG. 34 is a partial sectional view of the wafer (a CMP process), which explains parts including essential parts of the manufacturing process adapted to the modified example 1 (common lanthanum-doped gate insulating film) of the gate stack structure. FIG. 35 is a partial sectional view of the wafer (a removal process of dummy polysilicon), which explains parts including essential parts of the manufacturing process adapted to the modified example 1 (common lanthanum-doped gate insulating film) of the gate stack structure. FIG. 36 is a partial sectional view of the wafer (a deposition process of a lanthanum film), which explains parts including essential parts of the manufacturing process adapted to the modified example 1 (common lanthanum-doped gate insulating film) of the gate stack structure. FIG. 37 is a partial sectional view of the wafer (an embedment process of a metal gate film), which explains parts including essential parts of the manufacturing process adapted to the modified example 1 (common lanthanum-doped gate insulating film) of the gate stack structure. FIG. 38 is a partial sectional view of the wafer (an etch back process of a metal gate film), which explains parts including essential parts of the manufacturing process adapted to the modified example 1 (common lanthanum-doped gate insulating film) of the gate stack structure. FIG. 39 is a partial sectional view of the wafer (an etch back process of a lanthanum film), which explains parts including essential parts of the manufacturing process adapted to the modified example 1 (common lanthanum-doped gate insulating film) of the gate stack structure. FIG. 40 is a partial sectional view of the wafer (a formation process of wiring), which explains parts including essential parts of the manufacturing process adapted to the modified example 1 (common lanthanum-doped gate insulating film) of the gate stack structure. Based on these, parts including the essential parts of the manufacturing process adapted to the modified example 1 (common lanthanum-doped gate insulating film) of the gate stack structure are explained. The processes from FIG. 7 to FIG. 11 are the same as those explained in section 5. Processes after them are explained here.

In the state in FIG. 11 with reference to FIG. 30, the hafnium oxide insulating film 14 (for example, about 1 to 2 nm in thickness), such as a hafnium oxide film, is formed on substantially the entire surface over the device surface 1a of the wafer 1 as a high-k gate insulating film. An appropriate example of the hafnium oxide-based insulating film 14 is a hafnium silicon oxynitride film (HfSiON film). To form a high-k gate insulating film, for example, the ALD (Atomic Layer Deposition) method can be used. An HfON film, an HfO film, and other films can be used as the hafnium oxide insulating film 14. In this stage, the HfSiON film, the HfON film, the HfO film, and other films are a non-doped hafnium oxide high-k gate insulating film 14hn.

Subsequently, CVD forms a dummy gate polysilicon film 16d with a thickness of, for example, about 150 to 200 nm on the nearly entire surface over the non-doped hafnium oxide agate insulating film 14hn. Further, CVD forms a silicon nitride film 41 for gate processing with a thickness of, for example, about 10 to 50 nm on the nearly entire surface over the dummy gate polysilicon film 16d.

Next, with reference to FIG. 31, the normal lithography and the anisotropic dry etching performs patterning of the dummy gate stack structure. Appropriate examples of gas for the anisotropic dry etching are $SF_6/CF_4$ (polysilicon), $HBr/Cl_2$ (titanium nitride), and $BCl_3/Cl_2$ (high-k insulating film). Subsequently, ion injection introduces the N-type SOI part source drain extension region 27sn, the P-type SOI part source drain extension region 27sp, the N-type bulk part source drain extension region 27bn, the P-type bulk part source drain extension region 27bp, and other regions sequentially. Appropriate ion injection conditions for the N-type SOI part source drain extension region 27sn and the N-type bulk part source drain extension region 27bn are as follows: the ion is arsenic, the injection energy is about 2 keV, and the dose is about $2 \times 10^{14}/cm^2$ to $8 \times 10^{14}/cm^2$. Appropriate ion injection conditions for the P-type SOI part source drain extension region 27sp and the P-type bulk part source drain extension region 27bp are as follows: the ion is boron, the injection energy is about 0.5 keV, and the dose is about $2 \times 10^{14}/cm^2$ to $8 \times 10^{14}/cm^2$.

Next, with reference to FIG. 32, for example, thermal oxidation at about 900 degrees centigrade forms the silicon oxide spacer film 25 (for example, about 30 nm in thickness) on the side surface of the dummy gate polysilicon film 16d. Subsequently, for example, CVD forms a silicon oxide sidewall spacer film (for example, about 5 to 10 nm in thickness) and a silicon nitride sidewall spacer film (for example, about 10 to 30 nm in thickness) sequentially and etch back by anisotropic dry etching (for example, using a fluorocarbon-based etching gas) forms the silicon oxide sidewall spacer 26a and the silicon nitride sidewall spacer 26b. Further, the selective epitaxy silicon layer 28 (elevated SD layer) (for example, about 20 to 60 nm in thickness) is formed over the surface of each source drain region. After that, introducing each high-concentration region source drain region by ion injection forms the N-type SOI part source drain region 29sn, the P-type SOI part source drain region 29sp, the N-type bulk part source drain region 29bn, the P-type bulk part source drain region 29bp, and other regions. Appropriate ion injection conditions for the high-concentration region source drain regions of the N-type SOI part source drain region 29sn and the N-type bulk part source drain region 29bn are as follows: the ion is arsenic, the injection energy is about 20 keV, and the dose is about $4 \times 10^{15}/cm^2$. Appropriate ion injection conditions for the high-concentration region source drain regions of the P-type SOI part source drain region 29sp and the P-type bulk part source drain region 29bp are as follows: the ion is boron, the injection energy is about 2 keV, and the dose is about $4 \times 10^{15}/cm^2$.

Further, for example, a nickel-based silicide film is formed on the surface of each elevated SD layer 28 as necessary (the silicide layer is omitted because the drawing becomes complicated).

Next, with reference to FIG. 33, the plasma CVD forms the premetal insulating film 30 including a comparatively thin silicon nitride film 30a (for example, about 10 to 60 nm in thickness), which is a CESL (Contact Etch Stop Layer) film, and a comparatively thick silicon oxide insulating film 30b on the nearly entire surface over the device surface 1a of the wafer 1 sequentially.

Next, with reference to FIG. 34, surface flattening is performed until CMP (Chemical Vapor Deposition) removes the silicon nitride film 41 for gate processing.

Next, with reference to FIG. 35, the dummy gate polysilicon film 16d is removed by wet etching using a chemical liquid, such as APM (Ammonia/Hydrogen Peroxide Mixture), and isotropic dry etching (the etching atmosphere is, for example, an $SF_6$ atmosphere).

Next, with reference to FIG. 36, sputtering film formation forms the threshold voltage adjustment film 19 (for example, lanthanum film) with a thickness of, for example, about 1 nm on the nearly entire device surface 1a of the wafer 1.

Next, with reference to FIG. 37, CVD forms the gate titanium nitride film 15 on the nearly entire device surface la of the wafer 1 to fill in the groove from which the dummy gate is removed.

Next, with reference to FIG. 38, the excess part (part outside the groove) of the gate titanium nitride film 15 is etched back by wet etching using a chemical liquid, such as APM (Ammonia/Hydrogen Peroxide Mixture) or isotropic dry etching using an etching gas including $SF_6$.

Next, with reference to FIG. 39, the excess part (part outside the groove) of the lanthanum film 19 is etched back by wet etching using, for example, a hydrochloric acid chemical liquid (a diluted acid, such as a nitric acid, phosphoric acid, sulfuric acid, HBr, acetic acid, formic acid, and propionic acid, may also be used).

Next, with reference to FIG. 40, a contact hole is formed by, for example, anisotropic dry etching, and the tungsten plug 31 is embedded in the hole. Further, the first layer wiring 32 is formed over the premetal insulating film 30. The wiring may be embedded or may not be embedded. Wiring is formed in, for example, three layers to ten and something layers as necessary.

When the wiring process is completed, dicing splits up the wafer 1 into the chips 2.

Figure 43:
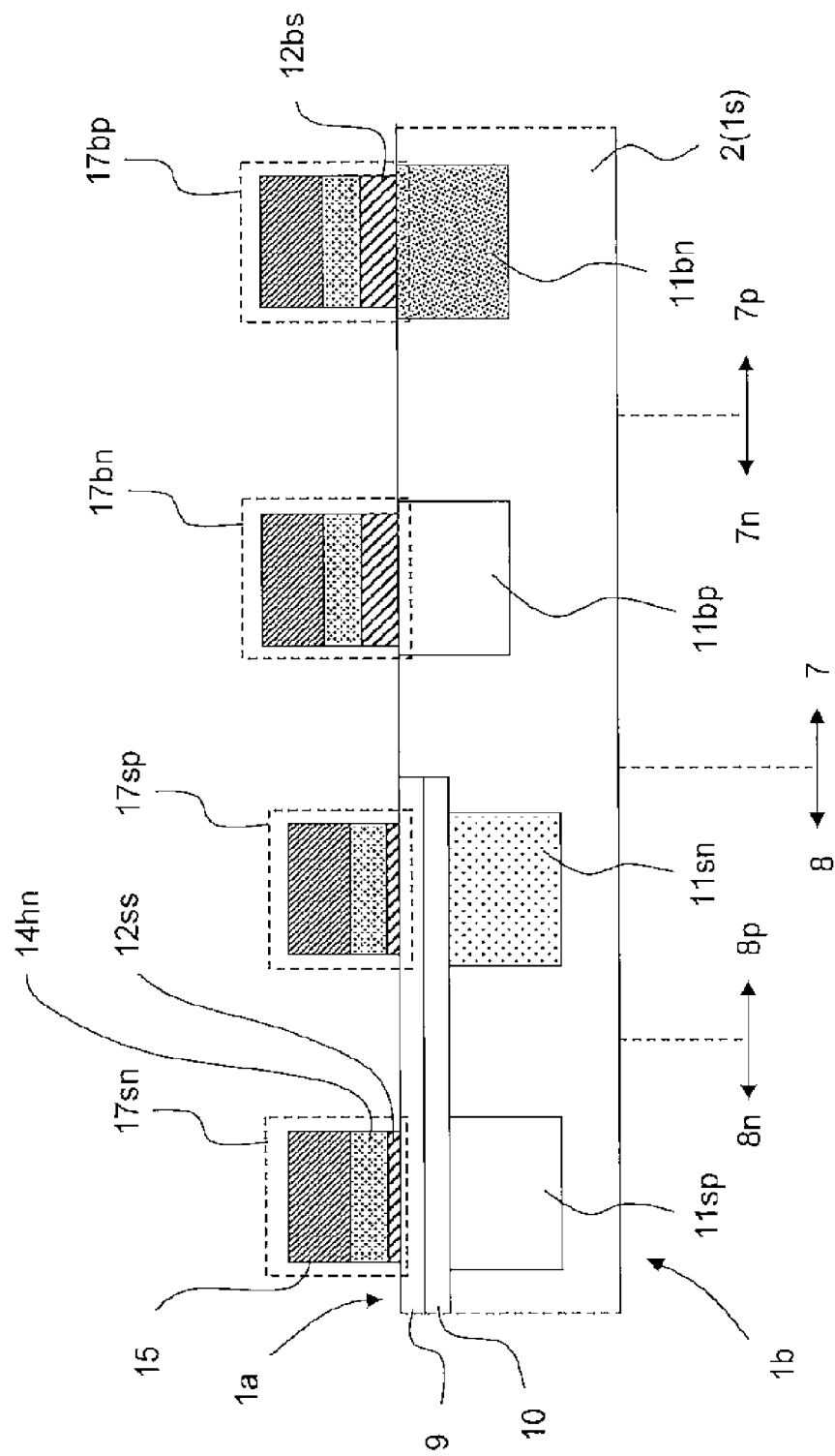
FIG. 43 is a schematic sectional view of a gate stack and a substrate showing the modified example 2 (the insulating film of the common non-doped gate) of the gate stack structure adapted to the gate last scheme, which is a modified example of the manufacturing process of the semiconductor integrated circuit device in an embodiment of the present application.

(3) Explanation of a modified example 2 (common non-doped gate insulating film) of a gate stack structure adapted to the gate last scheme, which is a modified example of the manufacturing process for the semiconductor integrated circuit device in the embodiment of the present application (mainly FIG. 43): FIG. 43 is a schematic sectional view of a gate stack and a substrate showing a modified example 2 (common non-doped gate insulating film) of a gate stack structure adapted to the gate last scheme, which is a modified example of the manufacturing process for the semiconductor integrated circuit device in the embodiment of the present application. Based on this, the modified example 2 (common non-doped gate insulating film) of the gate stack structure adapted to the gate last scheme, which is a modified example of the manufacturing process for the semiconductor integrated circuit device in the embodiment of the present application is explained.

FIG. 43 is basically the same as FIG. 28, but differ in that the bulk N-channel MISFET gate stack 17bn and the bulk P-channel MISFET gate stack 17bp are also non-doped.

The absolute value of the threshold voltage of each MISFET increases due to the heat treatment because it is non-doped. This can appropriately reduce the absolute value by adjusting the amount of impurities introduced into the back gate (the N-type MISFET back gate impurity-doped semiconductor region and the P-type MISFET back gate impurity-doped semiconductor region) (the absolute value of the threshold voltage is adjusted by increasing or decreasing the dose of the P-type impurities or increasing or decreasing the dose of the N-type impurities), applying a forward bias, adjusting the amount of impurities introduced into the channel region, or combining these methods.

The range of the effective work function of each target gate stack (gate electrode) is as follows: the bulk N-channel MISFET gate stack 17*bn* is about 4.2 to 4.6 eV, the bulk P-channel MISFET gate stack 17*bp* is about 4.6 to 4.9 eV, the N-channel MISFET gate stack 17*sn* of the SOI region is about 4.35 to 4.85 eV, and the P-channel MISFET gate stack 17*sp* of the SOI region is about 4.35 to 4.85 eV.

The combination of the gate stack structures has the following merits. (1) In the SOI region 8 (this merit is effective also in a chip including only the SOI region), no threshold adjustment film to the gate stack structure exists. This can avoid repetition of complicated. Also this can reduce damage to the lower layer part in the gate stack structure (improvement in reliability) for the same reason. (2) Further, the threshold voltage can be controlled by selecting the amount of doping to the back well and the conductivity type. This allows to comparatively easily control the threshold voltage (this merit is effective also in a chip including only the SOI region). (3) Compared to the gate first scheme, the burden of thermal processing is reduced. This improves the reliability of the gate insulating film and allows to comparatively easily adjust threshold voltage.

(4) Explanation of the essential parts of the manufacturing process adapted to the modified example 2 (generally common lanthanum-doped gate insulting film) of the gate stack structure (mainly FIG. 41): This example belongs to the high-k first metal gate last scheme (basically, the gate last scheme).

Figure 41:
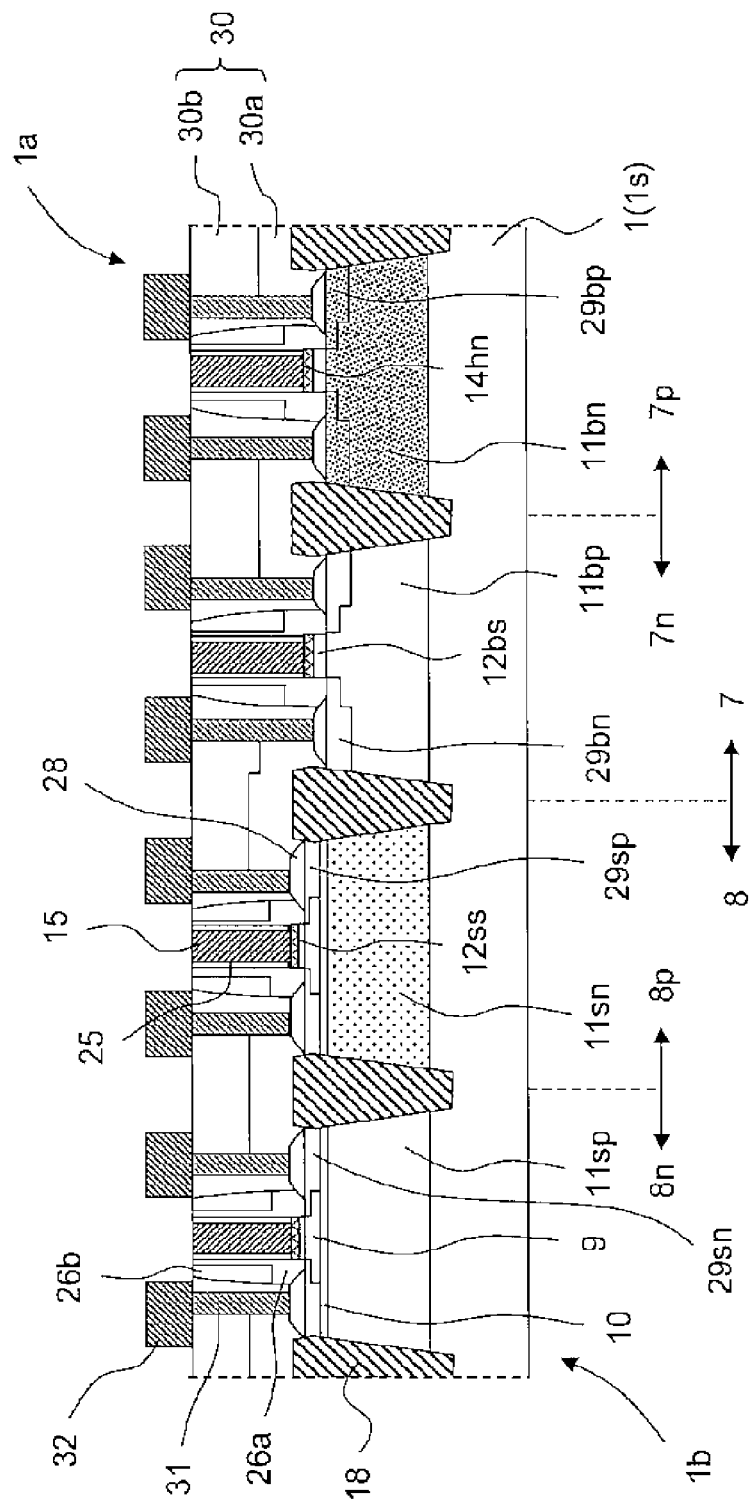
FIG. 41 is a partial sectional view of the wafer (a formation process of wiring), which explains parts including the essential parts of a manufacturing process adapted to a modified example 2 (an insulating film of a common non-doped gate) of a gate stack structure.

FIG. 41 is a partial sectional view of the wafer (a formation process of wiring), which explains parts including the essential parts of the manufacturing process adapted to the modified example 2 (common non-doped gate insulating film) of the gate stack structure. Based on this, the essential parts of the manufacturing process adapted to the modified example 1 (common lanthanum-doped gate insulating film) of the gate stack structure are explained.

This example skips the processes in FIG. 36 and FIG. 39 in the process in subsection (2) (the lanthanum-containing work function modulation film 19 is not formed).

11. Complementary explanation and consideration of each embodiment (see FIG. 1 to FIG. 6 and FIG. 25 to FIG. 29): The channel mobility and device reliability of MISFET having a high-k gate insulating film tend to decrease compared to one not using a high-k gate insulating film because of the characteristics of the high-k gate insulating film and the complexity of the process. However, it can be thought that CMIS can be configured by a comparatively simple process to combine a high-k gate insulating film and a mid-gap metal gate electrode, such as titanium nitride.

The absolute value of the threshold voltage of MISFET having a high-k gate insulating film increases due to thermal processing at high temperature, and therefore, controlling the threshold voltage is difficult. This threshold voltage is called FLP (Fermi-Level Pinning). This effect also causes difficult control of the absolute value of the threshold voltage of, in particular, the P-channel MISFET. However, in the SOI region (SOI device) (more precisely, FD-SOI device), a forward bias can be applied to the back gate (increasing the forward bias decreases the absolute value of the threshold voltage), and therefore, the absolute value of the threshold voltage can be reduced. Further, the absolute value of the threshold voltage can be reduced by changing the conductivity type or the dose of impurities to be introduced into the back gate. In the N-channel MISFET, the threshold voltage reduces when the concentration of the P well reduces or the concentration of the N well increases. In the P-channel MISFET, the absolute value of the threshold voltage reduces when the concentration of the N well is reduced or the concentration of the P well increases.

Consequently, because the degree of freedom in threshold voltage control is high in the semiconductor chip having the SOI region 8, the process can be simplified while the control of the threshold voltage is maintained.

To apply a back gate bias, it is appropriate to apply the power source supply structure such as in FIG. 4 or FIG. 29 to at least the SOT region 8. Not to apply a back gate bias, it is appropriate to apply the power source supply structure such as in FIG. 2 to at least the SOT region 8 from the view of maintaining the degree of integration.

12. Summary: The invention made by the inventors is explained specifically based on the embodiments as above, but the present invention is not limited to those and has various modifications in the scope not deviating from its gist.

For example, the present application explains specifically an example, in which the hafnium oxide high-k gate insulating film (HfON, HfO), such as the HfSiON film, is used as the high-k gate insulating film, but it is not limited to the example. Other high-k gate insulating films may be used. Further, the present application explains specifically an example, in which TiN is used as the metal gate electrode, but it is not limited to the example. Other materials, such as TaN and TaC, may be used.

Further, the present application explains specifically an example, in which the aluminum-containing film that is the threshold value adjustment film, such as an aluminum film, is removed after heat treatment, but it is not limited to the example. The aluminum film may be left as it is.

Further, the present application explains specifically an example of the lanthanum-containing film as the N-channel threshold value adjustment film, but it is not limited to the example. Those using other members may be used. This point also applies to the P-channel threshold value adjustment film nearly in the same manner.

What is claimed is:

1. A semiconductor integrated circuit device comprising:
   (a) a semiconductor chip having a first main surface and a second main surface;
   (b) an SOI region provided on the first main surface of the semiconductor chip;
   (c) a first N-channel MISFET region and a first P-channel MISFET region provided within the SOI region;
   (d) a first gate insulating film having a high-k insulating film and a first gate electrode film having a metal layer provided within the first N-channel MISFET region on the side of the first main surface of the semiconductor chip;
   (e) a second gate insulating film having a high-k insulating film and a second gate electrode film having a metal layer provided within the first P-channel MISFET region on the side of the first main surface of the semiconductor chip;

(f) an N-type MISFET back gate impurity-doped semiconductor region provided in the first N-channel MISFET region inside the semiconductor chip;

(g) a P-type MISFET back gate impurity-doped semiconductor region provided in the first P-channel MISFET region inside the semiconductor chip;

(h) a bulk region provided on the first main surface of the semiconductor chip;

(i) a second N-channel MISFET region and a second P-channel MISFET region provided within the bulk region;

(j) a third gate insulating film and a third gate electrode film having a metal layer, the third gate insulating film and the third gate electrode film being provided within the second N-channel MISFET region on the side of the first main surface of the semiconductor chip; and (k) a fourth gate insulating film and a fourth gate electrode film having a metal layer, the fourth gate insulating film and the fourth gate electrode film being provided within the second P-channel MISFET region on the side of the first main surface of the semiconductor chip, wherein the N-type MISFET back gate impurity-doped semiconductor region or the P-type MISFET back gate impurity-doped semiconductor region is set to a potential other than a reference potential and a power source potential, and wherein the first gate insulating film and the third gate insulating film have a lanthanum-doped high-k insulating film, the second gate insulating film and the fourth gate insulating film have an aluminum-doped high-k insulating film, and the first gate electrode film, the second gate electrode film, the third gate electrode film, and the fourth gate electrode film have the same stacked structure.

2. The semiconductor integrated circuit device according to claim 1,
wherein the N-type MISFET back gate impurity-doped semiconductor region or the P-type MISFET back gate impurity-doped semiconductor region is set to a potential between the reference potential and the power source potential.

3. A semiconductor integrated circuit device comprising:
(a) a semiconductor chip having a first main surface and a second main surface;
(b) an SOI region provided on the first main surface of the semiconductor chip;
(c) a first N-channel MISFET region having a first N-channel MISFET and a first P-channel MISFET region having a first P-channel MISFET provided within the SOI region;
(d) a first gate insulating film having a high-k insulating film and a first gate electrode film having a metal layer, the first gate insulating film and the first gate electrode film being provided within the first N-channel MISFET region on the side of the first main surface of the semiconductor chip;
(e) a second gate insulating film having a high-k insulating film and a second gate electrode film having a metal layer, the second gate insulating film and the second gate electrode film being provided within the first P-channel MISFET region on the side of the first main surface of the semiconductor chip;
(f) an N-type MISFET back gate impurity-doped semiconductor region provided in the first N-channel MISFET region inside the semiconductor chip;

(g) a P-type MISFET back gate impurity-doped semiconductor region provided in the first P-channel MISFET region inside the semiconductor chip;

(h) a bulk region provided on the first main surface of the semiconductor chip;

(i) a second N-channel MISFET region and a second P-channel MISFET region provided within the bulk region;

(j) a third gate insulating film and a third gate electrode film having a metal layer, the third gate insulating film and the third gate electrode film being provided within the second N-channel MISFET region on the side of the first main surface of the semiconductor chip; and (k) a fourth gate insulating film and a fourth gate electrode film having a metal layer, the fourth gate insulating film and the fourth gate electrode film being provided within the second P-channel MISFET region on the side of the first main surface of the semiconductor chip, wherein the N-type MISFET back gate impurity-doped semiconductor region or the P-type MISFET back gate impurity-doped semiconductor region is a threshold voltage adjustment region for the first N-channel MISFET or the first P-channel MISFET, and wherein the first gate insulating film, the second gate insulating film, and the third gate insulating film have a lanthanum-doped high-k insulating film, the fourth gate insulating film has an aluminum-doped high-k insulating film, and the first gate electrode film, the second gate electrode film, the third gate electrode film, and the fourth gate electrode film have the same stacked structure.

4. The semiconductor integrated circuit device according to claim 3,
wherein the adjustment of the threshold voltage is adjusted by changing the impurity concentration or the conductivity type of the impurity in the N-type MISFET back gate impurity-doped semiconductor region or the P-type MISFET back gate impurity-doped semiconductor region.

5. The semiconductor integrated circuit device according to claim 3,
wherein the N-type MISFET back gate impurity-doped semiconductor region or the P-type MISFET back gate impurity-doped semiconductor region is set to a potential other than a reference potential and a power source potential.

6. The semiconductor integrated circuit device according to claim 5,
wherein the N-type MISFET back gate impurity-doped semiconductor region or the P-type MISFET back gate impurity-doped semiconductor region is set to a potential between the reference potential and the power source potential.

7. The semiconductor integrated circuit device according to claim 1,
wherein the semiconductor integrated circuit device adopts a gate first scheme.

8. The semiconductor integrated circuit device according to claim 1,
wherein the semiconductor integrated circuit device adopts a gate last scheme.

* * * * *